US012287252B2

(12) United States Patent
Burks et al.

(10) Patent No.: US 12,287,252 B2
(45) Date of Patent: Apr. 29, 2025

(54) MULTI-ELEMENT SENSOR FOR MONITORING COMPOSITE STRUCTURE

(71) Applicant: HEXAGON TECHNOLOGY AS, Alesund (NO)

(72) Inventors: Brian Burks, Parker, CO (US); Zack Prather, Englewood, CO (US); John Eihusen, Lincoln, NE (US); Joel R. Johnson, Lincoln, NE (US); Tyler Perkins, Parker, CO (US)

(73) Assignee: HEXAGON TECHNOLOGY AS, Alesund (NO)

( * ) Notice: Subject to any disclaimer, the term of this patent is extended or adjusted under 35 U.S.C. 154(b) by 847 days.

(21) Appl. No.: 17/395,885

(22) Filed: Aug. 6, 2021

(65) Prior Publication Data

US 2022/0316967 A1    Oct. 6, 2022

Related U.S. Application Data

(63) Continuation-in-part of application No. 17/223,628, filed on Apr. 6, 2021.

(51) Int. Cl.
*G01L 5/00* (2006.01)
*G01L 1/16* (2006.01)
(Continued)

(52) U.S. Cl.
CPC .............. *G01L 5/0052* (2013.01); *G01L 1/16* (2013.01); *G01N 29/045* (2013.01); *G01N 29/14* (2013.01);
(Continued)

(58) Field of Classification Search
CPC ....... G01L 5/0052; G01L 1/16; G01N 29/045; G01N 29/14; G01N 29/2437;
(Continued)

(56) References Cited

U.S. PATENT DOCUMENTS 4,701,659 A ‡ 10/1987 Fujii ..................... B06B 1/0688
310/366
5,452,264 A ‡ 9/1995 Holroyd ................. G01H 11/08
73/632
(Continued)

FOREIGN PATENT DOCUMENTS

FR    2978551      2/2013
FR    3022199    ‡ 12/2015
(Continued)

OTHER PUBLICATIONS

Ren et al., PVDF Multielement Lamb Wave Sensor for Structural Health Monitoring, IEEE Transactions on Ultrasonics, Ferroelectrics, and Frequency Control, vol. 63, Issue: 1, Jan. 2016.
(Continued)

*Primary Examiner* — Emily P Pham
(74) *Attorney, Agent, or Firm* — Snell & Wilmer LLP

(57) ABSTRACT

Disclosed is a sensor for monitoring a composite structure. The sensor includes multiple sensing elements of different sizes, each configured for different respective monitoring tasks. Also disclosed are methods of fabricating the sensor, designing and manufacturing the sensor, and attaching the sensor to the composite structure.

16 Claims, 49 Drawing Sheets

(51) Int. Cl.
*G01N 29/04* (2006.01)
*G01N 29/14* (2006.01)
*G01N 29/24* (2006.01)
*H10N 30/06* (2023.01)
*H10N 30/088* (2023.01)
*H10N 30/30* (2023.01)

(52) U.S. Cl.
CPC ......... *G01N 29/2437* (2013.01); *H10N 30/06* (2023.02); *H10N 30/088* (2023.02); *H10N 30/302* (2023.02)

(58) Field of Classification Search
CPC ... G01N 2291/0231; G01N 2291/0258; G01N 2291/2634; H10N 30/06; H10N 30/088; H10N 30/302; G01M 5/0066; G01M 5/0033; F17C 2250/0465; F17C 2250/0469; F17C 2250/0663; F17C 2250/0668; F17C 2260/042
See application file for complete search history.

(56) References Cited

U.S. PATENT DOCUMENTS

| | | | | |
|---|---|---|---|---|
| 5,522,428 A ‡ | 6/1996 | Duvall | ................. | F17C 13/123 141/94 |
| 5,814,729 A ‡ | 9/1998 | Wu | ................. | G01M 5/0033 73/768 |
| 6,370,964 B1 ‡ | 4/2002 | Chang | ................. | G01M 5/0033 73/862.046 |
| 6,925,869 B2 ‡ | 8/2005 | Senibi | ................. | G01F 23/2962 73/644 |
| 7,176,448 B2 ‡ | 2/2007 | Ogisu | ................. | G01M 11/086 250/227.16 |
| 7,373,260 B2 ‡ | 5/2008 | Kessler | ................. | G01N 29/045 702/35 |
| 7,450,023 B2 ‡ | 11/2008 | Muralidharan | ........ | G08B 31/00 340/665 |
| 7,562,557 B2 * | 7/2009 | Bennett | ................. | B06B 1/06 310/365 |
| 7,698,943 B2 ‡ | 4/2010 | Bohse | ................. | G01N 29/14 702/82 |
| 8,447,530 B2 ‡ | 5/2013 | Pado | ................. | G01M 7/025 702/36 |
| 8,502,685 B2 ‡ | 8/2013 | McFeeters | ......... | G08B 13/1436 340/568.1 |
| 9,470,659 B2 ‡ | 10/2016 | Chaume | ................. | F17C 13/02 |
| 9,694,674 B2 ‡ | 7/2017 | Dudar | ................. | G01M 3/36 |
| 9,752,911 B2 * | 9/2017 | Cage | ................. | G01F 15/022 |
| 10,197,460 B2 ‡ | 2/2019 | Kawamura | ........ | H01L 41/1132 |
| 10,399,286 B2 * | 9/2019 | Jia | ................. | G02B 6/02057 |
| 10,473,624 B2 ‡ | 11/2019 | Philtron | ................. | G01N 29/14 |
| 10,678,390 B2 ‡ | 6/2020 | Lee | ................. | H04M 1/0266 |
| 10,845,912 B2 ‡ | 11/2020 | Park | ................. | H01L 33/505 |
| 2006/0179949 A1 ‡ | 8/2006 | Kim | ................. | G01N 29/4463 73/618 |
| 2007/0041273 A1 ‡ | 2/2007 | Shertukde | ................. | A61B 7/00 367/149 |
| 2007/0160879 A1 * | 7/2007 | Kaye | ................. | H01M 8/04432 429/506 |
| 2008/0148853 A1 ‡ | 6/2008 | Kim | ................. | F17C 13/02 73/587 |
| 2010/0107765 A1 ‡ | 5/2010 | Murakami | ........... | G01N 29/043 73/587 |
| 2013/0327148 A1 ‡ | 12/2013 | Yan | ................. | G01N 29/341 73/628 |
| 2015/0128709 A1 ‡ | 5/2015 | Stewart | ................. | G01N 29/11 73/588 |
| 2016/0010802 A1 ‡ | 1/2016 | Leavitt | ................. | F17C 13/003 356/402 |
| 2016/0121713 A1 ‡ | 5/2016 | Bauer | ................. | B62D 39/00 701/99 |
| 2017/0146192 A1 ‡ | 5/2017 | Newhouse | ............. | F17C 13/02 |
| 2017/0168021 A1 ‡ | 6/2017 | Van Tooren | ......... | G01N 29/041 |
| 2019/0064095 A1 * | 2/2019 | Clarke | ................. | G01N 29/14 |
| 2019/0145581 A1 ‡ | 5/2019 | Halvorsen | ............. | F17C 13/083 248/542 |
| 2021/0207773 A1 ‡ | 7/2021 | Pasquier | ................. | F17C 13/00 |

FOREIGN PATENT DOCUMENTS

| | | | |
|---|---|---|---|
| JP | 2006-275223 | ‡ | 10/2006 |
| KR | 2015-0022101 | ‡ | 3/2015 |

OTHER PUBLICATIONS

Capineri Lorenzo et al.: "Ultrasonic Guided-Waves Sensors and Integrated Structural Health Monitoring Systems for Impact Detection and Localization: A Review", Sensors, Mar. 12, 2021 (Mar. 12, 2021), XP055911730, DOI: 10.20944/preprints202103.0347.v1, Retrieved from the Internet: URL:http://dx.doi.org/10.20944/preprints20_2103.0347.v1 [retrieved on Apr. 12, 2022].

Bakuckas J G et al.: "Monitoring Damage Growth in Tatanium Matrix Compsites Using Acoustic Emission (NASA-TM-107742) Monitoring Damage Growth in Titanium Matrix Composites Using Acoustic Emission", Mar. 1, 1993 (Mar. 1, 1993) XP055925407, Retrieved from the Internet: URL:https://ntrs.nasa.gov/api/citations/19930015883/downloads/19930015883.pdf [retrieved on Jun. 24, 2022].

Fu Jia et al.: "Experimental Research on Rapid Localization of Acoustic Source in a Cylindrical Shell Structure Without Knowledge of the Velocity Profile", Sensors, vol. 21, No. 2, Jan. 13, 2021 (Jan. 13, 2021), p. 511, XP055935410, CH ISSN: 1424-8220, DOI: 10.3390/s21020511.

Feng Tianyi et al.: "Active Health Monitoring of Thick Composite Structures by Embedded and Surface-Mounted Piezo Diagnostic Layer", Sensors, vol. 20, No. 12, Jun. 17, 2020 (Jun. 17, 2020), p. 3410, XP055935417, DOI: 10.3390/s20123410.

Robin, Roshan, Giurgiutiu, "Impact Damage Detection in Composite Plates Using Acoustic Emission Signal Signature Identification", Proceedings of SPIE, May 19, 2020, https://www.spiedigitallibrary.org/conference-proceedings-of-spie.

International Search Report and Written Opinion for Corresponding International PCT Patent Application No. PCT/IB2022/053186, filed Apr. 6, 2022.

\* cited by examiner
‡ imported from a related application

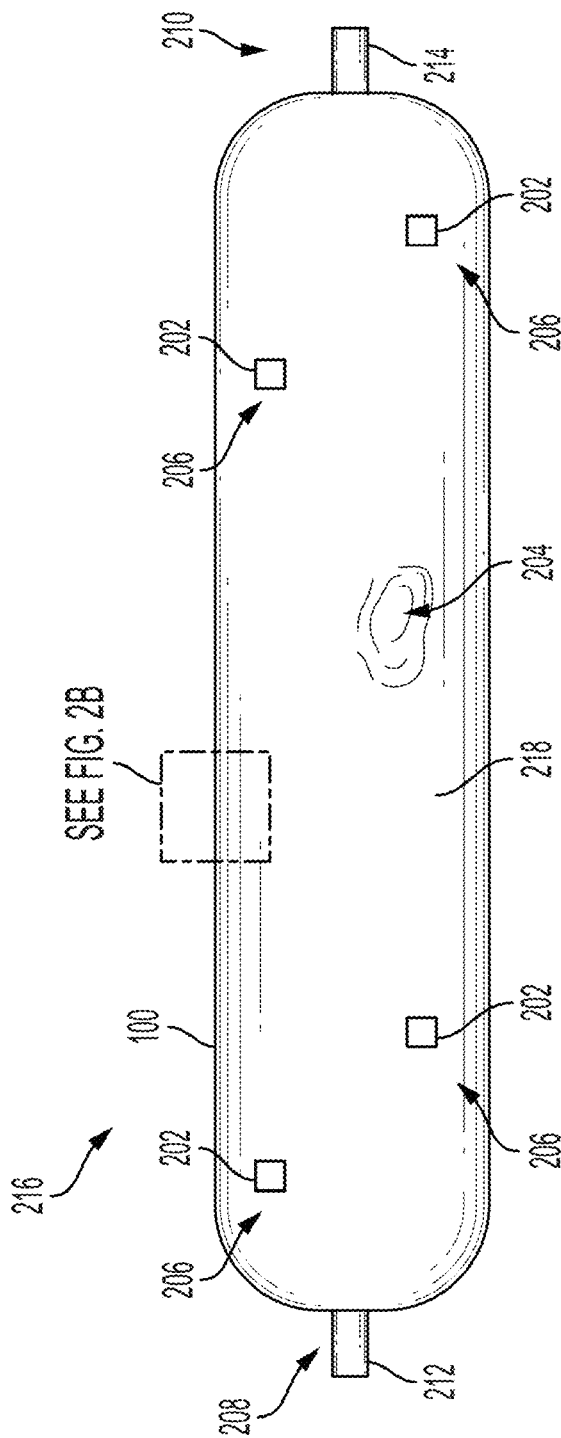
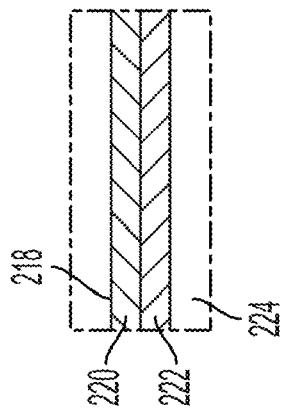
FIG. 2A
FIG. 2B

MULTI-ELEMENT SENSOR FOR MONITORING COMPOSITE STRUCTURE

CROSS-REFERENCE TO RELATED APPLICATIONS

This application is a continuation-in-part of U.S. patent application Ser. No. 17/223,628, filed Apr. 6, 2021 entitled "Composite Cylinder Monitoring System," the disclosure of which is incorporated herein by reference in its entirety for all purposes.

BACKGROUND

1. Field

This specification relates to a sensor for monitoring composite laminate structures.

2. Description of the Related Art

Vehicles may be used to transport occupants and/or cargo. Some vehicles for transporting cargo are powered using fuel stored in cylinders. These cylinders may become damaged during operation of the vehicle. When the cylinders become damaged, it is important to repair the cylinders.

SUMMARY

What is described is a sensor for monitoring a composite structure. The sensor includes a first sensor element having a first size and configured to detect data associated with a first monitoring task. The sensor also includes a second sensor element having a second size and configured to detect data associated with a second monitoring task.

Also described is a method for fabricating a sensor. The method includes fabricating a first positive electrode having a first size and a second positive electrode having a second size. The method also includes fabricating a ground electrode having a size larger than a combination of the first size and the second size. The method also includes disposing a piezoelectric material between a layer having the first positive electrode and the second positive electrode and the ground electrode.

Also described is a method of monitoring a composite structure. The method includes determining a plurality of monitoring tasks for a sensor having a plurality of sensor elements. The method also includes determining a respective plurality of sensor element sizes for the plurality of sensor elements based on the respective plurality of monitoring tasks. The method also includes fabricating the sensor based on the determined plurality of sensor element sizes. The method also includes coupling the sensor to the composite structure.

BRIEF DESCRIPTION OF THE DRAWINGS

Other systems, methods, features, and advantages of the present invention will be apparent to one skilled in the art upon examination of the following figures and detailed description. Component parts shown in the drawings are not necessarily to scale, and may be exaggerated to better illustrate the important features of the present invention.

FIGS. 2A-2B illustrate a composite cylinder, according to various embodiments.

DETAILED DESCRIPTION

Disclosed herein are systems, vehicles, and methods for monitoring composite cylinders of a vehicle. The systems, vehicles, and methods disclosed herein automatically detect damage to the composite cylinder and take corresponding steps. The systems and methods described herein improve the safety of the vehicles using the composite cylinders, as the integrity of the composite cylinders is being continuously monitored, from use to filling (or re-filling).

While composite cylinders are discussed herein, the systems and methods may be adapted to a variety of contexts, such as wind turbines, fuselage, a leading edge of a wing, or any composite structure where impact damage is deleterious.

In addition, the sensors used for monitoring the composite structures are also disclosed. The sensors described herein may be multi-element sensors capable of performing multiple monitoring tasks using a single sensor. The sensors described herein are easily adaptable and re-designable, and can be fabricated at a low cost and at a high volume. Conventional piezoelectric sensors are more costly and not adapted for multiple monitoring tasks.

As used herein, "driver" may refer to a human being driving the vehicle when the vehicle is a non-autonomous vehicle, and/or "driver" may also refer to one or more computer processors used to autonomously or semi-autonomously drive the vehicle. "User" may be used to refer to the driver or occupant of the vehicle when the vehicle is a non-autonomous vehicle, and "user" may also be used to refer to an occupant of the vehicle when the vehicle is an autonomous or semi-autonomous vehicle. As used herein "cylinder" includes storage tanks, pressure vessels and other containers that can be used to store a gas and is not necessarily limited to a specific shape such as a right cylinder and/or a cylinder having a constant or unvarying circular shape in cross-section. As used herein, "fuel" or "gas" refers to any fluid used to power a vehicle, such as gaseous fuel or liquid fuel.

Figure 1:
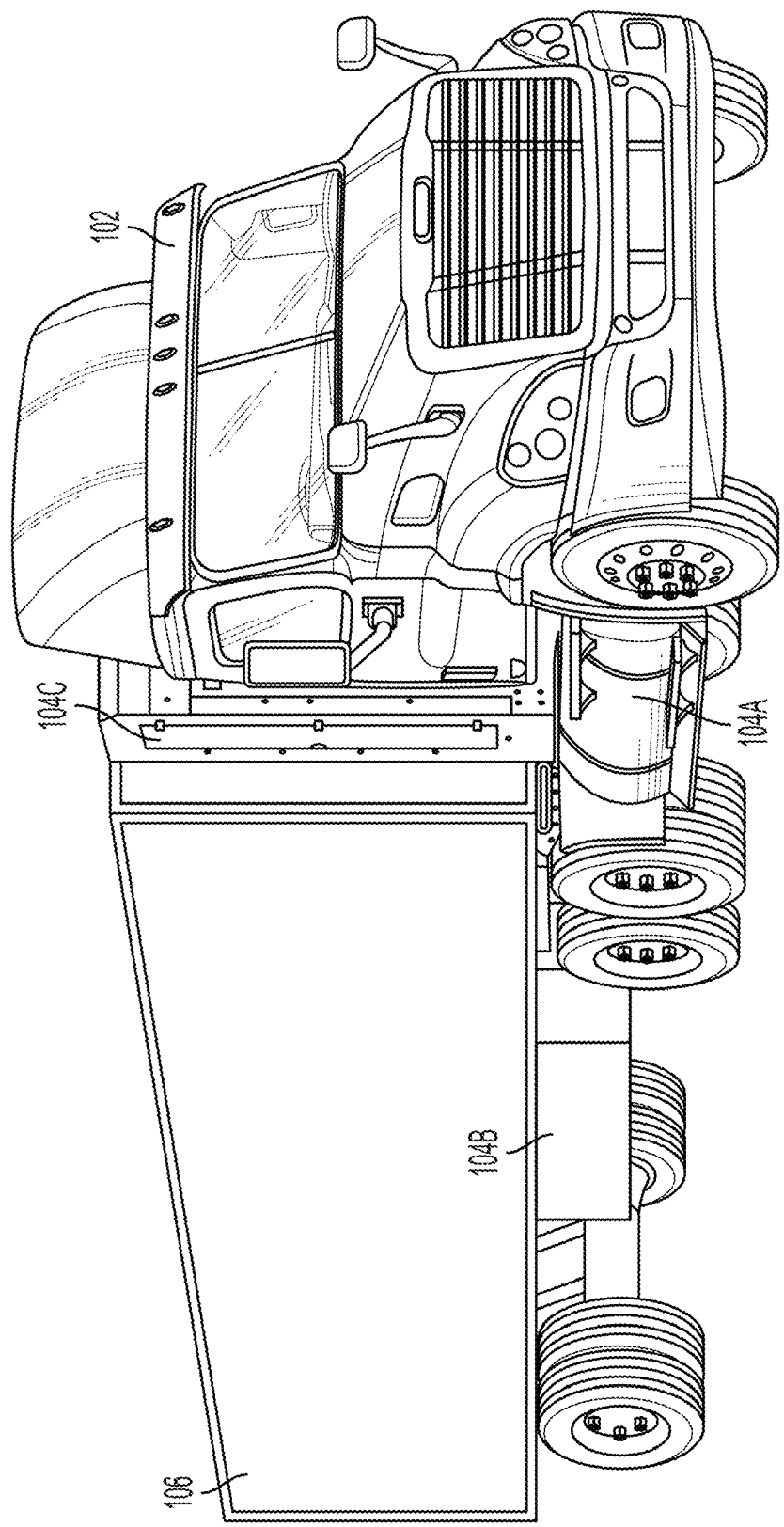
FIG. 1 illustrates a vehicle having composite cylinders storing fuel to power the vehicle, according to various embodiments.

FIG. 1 illustrates a vehicle 102. In particular, the vehicle 102 is a tractor configured to couple to and pull a trailer 106. The vehicle 102 may be powered using fuel stored in a composite pressure cylinder (or "composite cylinder" or "cylinder"). For example, the fuel may be compressed natural gas stored in a composite cylinder.

The cylinder may be part of a gas cylinder assembly. The gas cylinder assembly is in fluid communication with and supplies fuel to an engine or any other power generation system of the vehicle 102. The vehicle 102 may be a car, a wagon, a van, a bus, a high-occupancy vehicle, a truck, a tractor trailer truck, a heavy-duty vehicle such as a garbage truck or any other vehicle. In some embodiments, a gas cylinder assembly is configured for use in a ship, an airplane and a mobile or stationary fuel station.

The fuel cylinders may be stored in a compartment or housing 104A on the sides of the vehicle 102, in a compartment or housing 104B on the trailer 106, or in a compartment or housing 104C behind the cab of the vehicle 102, for example. In some embodiments, the fuel cylinders may be stored on a rooftop or mounted to a tailgate of a vehicle.

Field failures of composite pressure cylinders are derived primarily from three root causes: thermal exposure events, impact damage, or cumulative damage that is deleterious to the composite laminate. While thermal exposure may be mitigated, no systems or methods exist (commercially available or otherwise) that protect composite pressure cylinders against impact damage (e.g., a car crash), or cumulative damage accumulated due to an improper operational condition (e.g., improper installation, or debris caught between a cylinder and an enclosure). Experience has shown that when a cylinder has experienced impact damage of a sufficiently significant level or accumulated latent damage due to improper environmental conditions (e.g., bolt caught between the cylinder and the enclosure), catastrophic failure of the cylinder occurs on subsequent filling cycle(s) when the stress state within the laminate exceeds a critical level.

FIG. 2A illustrates a cylinder 100 configured to store a fluid, such as compressed natural gas or hydrogen. Cylinder 100 may be formed of a metal such as steel, aluminum, glass fiber, carbon fiber, polymer, or a composite material such as carbon fiber reinforced polymer, another suitable material, or a combination thereof. For example, the cylinder 100 may include an inner liner made of gas-tight, polyethylene plastic that has a high-pressure carbon fiber reinforced plastic structure located over the inner liner. In another example, the cylinder 100 may include a metal liner that is wrapped by a composite or fiber resin.

FIG. 2B illustrates a side cross-sectional view of the cylinder 100. The cylinder 100 may have a plurality of layers. For example, the cylinder 100 may have an inner layer 222 and an outer layer 220. The inner layer 222 may be made of metal or plastic or any other rigid material. The outer layer 220 may be made of a composite or fiber resin that is disposed on top of the inner layer 222 during the manufacturing process. The outside of the outer layer 220 may define an outer surface 218 of the cylinder 100. The walls of the cylinder 100 may define an interior cavity 224 for storage of the fuel. While two layers (e.g., inner layer 222 and outer layer 220) are shown in FIG. 2B, any number of layers may be used to form the cylinder 100.

Referring back to FIG. 2A, the cylinder 100 includes a central portion 216 and two end portions 208, 210. The central portion 216 may be a cylindrical tubular shape or any other shape. In some embodiments, each of the two end portions 208, 210 includes a dome structure, as shown in FIG. 2A. In some embodiments, the two end portions are symmetrical to each other. The dome structure may be generally hemispherical at least at the end portions thereof. In some embodiments, two end portions 208, 210 have different shapes such that the cylinder 100 is of an asymmetrical shape.

In some embodiments, the cylinder 100 includes at least one neck 212, 214 (e.g., a longitudinal projection of a boss) that provides an inlet and/or an outlet of an internal volume of the cylinder 100. In some embodiments, the cylinder 100 includes necks 212, 214 formed at both of the end portions 208, 210. In some embodiments, a neck can be formed only one of the two end portions 208, 210. In some embodiments, the neck 212, 214 can be part of a metallic structure, sometimes referred to as a boss, that is formed through a first end portion of an internal pressure enclosure, which is sometimes referred to as an inner liner assembly or simply a liner of the cylinder 100.

The neck 212, 214 can be made of any number of materials, such as metal. In some embodiments, the neck 212, 214 is formed using one or more materials not used for the internal pressure enclosure. In certain embodiments, the neck 212, 214 is made of the same material as the internal pressure enclosure.

The cylinder 100 may have an outer surface 218 that spans the body of the cylinder 100. In some embodiments, the outer surface 218 includes the neck 212, 214. In other embodiments, the outer surface 218 does not include the neck 212, 214. As described herein, damage may be experienced by the cylinder 100. The damage may be a result of a collision between the cylinder 100 and an object, such as a rock or another vehicle. The damage may be a result of an object, such as a bolt, being trapped between the cylinder 100 and a housing of the cylinder 100 (e.g., housing or compartment 104) and damaging the cylinder 100 when the cylinder 100 expands based on pressure or temperature changes. In some situations, the damage may result in a visible dent 204, but in many other situations, the damage may not result in a visible dent. This damage that is not easily visible to a human eye may be as damaging to the cylinder 100 as visible dents. The systems and methods described herein prevent re-use of cylinders that have damage, including cylinders with damage that is not easily visible to the human eye.

The cylinder 100 may have a plurality of sensors 202 attached to the cylinder 100 at various sensor locations 206. The sensors 202 are configured to detect an impact to the cylinder 100. The sensors 202 may be broadband piezoelectric sensors which are sensitive to the out-of-plane displacement component of the laminate of a composite pressure cylinder (e.g., cylinder 100). The sensors 202 may be utilized to detect and establish the energy level of an impact event. The broadband piezoelectric sensors utilize a piezoelectric material in communication with the composite laminate to measure stress waves caused by impact or progressive damage accumulation within the laminate. In some embodiments, the broadband piezoelectric sensors used herein do not necessarily rely on measurement of a shift in resonant or anti-resonant frequency caused by a change in stress state in the piezoelectric material to detect a damage in the composite laminate. In some embodiments, the broadband piezoelectric sensors used herein intentionally do not use measurement of a shift in resonant or anti-resonant frequency caused by a change in stress state in the piezoelectric material to detect a damage in the composite laminate.

The sensors 202 may be considered passive sensors in that one or more of the sensors do not actively emit a wave to be detected by one or more other sensors. Instead, the sensors 202 are used to determine when, where on the tank, and to what severity an impact event occurred, as well as passively monitoring the laminate as the laminate is stressed from an external source.

In some embodiments, the sensors 202 are removably attached to the cylinder 100. In other embodiments, the sensors 202 are integrally formed and embedded within the cylinder 100. The sensors 202 may be located on the outer surface 218 or may be located within (or between) layers of the cylinder 100. In some embodiments, the sensors 202 may be located in an inner surface within the interior cavity 224 of the cylinder 100.

The sensors 202 may be located at sensor locations 206 that are known, and the data detected by the sensors, along with the sensor locations 206 on the cylinder 100, may be used to determine the location of any detected damage, such as dent 204. While four sensors 202 are shown, any number of sensors may be used. In many situations, the use of more sensors 202 results in more accurate determinations of the location of the damage and magnitude of the damage.

Figure 3A:
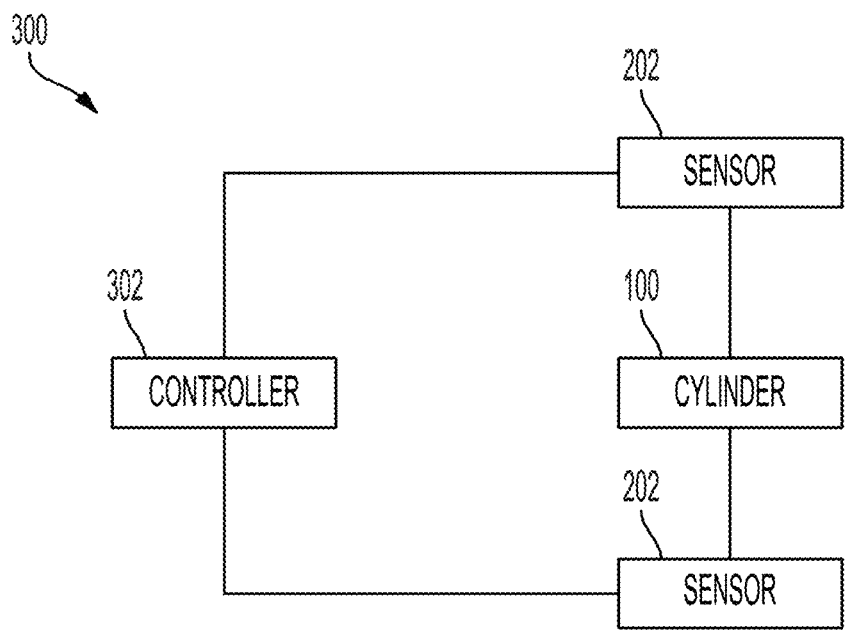
FIGS. 3A-3B illustrate block diagrams of monitoring components of the system, according to various embodiments.

FIG. 3A illustrates a block diagram of components that may be coupled to the cylinder 100. The system 300 includes a cylinder 100 and sensors 202, as described herein. The sensors 202 are physically coupled to the cylinder 100, also as described herein.

The sensors 202 may be communicatively coupled to a controller 302 (or "cylinder controller" or "cylinder-side controller" or "impact monitoring controller"). The sensors 202 may be configured to detect deformation data associated with an impact received (or experienced) by the cylinder 100. As used herein, "deformation data" may be used to refer to the deformation of the cylinder 100. In this regard, "disturbance data," "impact data," or "cylinder integrity data," among others, may be used interchangeably with "deformation data."

The deformation data may be provided to the controller 302. The controller 302 may be a computer processor, microprocessor, control unit, or any device configured to execute instructions stored in non-transitory memory. The controller 302 may be located in a housing that is physically coupled to the cylinder 100 (e.g., located directly on the cylinder 100, on a housing of the cylinder 100, or on a device coupled to the cylinder 100). As shown in FIG. 3A, the controller 302 is configured to monitor only the cylinder 100, such that if the vehicle 102 uses multiple cylinders, each cylinder 100 has its own array of sensors 202 and its own respective controller 302.

The sensors 202 may be communicatively coupled to the controller 302 via wires, or in a wireless manner, using respective transceivers (e.g., a transceiver for each sensor 202 and a transceiver for the controller 302). While two sensors 202 are shown, any number of sensors 202 may be included in the system 300, and each sensor 202 may be communicatively coupled to the controller 302.

The controller 302 may receive the deformation data detected by the sensors 202 and detect whether an impact event has been experienced by the cylinder 100 and determine an energy level of the impact event. In some embodiments, the controller 302 digitizes the deformation data detected by the sensors 202 in order to detect whether the impact event has been experienced by the cylinder 100 and determine the energy level of the impact event.

Figure 3B:
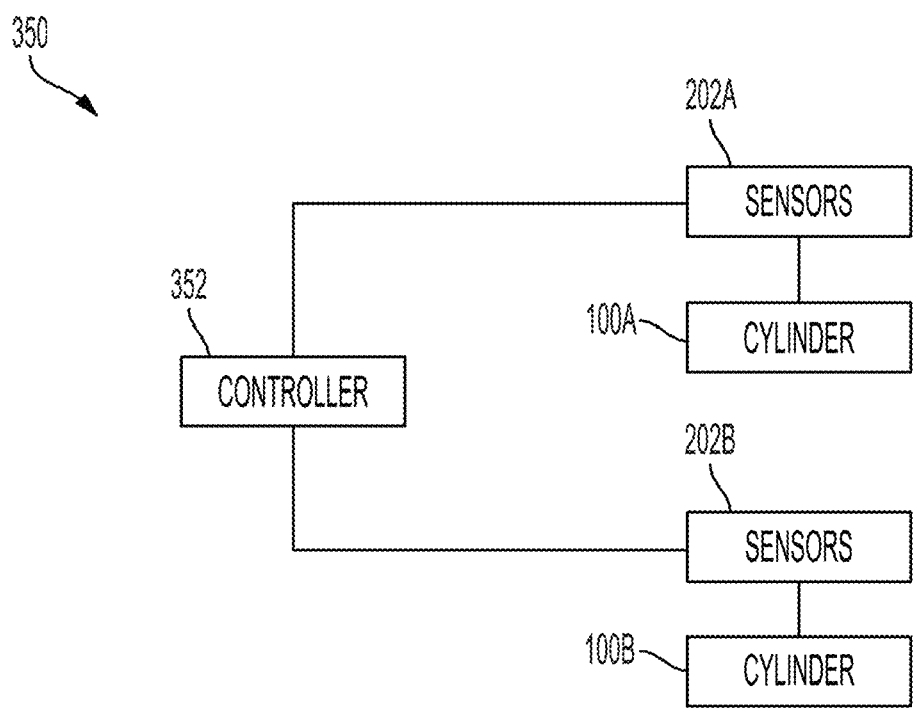

FIG. 3B illustrates a block diagram of components that may be coupled to cylinders 100 (e.g., cylinder 100A and cylinder 100B). The system 350 includes a plurality of cylinders 100 and sensors 202 (e.g., sensors 202A and sensors 202B), as described herein. The sensors 202 are physically coupled to their respective cylinder 100, also as described herein.

The sensors 202 may be communicatively coupled to a controller 352 similar to controller 302. The sensors 202 may be configured to detect deformation data associated with an impact received (or experienced) by the cylinder 100. The deformation data may be provided to the controller 352. The controller 352 may be a computer processor, microprocessor, control unit, or any device configured to execute instructions stored in non-transitory memory. The controller 352 may be located in a housing that is physically coupled to the cylinders 100 (e.g., located directly on one of the cylinders 100, on a housing of the cylinders 100, or on a device coupled to the cylinders 100). As shown in FIG. 3B, the controller 352 is configured to monitor cylinder 100A and cylinder 100B, such that if either cylinder 100A or cylinder 100B were impacted, the controller 352 could detect the impact.

The sensors 202 may be communicatively coupled to the controller 352 via wires, or in a wireless manner, using respective transceivers (e.g., a transceiver for each sensor 202 and a transceiver for the controller 352). While two sets of sensors 202 and cylinders 100 are shown, any number of sets of sensors 202 and cylinders 100 may be included in the system 350, and each set of sensors 202 may be communicatively coupled to the controller 302.

The controller 352 may receive the deformation data detected by the sensors 202 and detect whether an impact event has been experienced by the cylinder 100 and determine an energy level of the impact event. The data received from the sensors 202 may include an identification of which cylinder 100 the data is associated with. For example, each sensor 202 may be associated with an identifier, and the identifier may be communicated by the sensor 202 along with the deformation data to the controller 352.

In some embodiments, the controller 302, 352 is a separate controller from a controller of the vehicle 102 (e.g., an electronic control unit) or a controller of any other subsystem of the vehicle 102. In other embodiments, the controller 302, 352 is a controller of the vehicle 102 configured to control one or more other vehicle systems.

Figure 4:
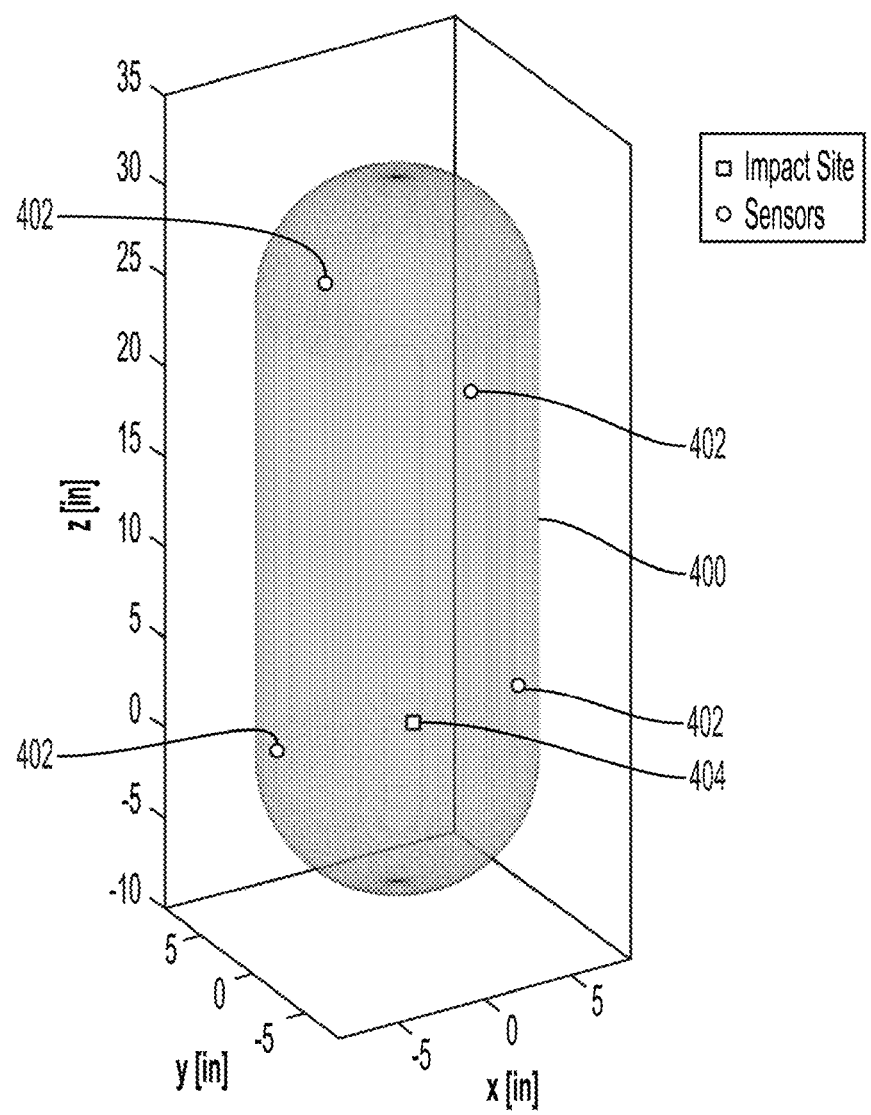
FIG. 4 illustrates a model of the cylinder, sensors, and impact site, according to various embodiments.

FIG. 4 illustrates a model 401 of a cylinder and sensors configured to detect deformation data. The model 401 may be constructed by a controller (e.g., controller 302, 352) communicatively coupled with sensors (e.g., sensors 202). The cylinder 400 of the model 401 is similar to the real-world cylinder 100. In some embodiments, the controller is provided with an identification associated with the cylinder 100, and dimensions associated with the cylinder 100 may be accessed from a local or remote non-transitory memory. In some embodiments, the controller is provided with the dimensions of the cylinder 100.

The sensors 402 of the model 401 are similar to the real-world sensors 202. The controller is provided with the locations of the real-world sensors 202 on the real-world cylinder 100, and the controller identifies corresponding locations for the model sensors 402 on the model cylinder 400. While four sensors 402 are shown, any number of sensors may be used. In many situations, the use of more sensors 402 results in more accurate determinations of the location of the damage and magnitude of the damage.

In experiments conducted using the systems and methods described herein, broadband piezoelectric sensors were coupled to the surface of a 353 mm diameter×889 mm long 250 bar Type 4 composite pressure cylinder, as modeled by the cylinder 400 and the sensors 402.

The instrumented cylinder was then impacted (shown in the modeled impact site 404) with a hemispherical 50 mm diameter TUP at an energy level of 600 J, and the out-of-plane displacement component stress waves which propagated were captured and digitized for location and energy quantification analysis.

Figure 5:
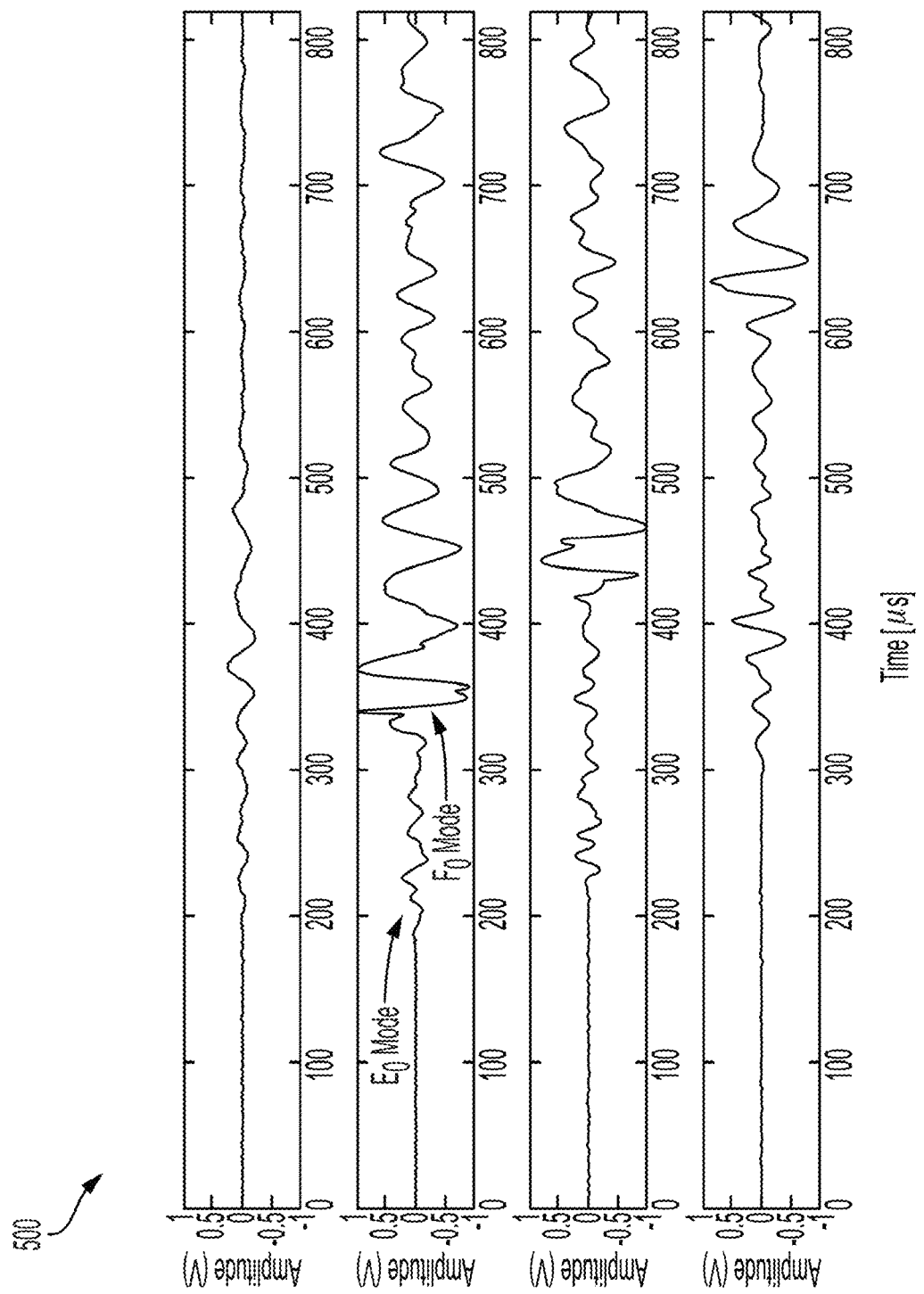
FIGS. 5 and 6 illustrate sensor data of the system, according to various embodiments.

FIG. 5 illustrates graphs 500 of the captured waveforms from an exemplary impact event, from which it can be observed that guided stress waves propagated as a result of the impact event.

Each graph having a respective trace corresponds to a sensor 202 and shows the amplitude (or out-of-plane displacement) detected by each sensor over time. The propagation of the waves is dictated by guided mode wave propagation. The extensional mode, labeled $E_0$, is followed by a larger amplitude flexural mode, labeled $F_0$. The different modes have different velocities and the modes are composed of broad frequency bandwidths. Thus, determining the common frequency component of the same mode for each sensor channel to determine the arrival time of the wave at each sensor is not an obvious proposition.

Figure 6:
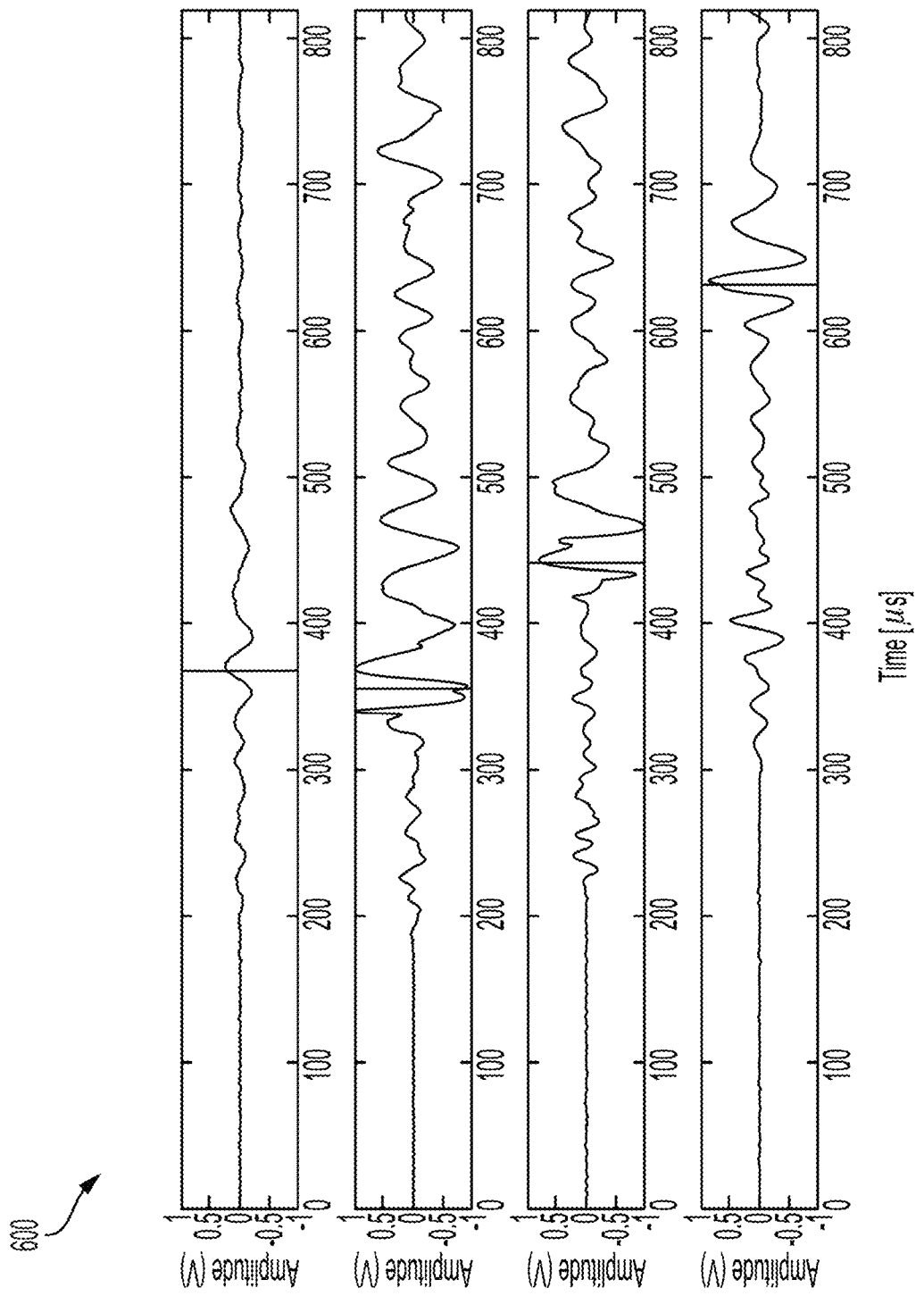

FIG. 6 illustrates graphs 600 showing the identification of the direct arrival time of the 25 kHz component of the fundamental flexure wave (identified by the vertical line) on each channel using a threshold independent arrival time estimation technique. The direct arrival time at each sensor channel is used as an input in a source location determination algorithm to determine the geodesic curves of a curvilinear surface.

More specifically, an optimal source location on the cylinder surface may then be computed with knowledge of the group velocity of the 25 kHz component of the fundamental flexure wave mode derived from knowledge of the dispersion relations of the laminate, discretization of the cylinder surface into N points, a computation of the geodesic propagation distance from the ith point on the cylinder to the jth transducer, and minimizing the sum of squared error in differences of computed inter-channel arrival time differences and the physically measured arrival time differences.

Figure 7:
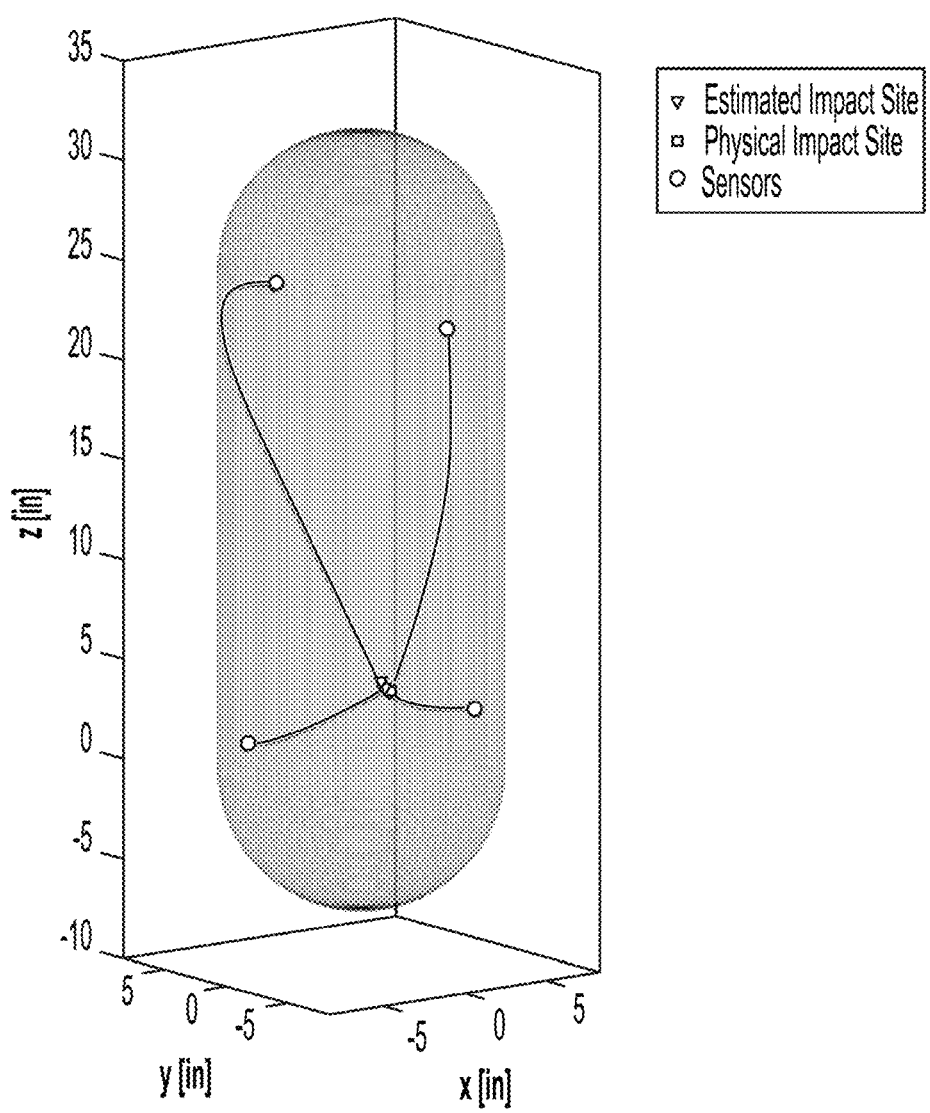
FIG. 7 illustrates a model of the cylinder, sensors, and estimated impact site, according to various embodiments.

FIG. 7 illustrates a model with an identification of the optimal source location estimation (with geodesic paths overlaid on the cylinder surface) for the impact event observed in FIG. 6. Once the location is determined, the direct arrival time of the wave from the location of impact to each sensor may be determined. This direct arrival time is used the determination of the measure direct waveform energy, described below.

The systems and methods described herein quantify the calculation of direct waveform energy. A computation of the measured direct waveform energy ($U_{WAVE}$) may be computed from the captured waveforms as $U_{WAVE} = \int_0^{t_{DIRECT}} V^2 dt$, where $t_{DIRECT}$ represents the direct arrival time of the slowest moving wave component for wave propagation from the estimated source location to the sensor under consideration and V represents voltage detected at each sensor (e.g., piezoelectric sensor).

The systems and methods described herein use the direct energy, as other quantifications of energy may also include wave reflections or alternative (longer) arrival paths of wave energy spread from the impact that may constructively amplify with other waves, resulting in an inaccurate quantification of the detected impact. For example, quantifications of energy focused on an amplitude assessment are not as accurate as the systems and methods described herein, as propagating waves may combine constructively or destructively, such that assessing amplitude does not result in an accurate assessment of the wave energy. In comparison, by using direct wave energy, the systems and methods described herein mitigate reflections and wrapping waves. The normalization procedure described herein accounts for energy loss as a function of propagation distance due to geometric spreading of the wavefront as it propagates out from a source.

Figure 8:
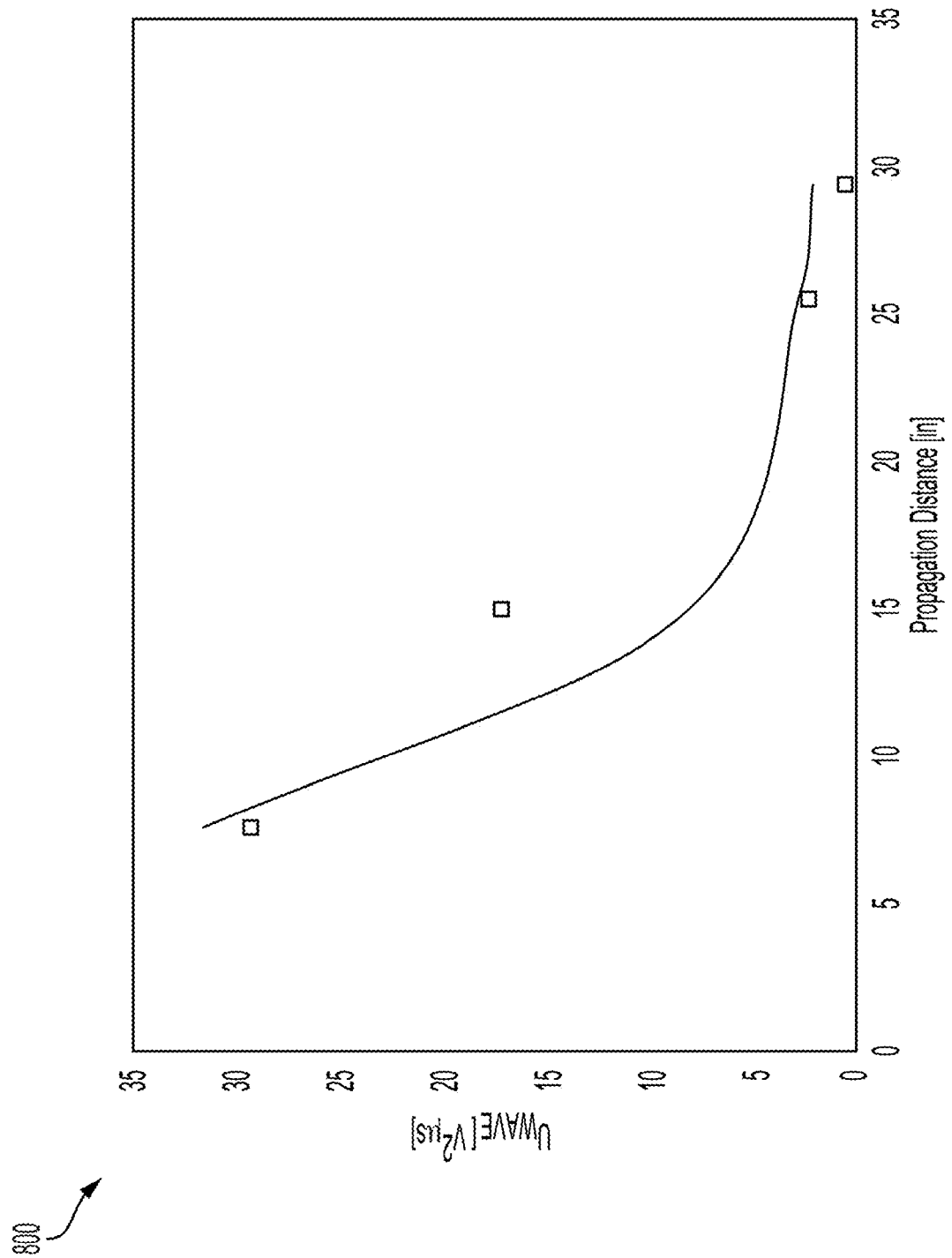
FIG. 8 illustrates data of the system, according to various embodiments.

In FIG. 8, it is shown that measured direct wave energy (caused by an impact event) decays in the far-field following a modified inverse square law, allowing a quantitative assessment of impact energy severity as measured from wave energy. Thus, based on the propagation distance, an impact energy can be established and evaluated against a threshold for a given cylinder construction. The systems and methods described herein detect an event above a threshold and also normalize for every real-world wave propagation effect that can occur. This normalization reduces the number of false triggers, enhancing reliability of the system. As described herein, normalization accounts for amplitude and energy loss due to geometric spreading from source to sensor distance, as well as other attenuation effects.

If the quantitative assessment of the impact energy severity exceeds an impact damage threshold (e.g., a predetermined laminate impact energy threshold), the controller 302, 352 is configured to provide an indication that damage has been experienced by the cylinder 100. The indication may be provided to any number of devices, such as an ECU of the vehicle 102, a local non-transitory memory, or a remote non-transitory memory.

When the indication is provided to an ECU of the vehicle 102, the ECU of the vehicle 102 may instruct a light or other notification indicator to be illuminated, such as a light on a dashboard of the vehicle 102 or an instrument panel of the vehicle 102. The light or other notification may serve as a reminder to inspect the cylinder 100 prior to refilling the cylinder 100.

When the indication is provided to a local non-transitory memory, the controller 302, 352 may update, on the local non-transitory memory, a state indication associated with each of the cylinders 100 of the vehicle 102, and the state indication may be changed from a first state corresponding to a non-damaged condition of the cylinder to a second state corresponding to a potentially damaged condition of the cylinder. The local non-transitory memory may be accessed by another device (e.g., a filling device) to determine whether the cylinder 100 should be inspected prior to refilling, and when the local non-transitory memory indicates that the state of the cylinder is in the second state, the filling device (or other device) may provide a corresponding indication to the operator, or the filling device may automatically prevent filling of the cylinder 100.

Similarly, when the indication is provided to a remote non-transitory memory, the controller 302, 352 may update, on the remote non-transitory memory, a state indication associated with each of the cylinders 100 of the vehicle 102, and the state indication may be changed from a first state corresponding to a non-damaged condition of the cylinder to a second state corresponding to a potentially damaged condition of the cylinder. The remote non-transitory memory may be accessed by another device (e.g., a filling device) to determine whether the cylinder 100 should be inspected prior to refilling, and when the remote non-transitory memory indicates that the state of the cylinder is in the second state, the filling device (or other device) may provide a corresponding indication to the operator, or the filling device may automatically prevent filling of the cylinder 100. The remote non-transitory memory may be accessed by the controller 302, 352 using respective transceivers (e.g., a transceiver coupled to the controller 302, 352 and a transceiver coupled to the remote non-transitory memory).

In the event that an impacted cylinder 100 with compromised strength were to be refilled, the same sensors 202 used to detect the impact may also be used to perform a Modal Acoustic Emission (MAE) inspection to detect a loss of cylinder integrity during refilling.

Figure 9:
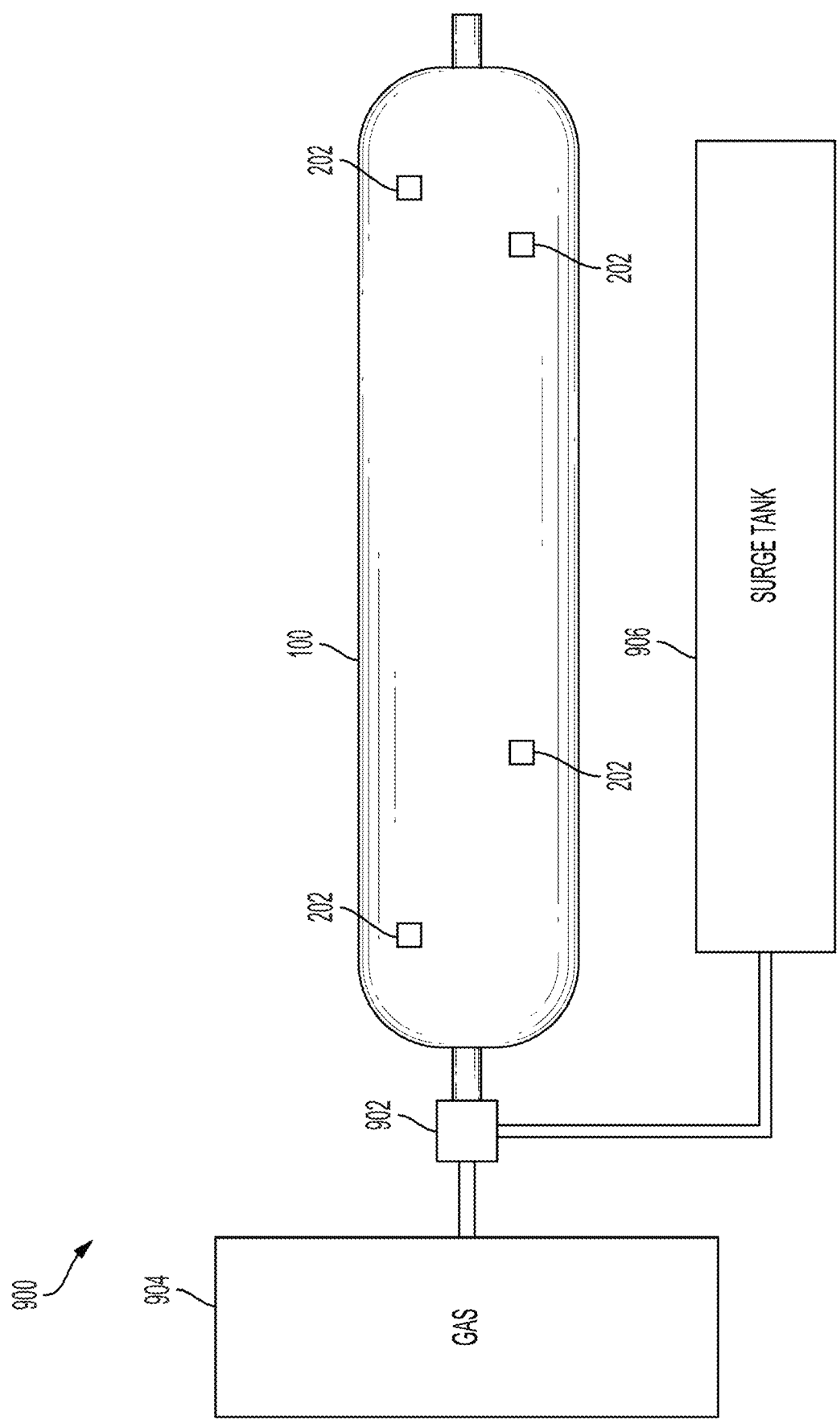
FIG. 9 illustrates a block diagram of components for filling a cylinder, according to various embodiments.

FIG. 9 illustrates a system 900 including the cylinder 100 coupled to a filling device. The filling device may include a valve 902 and a supply tank 904. The valve 902 may be automatically controlled by a controller to control filling of the cylinder 100 with gas stored in the supply tank 904. In some situations, the cylinder 100 may remain attached to the vehicle 102 during filling.

During the filling of the cylinder 100, the contents of the cylinder 100 apply internal outward pressure to the cylinder shell and induce mechanical stress within the composite laminate of the cylinder 100. If the composite laminate had been materially degraded due to damage, as described herein, the affected volume of material will fail via numerous damage mechanisms associated with composite pressure cylinders (e.g., fiber fracture, matrix cracking, interfacial failure, etc.). As the damage mechanisms occur, stress waves propagate out from the origin of the damage mechanism site into the wall of the cylinder 100. The sensors (e.g., broadband piezoelectric sensors) 202 detect the deformation data associated with these damage mechanisms by transducing stress waves into a voltage digitally captured for analysis.

When damage during filling is detected, one or more steps may be taken to mitigate harm from a breached cylinder. A visual alert, such as a light or a displayed message may be triggered. An audible alert, such as a siren or alarm may be triggered. The valve 902 may be automatically shut off to prevent further filling of the cylinder with gas.

In some embodiments, gas from the supply tank 904 and/or the cylinder 100 may be routed to a surge tank 906 by selectively opening and closing one or more ports between the supply tank 904, the cylinder 100, and the surge tank 906. For example, the valve 902 may be capable of opening and closing a port coupled to the supply tank 904, a port coupled to the cylinder 100, and a port coupled to the surge tank 906. Any combination of ports may be selectively opened and closed. For example, during filling, the ports for the supply tank 904 and the cylinder 100 may be opened and the port for the surge tank 906 may be closed. In another example, in the event of a detected breach of the cylinder 100, the ports for the cylinder 100 and the surge tank 906 may be opened and the port for the supply tank 904 may be closed.

In some embodiments, the surge tank 906 has a lower pressure than the cylinder 100, so the gas may be compelled to travel to the surge tank 906 if a port between the surge tank 906 and the cylinder 100 is opened. In some embodiments, a suction or pressure may be applied to the gas to compel the gas to move from the cylinder 100 to the surge tank 906. A vent stack may also be present to facilitate movement of the gas.

Modal Acoustic Emission analysis algorithms of the digitally captured waveforms may be focused on at least one of: the detection and quantification of fiber tow fracture above a specified threshold, the measurement of instability within a local volume of material above a specified threshold, damage mechanisms being accumulated in a localized volume of material above a specified threshold, and/or the detection of fretting emission above a specified threshold for a given cylinder laminate.

When combinations of the above are used together for detection of a compromised cylinder during filling, the factors may be weighted based on various characteristics of the fuel system, including the cylinder and dimensions and construction thereof. For example, a combination of fretting emission and localized growth may be used to determine whether a particular cylinder is compromised during filling, the fretting emission being weighted more heavily than the localized growth.

Figure 10:
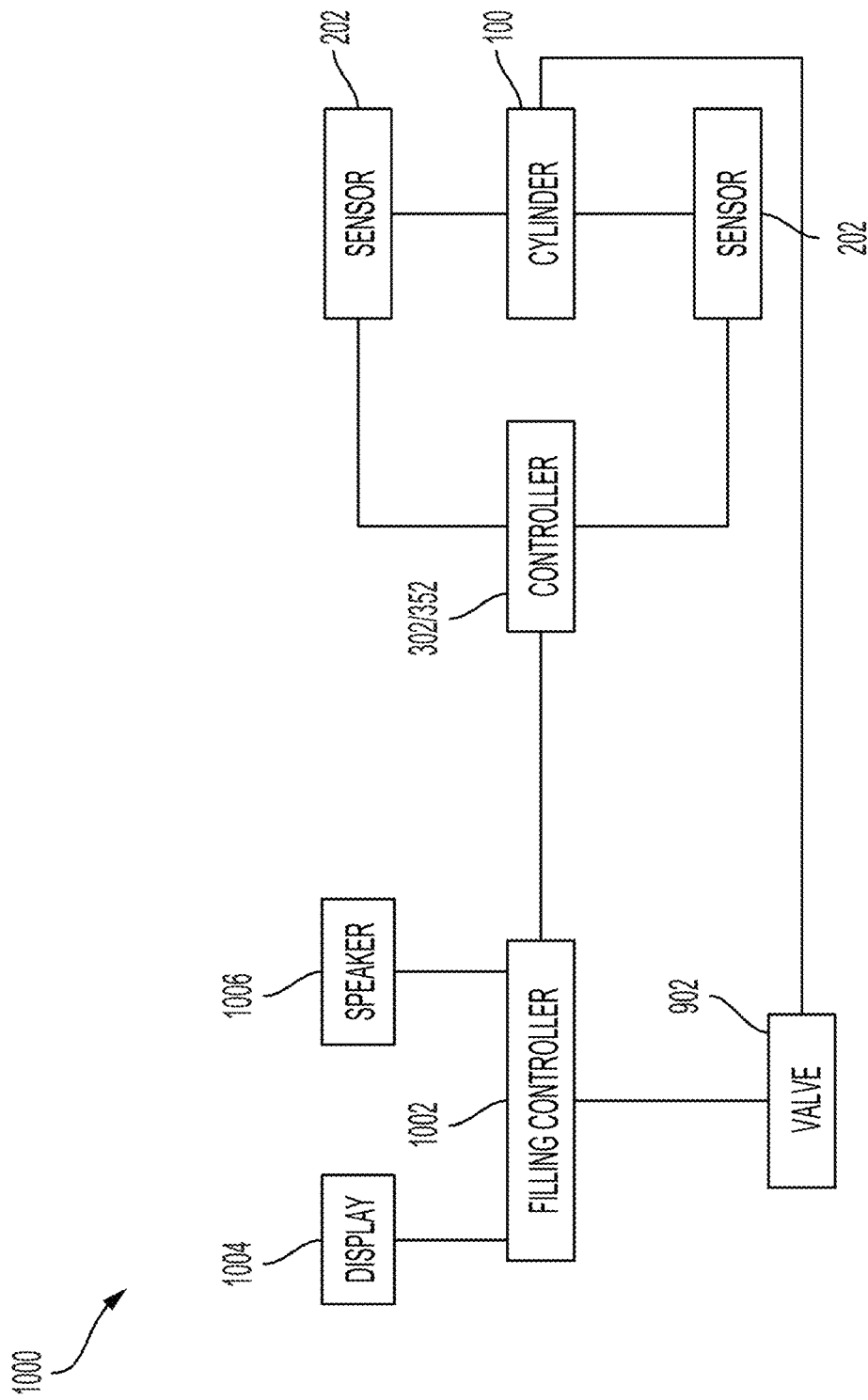
FIG. 10 illustrates a block diagram of components for monitoring and filling a cylinder, according to various embodiments.

FIG. 10 illustrates a block diagram of a system 1000. The system 1000 includes the cylinder 100, sensors 202, and controller 302, as described herein.

The controller 302 may be communicatively coupled to a filling controller 1002 (or "filling device controller" or "filling-side controller"). The controller 302 may be communicatively coupled to the filling controller 1002 in a wired or wireless manner. The filling controller 1002 may also be communicatively coupled to a valve 902 that controls flow of fuel during refilling of the cylinder 100.

The filling controller 1002 may obtain the state of the cylinder 100 from the controller 302, from an ECU of the vehicle 102, from a local non-transitory memory, and/or a remote non-transitory memory, as described herein.

The filling controller 1002 may also be communicatively coupled to a display 1004 and a speaker 1006. The filling controller 1002 may be configured to render a graphical user interface displayed by the display 1004. The graphical user interface may include notifications of whether the cylinder 100 should be inspected prior to filling, and the display 1004 may display these notifications. The filling controller 1002 may also be configured to provide a notification of whether the cylinder 100 should be inspected prior to filling using the speaker 1006. The speaker 1006 may emit a noise, alarm, spoken words (e.g., "Inspect the cylinder prior to filling"), or any other indication.

In some embodiments, the filling controller 1002 may not be aware of the state of the cylinder 100 and may perform the functions described herein without regard to the current status of the cylinder 100.

As the cylinder 100 is being filled with fuel, the sensors 202 may detect deformation data and provide the detected deformation data to the filling controller 1002. In some embodiments, the sensors 202 are communicatively coupled to the filling controller 1002 via the controller 302. In some embodiments, the sensors 202 are directly communicatively coupled to the filling controller 1002 using respective transceivers or a wired connection.

The filling controller 1002 receives the detected deformation data and detects damage to the cylinder 100 caused by the cylinder 100 being filled, and when the detected damage exceeds a threshold, the filling controller 1002 may automatically close the valve 902 to prevent further filling of the cylinder 100. In some embodiments, the filling controller 1002 always monitors the cylinder 100 using the sensors 202 during filling for detection of a breach of the integrity of the cylinder 100. In some embodiments, the filling controller 1002 only monitors the cylinder 100 using the sensors 202 during filling when the controller 302, 352 had detected damage that exceeds an impact damage threshold based on quantification of the direct energy of the impact.

As described herein, when the filling controller 1002 receives the detected deformation data and detects damage to the cylinder 100 caused by the cylinder 100 being filled, a surge tank (e.g., surge tank 906) may be used to receive the fuel.

Although the same sensors 202 are used by the controller 302, 352 and the filling controller 1002, the controller 302, 352, is configured to detect an impact caused by an external force onto the cylinder 100, and the filling controller 1002 is configured to detect damage to the cylinder 100 caused by the expansion of the cylinder 100 during filling, which may rupture due to previously weakened or deformed areas (e.g., areas where an impact was experienced).

In experiments conducted using the systems and methods described herein, broadband piezoelectric sensors were coupled to the surface of a 353 mm diameter×889 mm long 250 bar Type 4 composite pressure cylinder, as modeled by the cylinder 400 and the sensors 402 of FIG. 4. These same sensors were used during a simulated fill to demonstrate the MAE inspection of a degraded cylinder.

Figure 11:
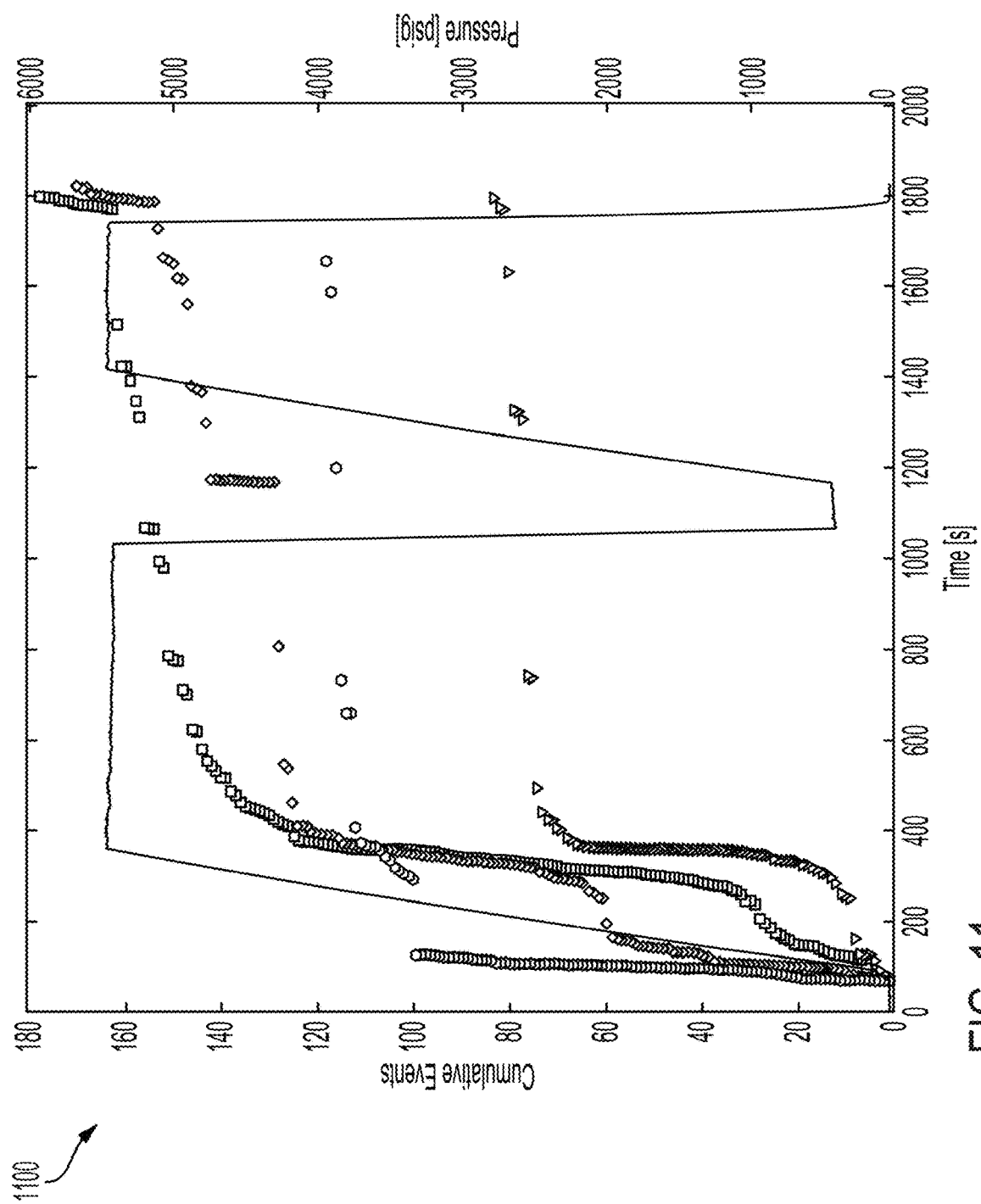
FIG. 11-13 illustrate detected data during filling of the cylinder, according to various embodiments.

FIG. 11 provides a plot 1100 of cumulative events detected on the first threshold crossing channel as a function of test time and pressure. That is, the plot 1100 shows the cumulative number of events by first detecting channel during simulated cylinder fueling. The dashed line corresponds to the pressure within the cylinder over two fill cycles.

Figure 12:
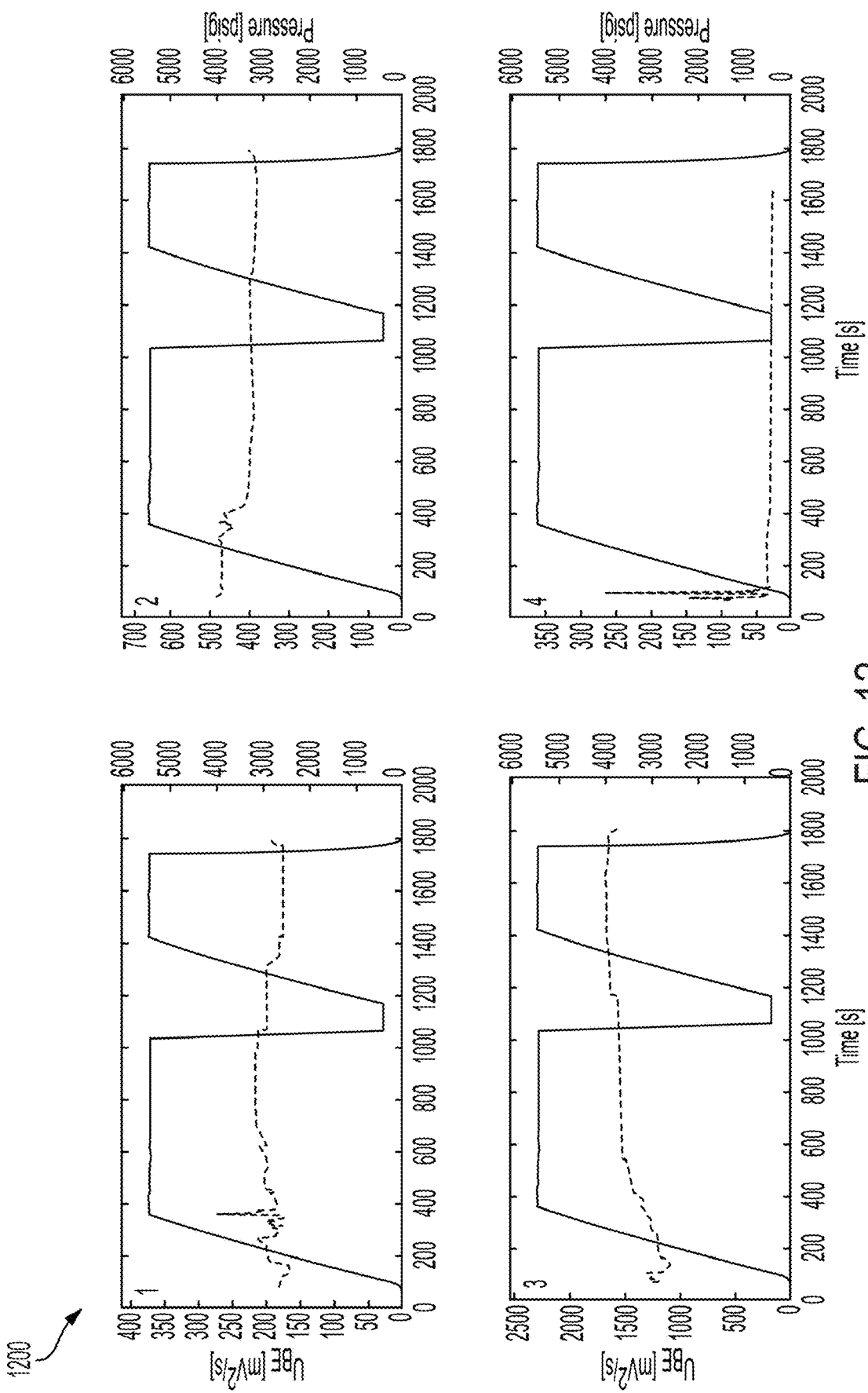

FIG. 12 illustrates local instability plots for the cylinder during simulated filling. The solid line shows pressure in the cylinder and the dashed line is background energy indicating instability indicative of local instability in a volume of the cylinder. When the background energy curve oscillates more than a specified threshold for a given cylinder construction, this indicates instability. Performance of an instability analysis found that the cylinder exhibited local instability above the threshold level established for that cylinder design on Channel 1 that would have stopped the filling process.

An instability analysis, as shown in FIG. 12 may be one of multiple factors used to determine damage to the cylinder 100 during filling, as described herein. Moreover, using frequency and energy quantification algorithms, a quantitative assessment of the extent of fiber fracture severity may be made and evaluated against a specified threshold.

Figure 13:
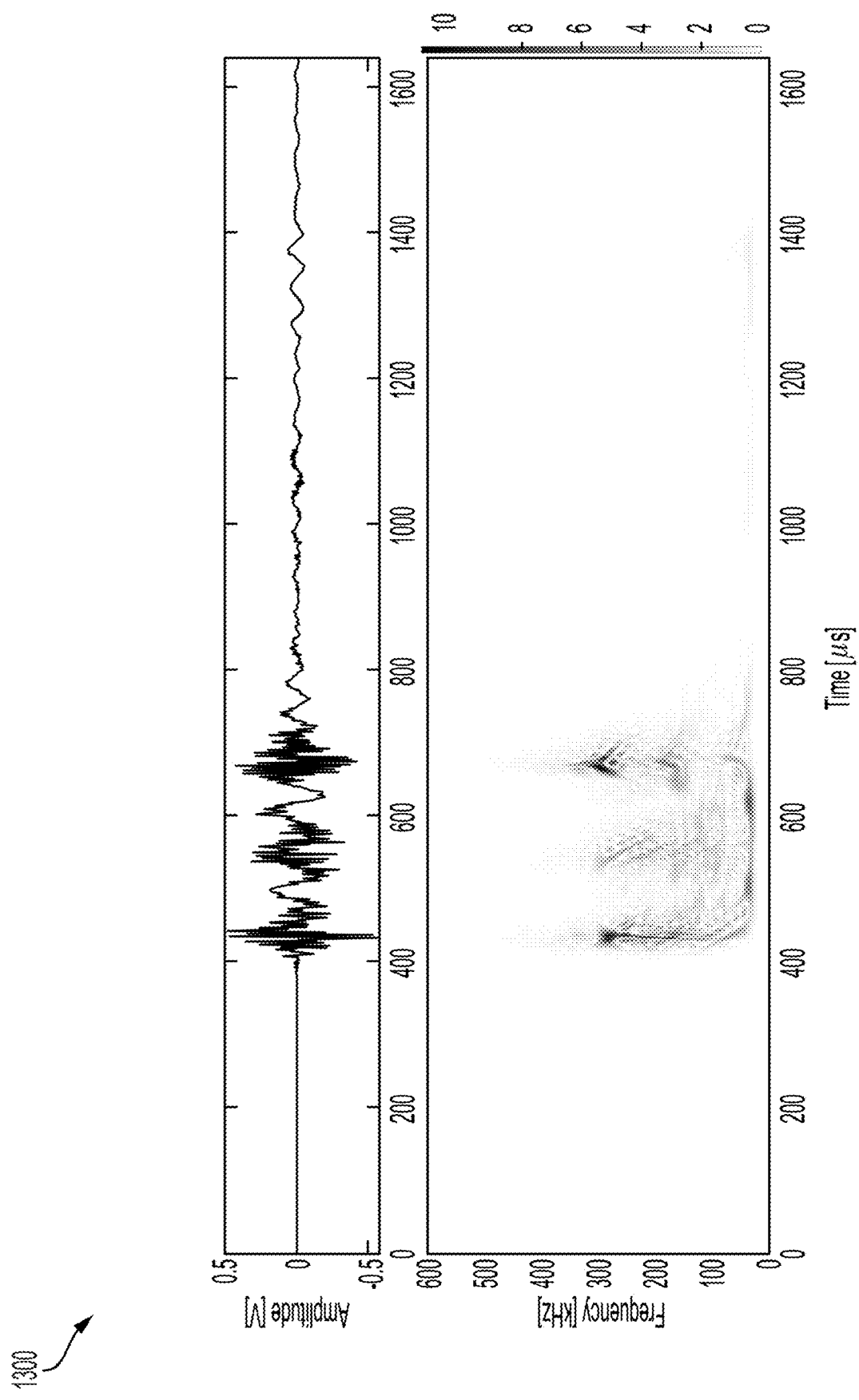

FIG. 13 presents a temporal and time-frequency domain plot of a detected fiber tow fracture event detected during the simulated filling of the impacted cylinder, emanating from the volume of material which had experienced the impact damage.

Figure 14:
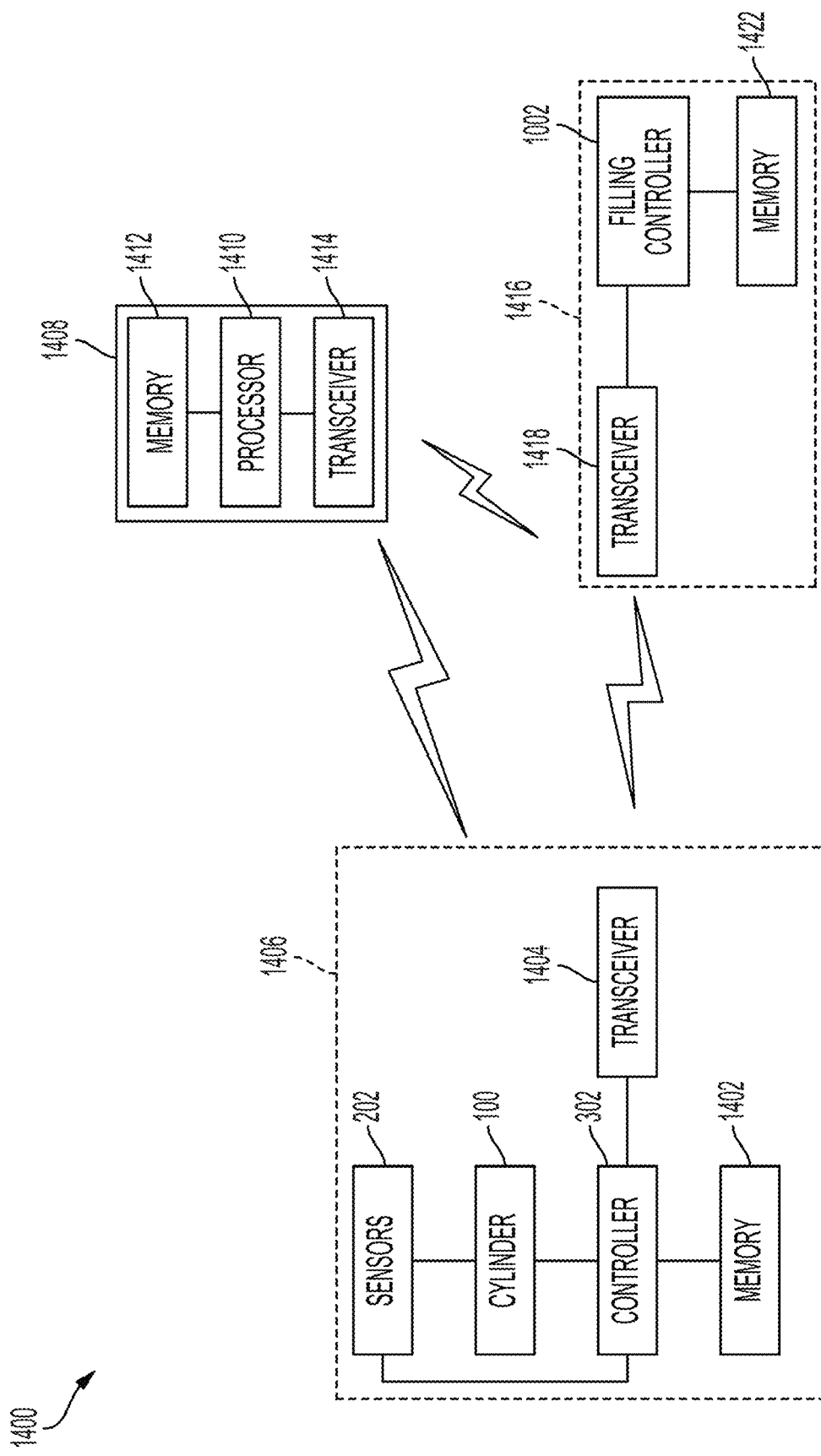
FIG. 14 is a block diagram of the system, according to various embodiments.

FIG. 14 illustrates an example system 1400, according to various embodiments of the invention. The system 1400 includes cylinder 100, sensors 202, and controller 302, each as described herein. As described herein, the sensors 202 are configured to detect deformation data of the cylinder 100 and communicate the deformation data to the controller 302. The sensors 202 may be piezoelectric sensors (e.g., fiber Bragg grating, non-contact laser, etc.) or any other sensors configured to detect deformation of the cylinder 100. Also as described herein, the controller 302 is configured to detect damage to the cylinder 100 based on the deformation data and determine whether the damage exceeds an impact threshold. The damage may be a quantitative value determined based on the direct energy from the impact of an object contacting the cylinder 100.

The system 1400 also includes a memory 1402 coupled to the controller 302. The memory 1402 may be a non-transitory memory configured to store instructions for execution by the controller 302, which may be a computer processor, such as a microprocessor or microcontroller. The memory 1402 may also store data such as deformation data detected by the sensors 202 or a state of the cylinder 100, for example. The state of the cylinder 100 may be represented in multiple tiers (e.g., 2 tiers, 3 tiers, 4 tiers) each associated with a word (e.g., "normal," "needs inspection," "damaged") or number (e.g., 1, 2, 3, 4).

The system 1400 also includes a transceiver 1404 coupled to the controller 302. The controller 302 may use the transceiver 1404 to couple to a network such as a local area network (LAN), a wide area network (WAN), a cellular network, a digital short-range communication (DSRC), the Internet, or a combination thereof.

The transceiver 1404 may include a communication port or channel, such as one or more of a Wi-Fi unit, a Bluetooth® unit, a Radio Frequency Identification (RFID) tag or reader, a DSRC unit, or a cellular network unit for accessing a cellular network (such as 3G, 4G, or 5G). The transceiver 1404 may transmit data to and receive data from devices and systems not directly connected to the controller 302. For example, the controller 302 may communicate with a remote data server 1408 and/or a filling device 1416. Furthermore, the transceiver 1404 may access the network, to which the remote data server 1408 and the filling device 1416 is also connected.

The controller 302 may also be configured to communicate with one or more computers or electronic control units (ECU) of the vehicle which is powered by the cylinder 100 (e.g., vehicle 102). The ECU of the vehicle may control one or more aspects of the vehicle, including an indicator light, display screen, speaker, or other notification device for alerting a driver or user when the controller 302 detects damage to the cylinder 100, as described herein. The controller 302 may communicate with the ECU of the vehicle via wires or via the transceiver 1404, with the ECU being coupled to its own respective transceiver. In this regard, the ECU may also be coupled to its own non-transitory memory similar to memory 1402.

The cylinder 100, sensors 202, controller 302, memory 1402, and transceiver 1404 may be collectively referred to as a cylinder monitoring device 1406. The cylinder monitoring device 1406 may be physically located on a vehicle (e.g., vehicle 102). In some embodiments, "cylinder monitoring device" may refer to the sensors 202, controller 302, memory 1402, and/or transceiver 1404, with the cylinder 100 being separate from the cylinder monitoring device. Although FIG. 14 illustrates various elements connected to the controller 302, the elements of the cylinder monitoring device 1406 may be connected to each other using a communications bus.

The controller 302 may communicate the deformation data from the sensors 202 and/or an update to the state of the cylinder 100 to a remote data server 1408. The remote data server 1408 may include a processor 1410, a memory 1412, and a transceiver 1414. The processor 1410 may be any computing device configured to execute instructions stored in a non-transitory memory. The memory 1412 may be similar to memory 1402 and configured to store instructions for execution by the processor 1410 as well as deformation data detected by the sensors 202 or a state of the cylinder 100, for example.

The transceiver 1414 is similar to transceiver 1404 and is configured to transmit and receive data from one or more other devices, such as the cylinder monitoring device 1406 and the filling device 1416.

In some embodiments, instead of the controller 302 performing determinations based on the deformation data from the sensors 202, the processor 1410 may receive the deformation data and perform one or more of the responsibilities of the controller 302 described herein. In these embodiments, it may be computationally more efficient to communicate the deformation data detected by the sensors 202 to the remote data server 1408 (via respective transceivers 1404, 1414) for processing by the processor 1410 than having the controller 302 perform the processing.

While one remote data server 1408 is shown, there may be a plurality of remote data servers 1408 configured to distribute the computational load to improve computational efficiency. In some embodiments, the remote data server 1408 may be any device capable of communicating with the cylinder monitoring device 1406 and capable of performing computer processing, such as an ECU of the vehicle or a mobile device (e.g., a smartphone, laptop, tablet).

The controller 302 may also communicate the deformation data from the sensors 202 and/or an update to the state of the cylinder 100 to the filling device 1416. The filling device 1416 includes filling controller 1002, as described herein. The filling controller 1002 is configured to control a valve (e.g., valve 902) for filling the cylinder 100. The filling controller 1002 may receive data from the controller 302 via transceiver 1418, which is similar to transceiver 1404 and transceiver 1414. The filling controller 1002 may be connected to memory 1422 (e.g., a non-transitory memory) which may be similar to memory 1402 and memory 1412 and configured to store instructions for execution by the filling controller 1002 as well as deformation data detected by the sensors 202 or a state of the cylinder 100, for example.

As used herein, a "unit" may refer to hardware components, such as one or more computer processors, controllers, or computing devices configured to execute instructions stored in a non-transitory memory.

Figure 15A:
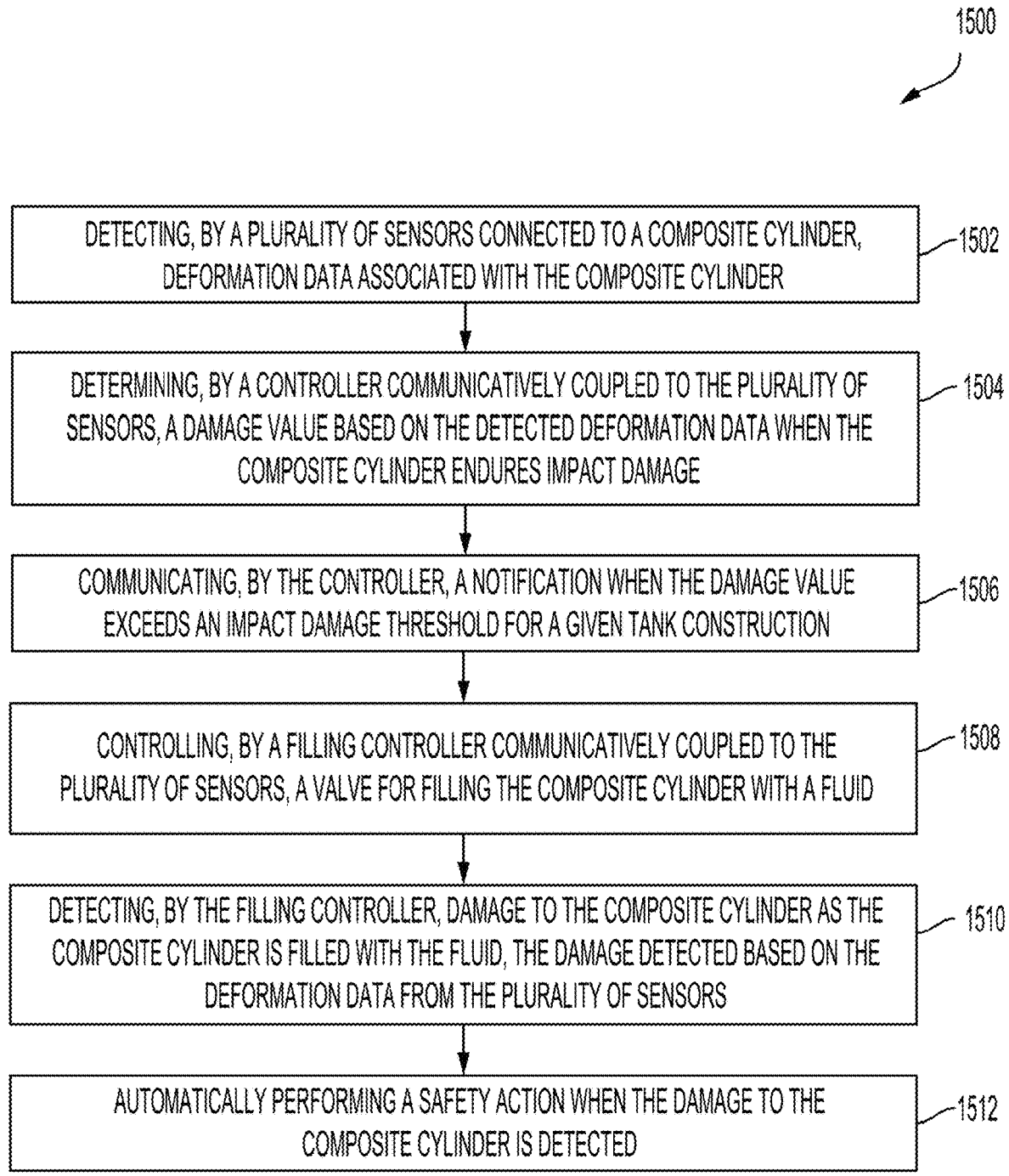
FIGS. 15A and 15B are flow diagrams of processes performed by the system, according to various embodiments of the invention.

FIG. 15A illustrates a flowchart of a process 1500 performed by the systems described herein.

A plurality of sensors (e.g., sensors 202) detect deformation data associated with a composite cylinder (e.g., cylinder 100) (step 1502). The composite cylinder may have a laminate structure having a plurality of layers and the deformation data detected by the plurality of sensors indicates damage to one or more layers of the plurality of layers. The sensors may be piezoelectric sensors located at various locations on the composite cylinder.

A controller (e.g., controller 302) determines a damage value based on the detected deformation data when the composite cylinder endures impact damage (step 1504). The sensors may be coupled to the controller in a wired or wireless manner. The damage value may be determined based on a direct wave energy determination, described in further detail herein with respect to FIG. 15B.

Continuing with the process 1500 of FIG. 15A, the controller communicates a notification when the damage value exceeds an impact damage threshold (step 1506). The impact damage threshold may be predetermined and stored in memory (e.g., memory 1402). The impact damage threshold may be different across various composite cylinder models having respective various, constructions, dimensions, and material compositions.

As described herein, the communicating, by the controller, the notification when the damage value exceeds the impact damage threshold may include communicating the notification to at least one of an ECU of a vehicle (e.g., vehicle 102) for activating a light indicating inspection of the composite cylinder or a non-transitory memory (e.g., memory 1402, 1412, 1422) for updating a stored state of the composite cylinder. Respective transceivers (e.g., transceivers 1404, 1414, 1418) may be used when the controller 302 communicates the notification when the damage value exceeds an impact damage threshold.

The notification alerts a user or operator or technician to inspect the composite cylinder before it is refilled. Any damage to the composite cylinder that is a result of the impact from the object may be detected at this point, and the composite cylinder may be removed and/or repaired if appropriate. However, there may be situations where the composite cylinder may nonetheless be refilled despite having incurred the impact damage from the object or undetected accumulated damage due to an improper operational condition (e.g., a bolt caught between the cylinder and housing).

A filling controller (e.g., filling controller 1002) configured to fill the composite cylinder with a fluid (e.g., gas fuel, liquid fuel) by controlling a valve (e.g., valve 902) (step 1508). During this filling (or re-filling) of the composite cylinder with the fluid, the sensors may be used to monitor the integrity of the composite cylinder.

The filling controller receives the deformation data from the sensors and detects damage to the composite cylinder as it is filled with the fluid based on the deformation data (step 1510). The filling controller may use a modal acoustic emission inspection using the plurality of sensors to detect the damage to the composite cylinder.

Using the modal acoustic emission inspection, the filling controller may determine whether one or more indicators exceed a respective predetermined threshold, and when they do, the filling controller may determine that there is damage to the integrity of the composite cylinder.

The one or more indicators may include a fiber tow fracture indicator corresponding to detected fiber tow fracture events being quantified and compared to a fiber tow fracture threshold, an instability indicator corresponding to instability within a local volume of material above an instability threshold, damage accumulated within a specified local volume of material, a damage mechanism indicator corresponding to damage mechanisms accumulated in the local volume of material above a damage mechanism threshold, and/or a fretting emission indicator corresponding to fretting emission above a fretting emission threshold based on a laminate composition of the composite cylinder.

The fiber tow fracture indicator is determined based on frequency and energy content of the waves detected by the sensors and reflected in the sensor data during the modal acoustic emission inspection. The fiber tow fracture indicator may also be determined based on the determined direct energy that is normalized across the plurality of sensors.

The instability indicator may be a local instability indicator determined based on detected oscillations and background energy detected by the sensors and reflected in the sensor data during the modal acoustic emission inspection.

The delamination event indicator may be determined based on the determined direct energy that is normalized across the plurality of sensors. The delamination event indicator may also be determined based on sharpness of the frequency spectrum of the waves detected by the sensors and reflected in the sensor data during the modal acoustic emission inspection.

The damage mechanism indicator may be associated with damage originating from a localized volume of material. The damage mechanism location (clustering) may be determined based on the threshold-independent arrival time determination of the damage detected by the sensors, and the shortest propagation distance on a curvilinear space of the damage detected by the sensors.

The indicators may be considered individually or in combination. When considered in combination, the indicators may be assigned respective weights. For example, both the fiber tow fracture indicator and the instability indicator may be considered, but the fiber tow fracture indicator may be given less weight than the instability indicator, or vice versa. The consideration of the indicators may change based on the composition of the composite cylinder, the materials used in the composite cylinder, the dimensions of the composite cylinder, and any other aspect of the composite cylinder. In addition, the respective thresholds for the indicators may vary based on the composition of the composite cylinder, the materials used in the composite cylinder, the dimensions of the composite cylinder, and any other aspect of the composite cylinder.

In some embodiments, the filling controller may detect the damage to the composite cylinder during filling when any one of the described indicators exceed their respective thresholds. For example, if the fiber tow fracture indicator and the instability indicator were being considered and either the fiber tow fracture indicator exceeds its threshold or the instability indicator exceeds its threshold, the filling controller detects damage to the composite cylinder during filling.

In some embodiments, the filling controller determines a combined damage indicator based on a number of indicators exceeding their respective thresholds, and when a threshold number (or percentage) of indicators exceed their respective thresholds, the detect the damage to the composite cylinder during filling. For example, the fiber tow fracture indicator, the fretting emission indicator, and the instability indicator may be considered. The threshold number of indicators exceeding their respective thresholds may be two of three. Thus, if at least two of the fiber tow fracture indicator, the fretting emission indicator, or the instability indicator exceed their respective threshold, the filling controller detects damage to the composite cylinder during filling.

In some embodiments, the filling controller determines a combined damage indicator based on a weighted number of indicators exceeding their respective thresholds, and when a threshold percentage of weighted indicators exceed their respective thresholds, the filling controller detects damage to the composite cylinder during filling. For example, the fiber tow fracture indicator, the fretting emission indicator, and the instability indicator may be considered. The fiber tow fracture may be weighted by 5, the fretting emission indicator may be weighted by 1 (indicating the fiber tow fracture is 5 times more important than the fretting emission indicator), and the instability indicator may be weighted by 2. Thus, there are 8 possible total indicator points, if each of the fiber tow fracture indicator, the fretting emission indicator, and the instability indicator exceed their respective thresholds. The threshold percentage of indicators exceeding their respective thresholds may be 65%. Thus, if the fiber tow fracture indicator exceeds its threshold (5 points), the fretting emission indicator exceeds its threshold (1 point), and the instability indicator does not exceed its threshold, the filling controller detects damage to the composite cylinder during filling because the 6 points divided by 8 points is greater than 65%. If the fiber tow fracture indicator was the only indicator to exceed its threshold, then the filling controller would not detect damage to the composite cylinder during filling because 5 points divided by 8 points does not exceed 65%.

The thresholds described herein may each be determined based on testing and calibrated for a particular composite cylinder. Each of the respective thresholds may be stored in non-transitory memory (e.g., memory 1402, 1412, 1422) and may be indexed by an identifier associated with the particular composite cylinder being monitored, so that the filling controller may reference the corresponding thresholds based on the particular composite cylinder being monitored.

Both the controller and the filling controller may execute digital signal processing algorithms for mitigating external noise sources commonly encountered during normal operations (e.g., Electromagnetic Interference (EMI), flow noise, mechanical rubbing) to avoid false triggers. The digital signal processing algorithms may be applied to the deformation data detected by the sensors. The digital signal processing algorithms may determine a false trigger based on at least one of a simultaneity of arrival of waves at the sensors, detected pre-trigger energy, or a ratio of post-triggered to pre-triggered energy.

After the filling controller detects damage to the composite cylinder as the composite cylinder is being filled with fluid, a safety action may be automatically performed (step 1512). The safety action may include the filling controller instructing the valve to be shut to prevent further filling of the composite cylinder. The safety action may include providing a notification on a speaker or a display screen of the detected damage so that an operator can cease filling of the composite cylinder. The safety action may include the filling controller adjusting the valve to direct the fluid to a surge tank.

These automatic processes during filling of the composite cylinder may always be performed, regardless of whether the controller detected impact damage to the composite cylinder. In other embodiments, the automatic processes during filling of the composite cylinder may only be performed when the controller detected impact damage to the composite cylinder.

Figure 15B:
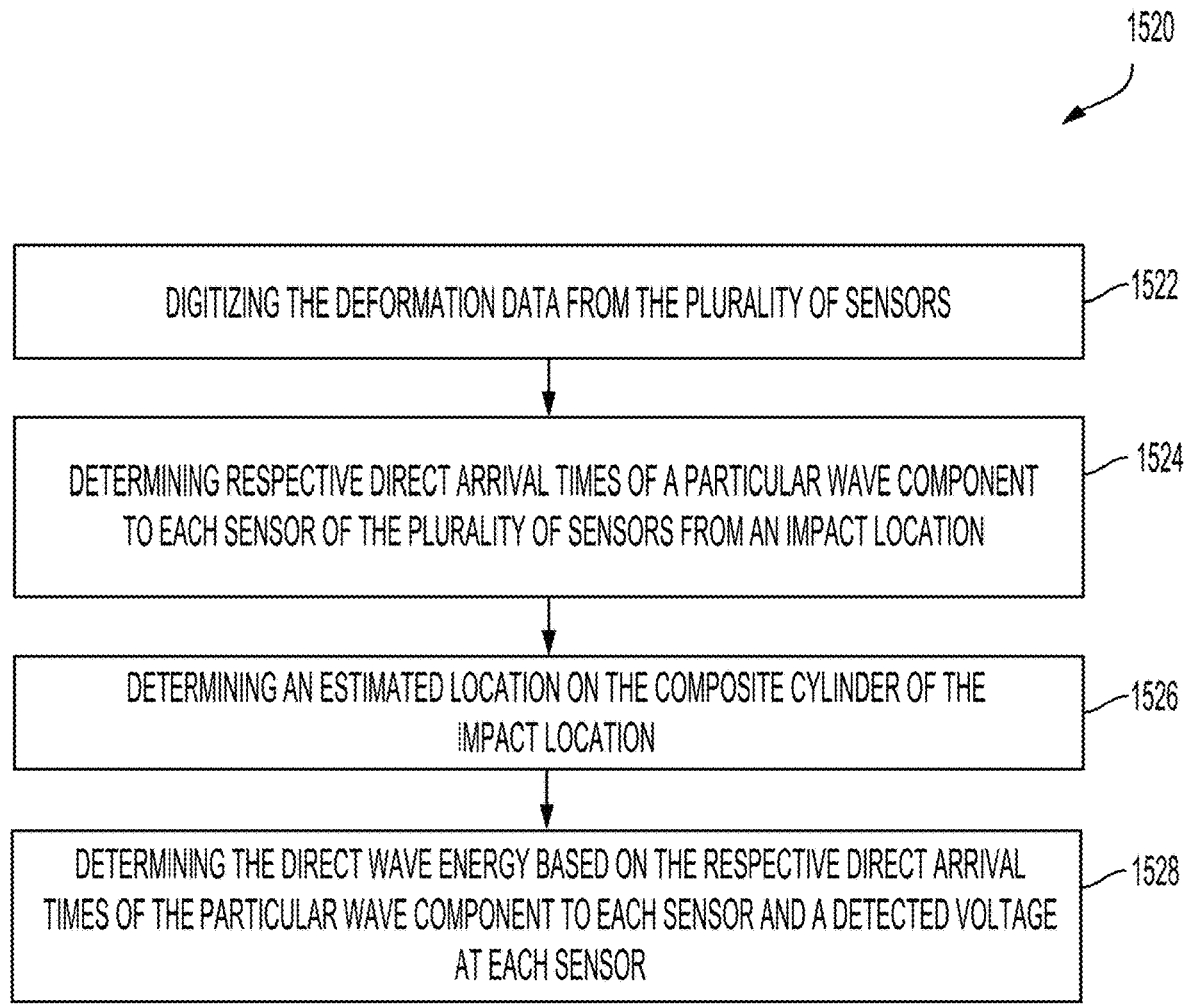

FIG. 15B illustrates a flowchart of a process 1520 of determining the direct wave energy performed by the systems described herein. The process 1520 may be used by the controller during determination of the damage value associated with the impact damage during step 1504 of process 1500 in FIG. 15A.

The controller (e.g., controller 302) receives the deformation data from the sensors (e.g., sensors 202) and digitizes the deformation data (step 1522).

The controller then determines respective direct arrival times of a particular wave component to each sensor of the plurality of sensors from an impact location (step 1524). That is, each sensor of the plurality of sensors detects the deformation data (e.g., the deformation data shown in waves from four sensors are shown in four channels in FIG. 5). A common particular wave component for each wave is identified (e.g., as indicated by the vertical bar in each wave from the four sensors in FIG. 6). The arrival time of the common particular wave is determined for each of the sensors. The arrival time represents the time for the particular wave component to travel from the impact location to the respective sensor.

The controller determines an estimated location on the composite cylinder of the impact location (step 1526). The estimated location may be determined based on the determined arrival times, the velocity of the wave component used for arrival time estimation, the geometry of the particular cylinder being monitored, and the known locations of the sensors on the cylinder. The geometries of various cylinders, dispersion relations (wave mode velocity as a function of frequency), and the known locations of the sensors may be stored in memory (e.g., memory 1402, 1412, 1422) and accessed by the controller. The controller may model the estimated location on the composite cylinder of the impact location (e.g., as shown in FIG. 7).

The controller determines the direct wave energy based on the respective direct arrival times of the particular wave component to each sensor and a detected voltage at each sensor (step 1528). In some embodiments, the controller may use the equation $U_{WAVE} \int_0^{t_{DIRECT}} V^2 dt$, for determining the direct waveform energy ($U_{WAVE}$), where $t_{DIRECT}$ represents the direct arrival time of the lowest velocity wave component of interest at each sensor for the given propagation distance, and V represents voltage detected at each sensor (e.g., piezoelectric sensor).

The systems and methods described herein may use a relatively large number of sensors 202 for reliable coverage and monitoring. Conventional sensors have relatively high costs, which may be a challenge for implementing robust monitoring systems. Thus, there is a need for sensors with a new design with at least equivalent performance (e.g., with respect to sensitivity and bandwidth) at economical costs.

Figure 16A:
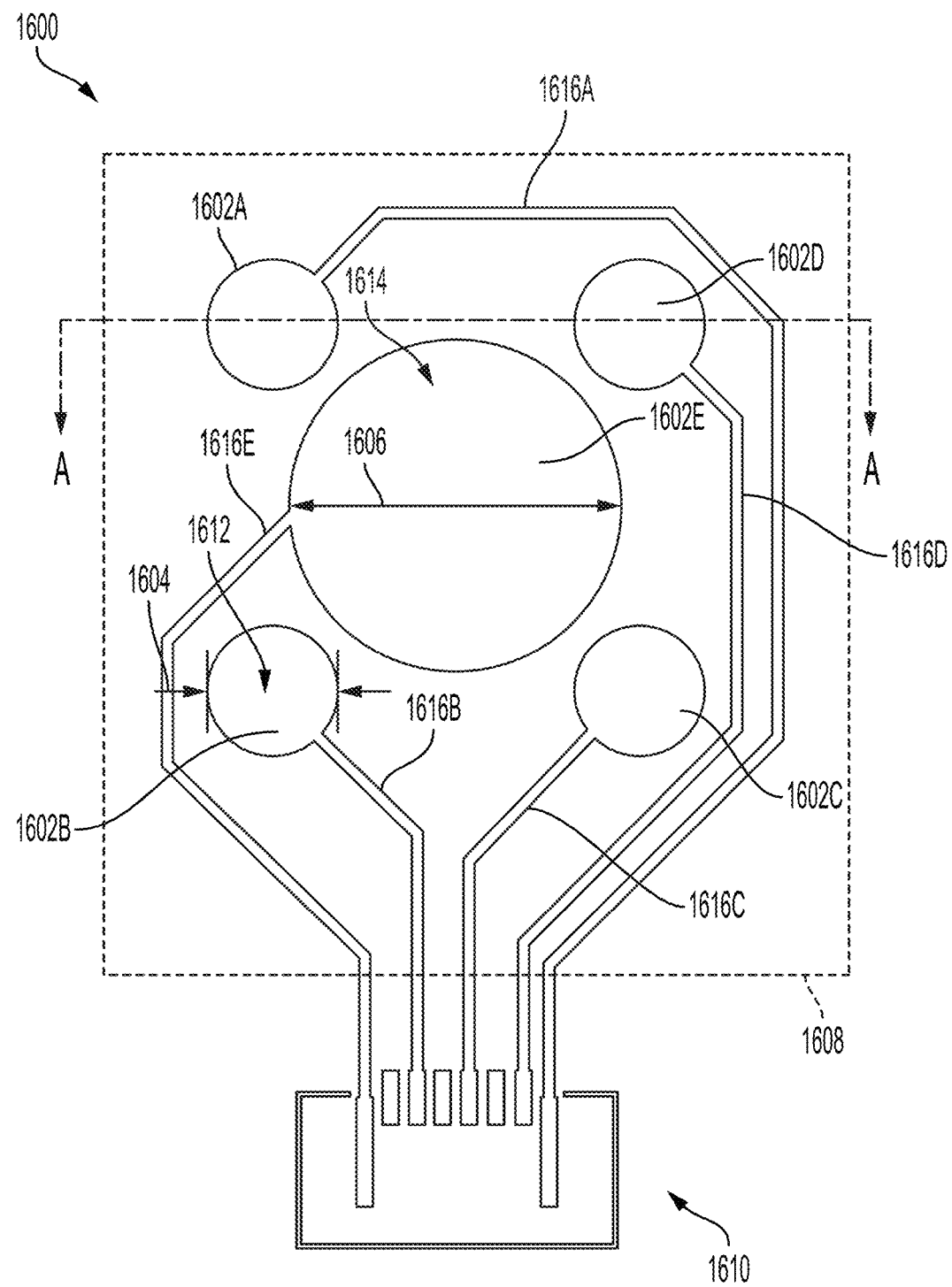
FIG. 16A illustrates a top view of a sensor, according to various embodiments of the invention.

FIG. 16A is a top view of a sensor 1600 configured to be used with the systems and methods described herein, as well as with other systems and methods. The sensor 1600 is a sensor that may be used as the sensor 202, as described herein. Thus, where the sensor 202 is described herein as having a characteristic or a capability, the sensor 1600 may also have the same characteristic or capability. As will be described herein, the sensor 1600 is capable of mass production and has a relatively low cost. The sensor 1600 is also capable of performing sensing for a plurality of different applications. In addition, the sensor 1600 is capable of having its design adapted and altered in a cost-effective manner.

The sensor 1600 is a multi-element piezoelectric sensor configured to detect deformation data of a composite structure, such as composite cylinder 100 or any other composite structure described herein (e.g., wind turbines, fuselage, a leading edge of a wing, or any composite structure where impact damage is deleterious). The sensor 1600 includes a plurality of sensing elements 1602 configured to detect the deformation data. In particular, the sensor 1600 includes a first sensing element 1602A, a second sensing element 1602B, a third sensing element 1602C, a fourth sensing element 1602D, and a fifth sensing element 1602E.

The sensor 1600 includes a plurality of leads 1616 configured to connect the sensing elements 1602 to a connector 1610. In particular, the first sensing element 1602A is coupled to the connector 1610 via a first lead 1616A, the second sensing element 1602B is coupled to the connector 1610 via a second lead 1616B, the third sensing element 1602C is coupled to the connector 1610 via a third lead 1616C, the fourth sensing element 1602D is coupled to the connector 1610 via a fourth lead 1616D, and the fifth sensing element 1602E is coupled to the connector 1610 via a fifth lead 1616D. The sensor 1600 is coupled to other elements of the system (e.g., controller 302, controller 352, filling controller 1002) via the connector 1610. In many embodiments, the sensing elements 1602 are coupled to a pre-amplifier circuit configured to amplify the signals detected by the sensing elements 1602, and the pre-amplifier circuit is coupled to the controller (e.g., controller 302, controller 352, filling controller 1002).

As shown in FIG. 16, the sensing elements 1602 are arranged with the first sensing element 1602A, the second sensing element 1602B, the third sensing element 1602C, and the fourth sensing element 1602D having a same sensing area (or aperture or size) 1612 and surrounding the fifth sensing element 1602E, which has a larger sensing area 1614. The first sensing element 1602A, the second sensing element 1602B, the third sensing element 1602C, and the fourth sensing element 1602D may have a same diameter 1604, which results in the same sensing area 1612, and the fifth sensing element 1602E may have a larger diameter 1606, resulting in the larger sensing area 1614.

Larger diameter elements (e.g., sensing element 1602E) possess greater sensitivity (over a specific, lower, frequency range) due to possessing a larger surface area, but the larger diameter elements will not perform as well at higher frequencies due to phase cancellation caused by the so-called aperture effect. Smaller diameter elements (e.g., sensing elements 1602A-1602D) may not be as sensitive as the larger diameter elements (assuming all other elements of construction are identical), but will possess superior high frequency response due to not suffering phase cancellation due to aperture effects.

While the sensing elements 1602 are shown as having a circular shape, in other embodiments, the sensing elements 1602 have other shapes, such as hexagons, pentagons, or decagons, for example. In other embodiments, the elements may be designs with an ellipsoidal geometry and aligned on an anisotropic structure which possesses quasi-ellipsoidal wave modes.

In addition, while the sensing elements 1602 are shown in FIG. 16A in a particular number and arrangement, any number of sensing elements in any configuration or arrangement may be fabricated and used. The number of sensing elements, the size of the sensing area, and the arrangement of sensing elements may all be tailored based on the application of the sensor 1600, the location of the sensor 1600 on the structure to be monitored, and/or the composition of the structure to be monitored.

For example, the systems and methods described herein for monitoring a composite structure (e.g., a composite cylinder 100) include detection of damage to the composite structure due to impact damage or cumulative damage using quantitative impact detection, as well as detection of damage to the composite structure during filling of the composite structure with a fluid, such as compressed natural gas or hydrogen, using MAE inspection. In this example, one or more sensing elements each having a relatively smaller size (e.g., sensing elements 1602A-1602D) may be included in the sensor 1600 and used for detection of damage to the composite structure during filling of the composite structure with the fluid. In addition, one or more sensing elements each having a relatively larger size (e.g., sensing element 1602E) may also be included in the sensor 1600 and used for detecting impact events.

For quantitative impact detection, the event does not excite the sensor at relatively high frequency (i.e., short wavelength), so a large diameter element with high sensitivity is appropriate. By contrast, when performing MAE inspection of a composite structure having a laminate composition, the necessity to detect higher frequencies by the sensing element in order to distinguish between damage mechanisms (e.g., fiber fracture vs. matrix cracking vs. delamination) exists, so a smaller diameter sensing element is appropriate.

By combining the sizes of both elements for both applications into a single sensor 1600, the sensor 1600 is able to support the sensing requirements of the system in a specific and tailored way. This enables a single sensor 1600 to be used in applications where two different sensing techniques or applications are being used. A first size of sensor element may be optimized for a first technique or application and a second size of sensor element may be optimized for a second technique or application. Thus, when the sensor 1600 is coupled to various systems (via connector 1610), the sensor 1600 may provide more flexibility than other sensors that have only one sensor element size. The sensor 1600, with its multiple sensor element sizes, is more efficient, both in terms of computational efficiency and cost efficiency, than using two separate sensors that are two different sizes.

Figure 16B:
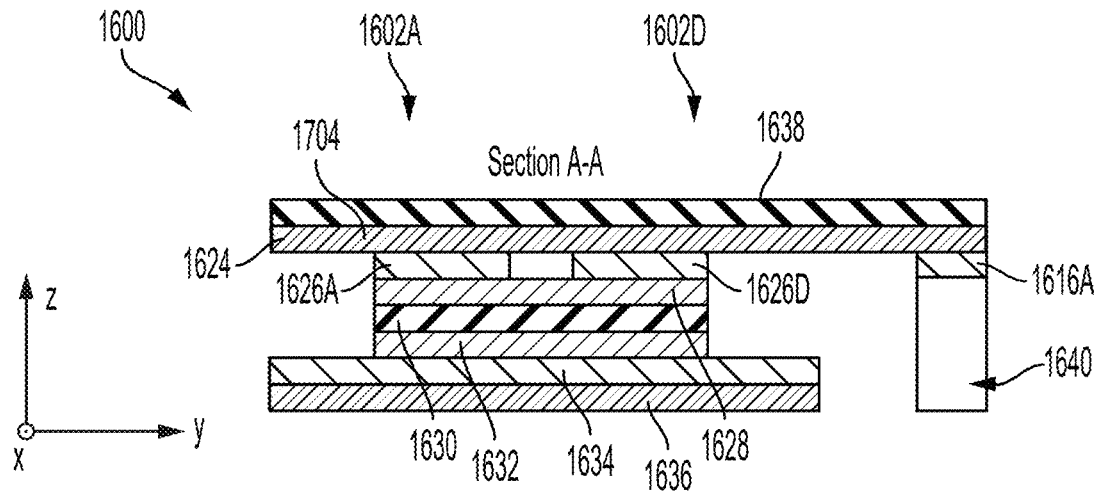
FIG. 16B illustrates a side cross-sectional view of the sensor, according to various embodiments of the invention.

FIG. 16B illustrates a side cross-sectional view along line A-A of FIG. 16A. The side cross-sectional views of first sensing element 1602A and the fourth sensing element 1602D are shown in FIG. 16B, and the features described with respect to the first sensing element 1602A and the fourth sensing element 1602D may be present in all sensing elements 1602.

The sensor 1600 may include a first polyimide film layer 1624 (e.g., Kapton® from DuPont™). The first polyimide film layer 1624 is configured to provide a dielectric layer between the ground electrode and the structure, if the sensor is integrated into the laminate.

The sensor 1600 may also include a positive electrode 1626 for each sensing element 1602. The positive electrode 1626 may be made of a conductive material, such as copper. As shown in FIG. 16B, there is a first positive electrode 1626A corresponding to the first sensing element 1602A and a fourth positive electrode 1626D corresponding to the fourth sensing element 1602D. The top surface of each positive electrode 1626 contacts a bottom surface of the polyimide film layer 1624. The positive electrodes 1626 of each sensing element 1602 may be coplanar with each other when the sensor is flat, as shown in FIG. 16B. Even in situations where the sensor does not lie flat and wraps around a curved surface, the positive electrodes 1626 of each sensing element 1602 are coplanar with each other with respect to a curved plane parallel to the curved surface that the sensor lies on.

The positive electrode 1626 is located above a first tape layer 1628 which couples the positive electrode 1626 with an active sensing element 1630 located below the first tape layer 1628. A top surface of the first tape layer 1628 contacts a bottom surface of the positive electrode 1626 and a bottom surface of the first tape layer 1628 contacts a top surface of the active sensing element 1630.

The first tape layer 1628 may be made of one or more layers of z-axis anisotropic tape that is electrically conductive in only the z-axis. That is, the first tape layer 1628 may not conduct electricity along an x-axis or y-axis. In addition, the top surface of the active sensing element 1603 which contacts the first tape layer 1628 does not have an electrically conductive layer disposed on the top surface, rendering it to not be an equipotential plane. This allows the first positive electrode 1626A and the fourth positive electrode 1626D to both be electrically coupled to the active sensing element 1630, while also allowing the first positive electrode 1626A and the fourth positive electrode 1626D to be electrically isolated from each other. While only the first positive electrode 1626A and the fourth positive electrode 1626D are shown, all of the positive electrodes are electrically coupled to the active sensing element 1630, while also being electrically isolated from each other The active sensing element 1630 may be a piezoelectric material, such as PVDF-TrFE (polyvinyl difluoride-trifluoroethylene), that has an inherently low quality factor, which is suitable for broadband response. The active sensing element 1630 is configured to produce an electric current when placed under mechanical stress. That is, mechanical stress experienced by the active sensing element 1630 (such as when transient stress waves propagate due to a structure being impacted or material from the structure fracturing) results in a voltage across the positive electrode 1626 and the ground electrode 1634, which is detected by the system (via controllers coupled to connector 1610) and used to determine deformation of the structure, as described herein.

The active sensing element 1630 is located above a second tape layer 1632. That is a bottom surface of the active sensing element 1630 contacts a top surface of the second tape layer 1632. In some embodiments, the second tape layer 1632 is made of one or more layers of z-axis anisotropic tape that is electrically conductive in only the z-axis, similar to the first tape layer 1628. In other embodiments, the second tape layer 1632 is conductive in all directions. In comparison with the top surface of the active sensing element 1630, the bottom surface of the active sensing element 1630 contacting the second tape layer 1632 may have an electrically conductive layer deposited on it, making it an equipotential plane.

As can be seen in FIG. 16B, the width (e.g., horizontal width, along y-axis) of the first tape layer 1628, the active sensing element 1630, and the second tape layer 1632 may be larger than the width of each positive electrode (e.g., first positive electrode 1626A and fourth positive electrode 1626D). Thus, the size and shape of the first tape layer 1628, the active sensing element 1630, and the second tape layer 1632 may not correspond to the size and shape of the positive electrodes 1602. This is possible due to the nature of the first tape layer 1628 being conductive in only the z-axis. Because the first tape layer 1628, the active sensing element 1630, and the second tape layer 1632 do not need to be fabricated to correspond to the size and shape of the positive electrodes 1602 and can span some or all of the positive electrodes 1602, the fabricating complexity of the sensor 1600 may be reduced, compared to a sensor where the first tape layer 1628, the active sensing element 1630, and the second tape layer 1632 each correspond to the positive electrodes. The wide, multi-element spanning of the first tape layer 1628, the active sensing element 1630, and the second tape layer 1632 may be seen in the outline 1608 in FIG. 16A. FIG. 16A also shows the circular shapes of the positive electrodes 1626.

Referring again to FIG. 16B, the second tape layer 1632 is located above a ground electrode 1634. The ground electrode 1634 may be made of a conductive material, such as copper. The top surface of the ground electrode 1634 may contact a bottom surface of the second tape layer 1632.

The ground electrode 1634 is located above a second polyimide film layer 1636 (e.g., Kapton® from DuPont™). The second polyimide film layer 1636 serves the dual purpose of providing a dielectric layer between the ground electrode and the structure (if integrated into the laminate), as well as a compliant substrate that is well-suited for bonding to a structure subject to a complex stress state (e.g., bi-axial tension).

In some embodiments, a copper layer 1638 may be placed over the top of the sensor 1600 to provide for electromagnetic interference (EMI) shielding to protect the sensor 1600 from electromagnetic interference from one or more other devices.

FIG. 16B also shows the cross-sectional view of lead 1616A. Leads 1616 may be made of a conductive material, such as copper. While FIG. 16B shows the first polyimide layer 1624 and the copper layer 1638 as being covering the leads 1616, in some embodiments, the first polyimide layer 1624 and the copper layer 1638 do not extend laterally to cover the leads 1616. In some embodiments, the area 1640 beneath the leads only includes a dielectric material to insulate the leads 1616 from the objects below. In some embodiments, some of the components, including the active sensing element 1630, extend laterally to be located underneath the leads 1616, but in these embodiments, a non-conductive layer is located between the active sensing element 1630 and the leads 1616 to isolate the leads from the active sensing element 1630.

The ground electrode layer 1634, the positive electrodes 1626, and the leads 1616 may be fabricated on durable, flexible printed circuit boards using flexible substrates so that the ground electrode layer 1634, the positive electrodes 1626, and the leads 1616 are all flexible. In addition, the active sensing element 1630 may also be flexible. The first tape layer 1628, the second tape layer 1632, the first polyimide film layer 1624, and the second polyimide film layer 1636 may also be flexible. The flexibility of the components of the sensor 1600 allow the sensor 1600 to be flexible and conformable to the surface on which it is placed, providing improved adhesion and acoustic coupling to curved and or rough surfaces, compared to rigid sensors.

The ground electrode layer 1634, the positive electrodes 1626, and the leads 1616 may be fabricated onto the flexible substrate in any manner, including a thermal transfer-resist-develop method, or using CNC electrode deposition, for example. These techniques may promote efficient manufacturing costs and high-volume production.

Figure 16C:
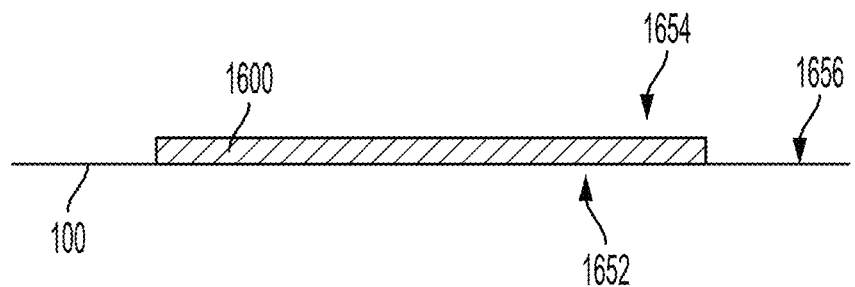
FIG. 16C illustrates a side view of the sensor on a flat surface, according to various embodiments of the invention.

FIG. 16C shows a side-cross sectional view of the sensor 1600 disposed on the outer surface 1656 of cylinder 100. The sensor 1600 has an outer surface 1654 and an inner surface 1652. The inner surface 1652 of the sensor 1600 contacts the outer surface 1656 of the cylinder 100. The sensor 1600 may be attached to the outer surface of the cylinder 100 using any methods, such as using an adhesive.

Figure 16D:
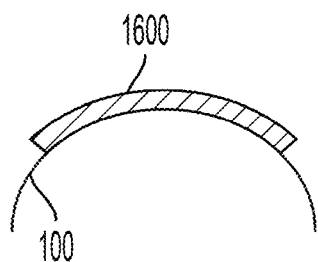
FIG. 16D illustrates a side view of the sensor on a curved surface, according to various embodiments of the invention.

FIG. 16D shows a side-cross sectional view of the sensor 1600 conforming to a curved surface of the cylinder 100. The sensor 1600 may be attached to the cylinder 100 using an adhesive or any other method. In some embodiments, the sensor 1600 may be integrally manufactured into the cylinder 100. For example, the sensor 1600 may be fabricated directly onto the cylinder 100 or may be located between layers of the cylinder 100, where the cylinder 100 is comprised of multiple layers.

In some embodiments, during manufacturing of the cylinder 100, the outer surface 1656 (or a portion of the outer surface 1656 where the sensor 1600 will be attached) may be smoothed to facilitate adhesion of the sensor 1600 to the cylinder 100. For example, during the fabrication of the cylinder, caul plates having curvature corresponding to the outer diameter of the cylinder 100 may be used. A mold release agent may be applied to the caul plates, and the mold-released caul plates are placed on the uncured cylinder 100 in the sensor attachment locations of the cylinder 100. The cylinder 100 is cured and the caul plates are removed post cure, leaving a smooth surface for sensor adhesion that will improve bond line performance (i.e., bond line cycle life) and acoustic coupling (better response) of the sensor 1600.

While FIGS. 16C and 16D show the sensor 1600 as being attached to a cylinder 100, the sensor 1600 may be coupled to any structure for monitoring, such as wind turbines, fuselage, a leading edge of a wing, or any composite structure where impact damage is deleterious or the structure is highly stressed.

Figure 17:
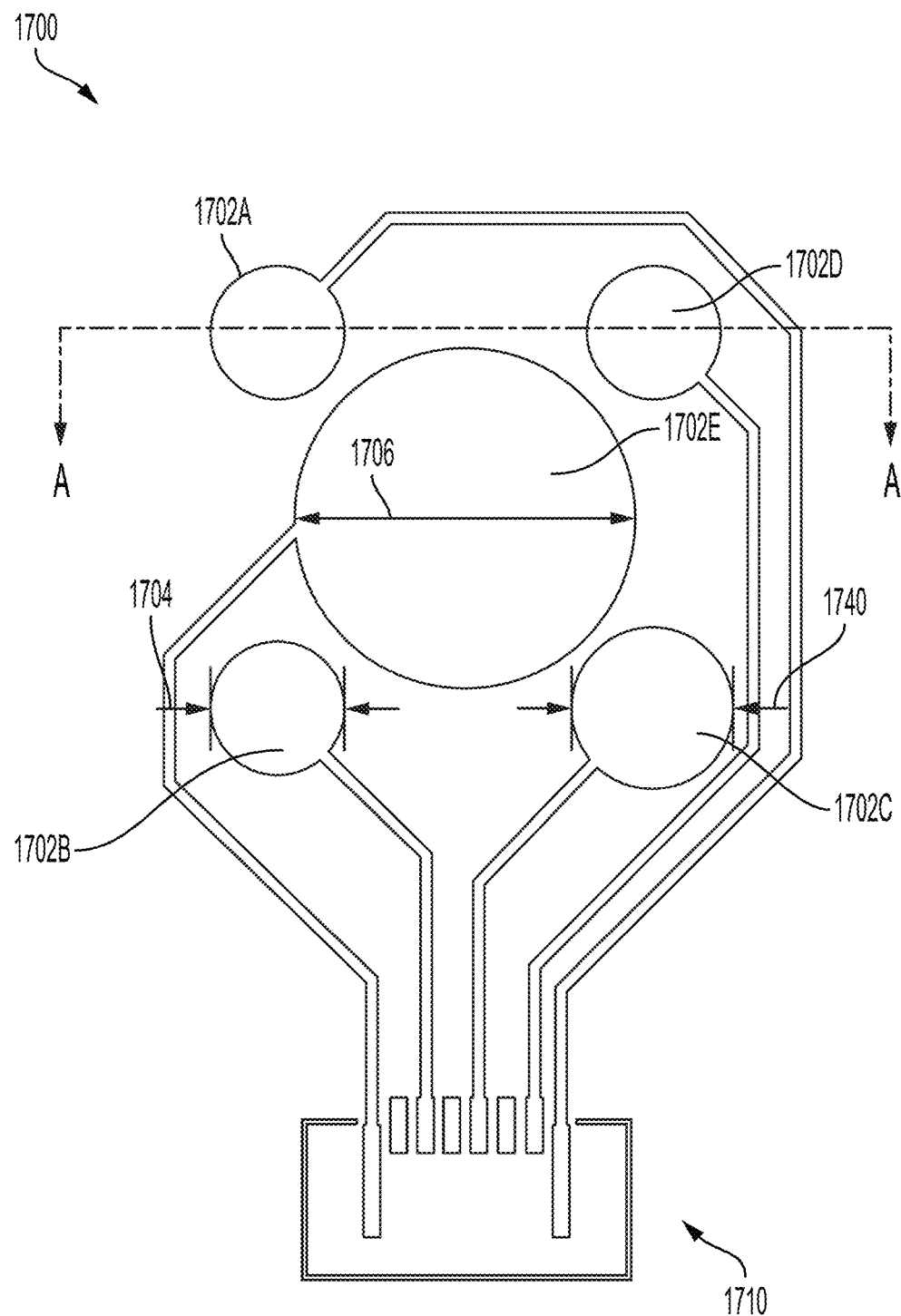
FIG. 17 illustrates a top view of a sensor having three different sizes of sensor elements, according to various embodiments of the invention.

FIG. 17 illustrates a sensor 1700 similar to sensor 1600 and sensor 202, with the difference being sensor 1700 having three different sensor element sizes. The sensor 1700 is numbered similarly with sensor 1600, and includes similar features as sensor 1600 unless noted otherwise. In particular, the cross-sectional structure shown in FIG. 16B is the same for the sensor 1700 along line A-A.

Sensor 1700 has a plurality of sensing elements 1702. That is, the sensor 1700 has a first sensing element 1702A, a second sensing element 1702B, a third sensing element 1702C, a fourth sensing element 1702D, and a fifth sensing element 1702E. The first sensing element 1702A, the second sensing element 1702B, and the fourth sensing element 1702D each have the same diameter 1704, and accordingly a same sensing area (or aperture or size).

Similar to sensor 1600, the fifth sensing element 1702E is larger than the first sensing element 1702A, the second sensing element 1702B, and the fourth sensing element 1702D. The fifth sensing element 1702E has a diameter 1706 that is larger than the diameter 1704, and accordingly, the fifth sensing element 1702E has a larger sensing area than the first sensing element 1702A, the second sensing element 1702B, and the fourth sensing element 1702D.

Unlike sensor 1600, the third sensing element 1702C is larger than the first sensing element 1702A, the second sensing element 1702B, and the fourth sensing element 1702D, but smaller than the fifth sensing element 1702E. The third sensing element 1702D has a diameter 1740 that is larger than the diameter 1704, but smaller than the diameter 1706. Accordingly, the third sensing element 1702D has a larger sensing area than the first sensing element 1702A, the second sensing element 1702B, and the fourth sensing element 1702D, but a smaller sensing area than the fifth sensing element 1702E.

While sensor 1600 has two sensor element sizes, the sensor 1700 has three sensor element sizes. This enables the sensor 1700 to be used in applications where three different sensing techniques or applications are being used. A first size of sensor element may be optimized for a first technique or application, a second size of sensor element may be optimized for a second technique or application, and a third size of sensor element may be optimized for a third technique or application. Thus, when the sensor 1700 is coupled to various systems (via connector 1710), the sensor 1700 may provide more flexibility than other sensors that have fewer than three different sensor element sizes. The sensor 1700 with its multiple sensor element sizes is more efficient, both in terms of computational efficiency and cost efficiency, than using multiple separate sensors that are different sizes.

Figure 18:
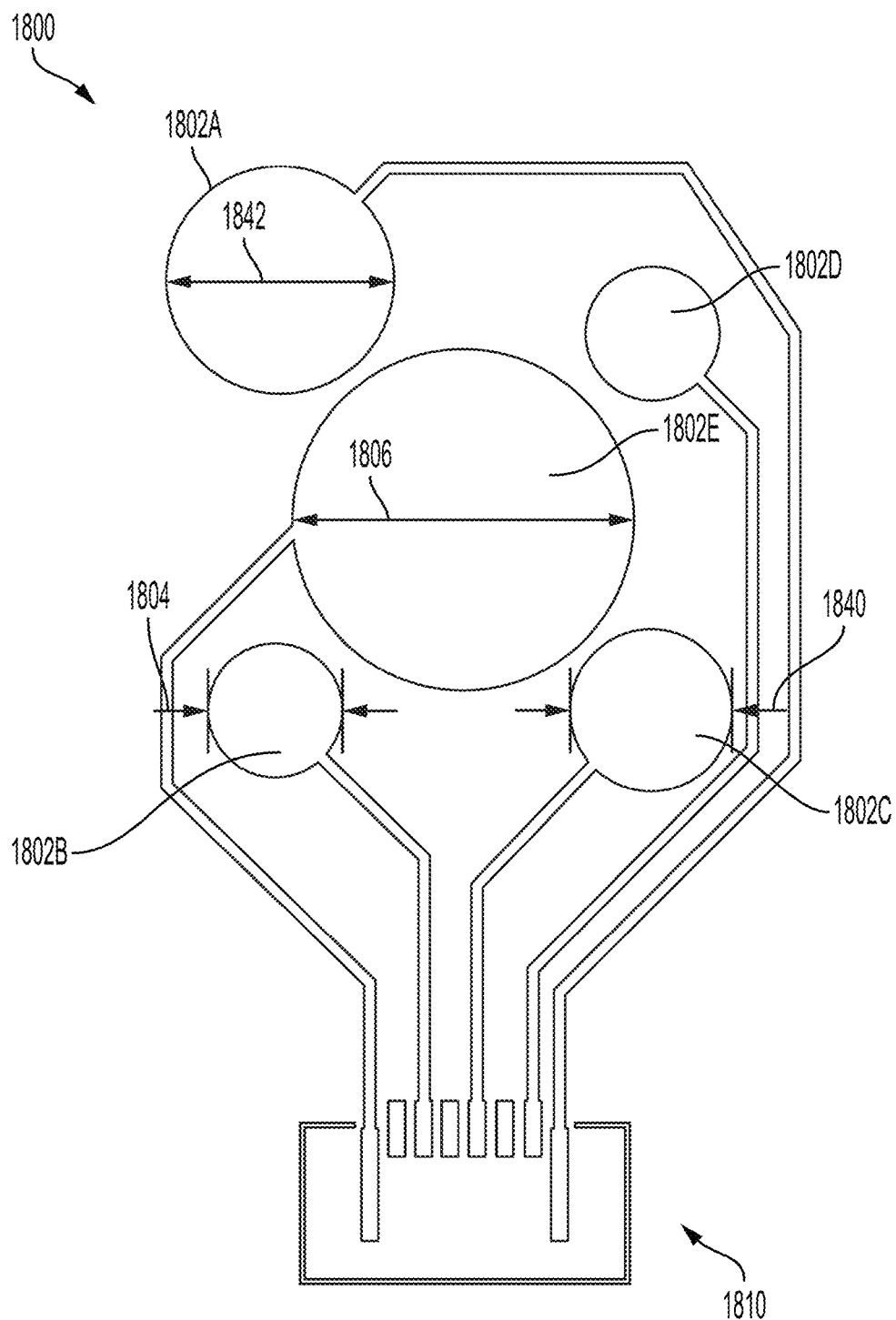
FIG. 18 illustrates a top view of a sensor having four different sizes of sensor elements, according to various embodiments of the invention.

FIG. 18 illustrates a sensor 1800 similar to sensor 1600, sensor 1700, and sensor 202, with the difference being sensor 1800 having four different sensor element sizes. The sensor 1800 is numbered similarly with sensor 1600 and 1700, and includes similar features as sensor 1600 and 1700 unless noted otherwise. In particular, the cross-sectional structure shown in FIG. 16B is used by the sensor 1800. If the line A-A of FIG. 16A were present in FIG. 18, the side cross-sectional structure would be similar to that shown in FIG. 16B, with the difference being the horizontal width of the first positive electrode being wider in sensor 1800 than in sensor 1600, as described further below.

Sensor 1800 has a plurality of sensing elements 1802. That is, the sensor 1800 has a first sensing element 1802A, a second sensing element 1802B, a third sensing element 1802C, a fourth sensing element 1802D, and a fifth sensing element 1802E. The second sensing element 1802B and the fourth sensing element 1802D each have the same diameter 1804, and accordingly a same sensing area (or aperture or size).

Similar to sensor 1600 and 1700, the fifth sensing element 1802E is larger than the second sensing element 1802B and the fourth sensing element 1802D. The fifth sensing element 1802E has a diameter 1806 that is larger than the diameter 1804, and accordingly, the fifth sensing element 1802E has a larger sensing area than the second sensing element 1802B and the fourth sensing element 1802D.

Unlike sensor 1600 (but similar to sensor 1700), the third sensing element 1802C is larger than the second sensing element 1802B and the fourth sensing element 1802D, but smaller than the fifth sensing element 1802E. The third sensing element 1802D has a diameter 1840 that is larger than the diameter 1804, but smaller than the diameter 1806. Accordingly, the third sensing element 1802D has a larger sensing area than the second sensing element 1802B and the fourth sensing element 1802D, but a smaller sensing area than the fifth sensing element 1802E.

Unlike sensor 1600 and 1700, the first sensing element 1802A is larger than the second sensing element 1802B, the third sensing element 1802C, and the fourth sensing element 1802D, but smaller than the fifth sensing element 1802E. The first sensing element 1802A has a diameter 1842 that is larger than the diameter 1804 and 1840, but smaller than the diameter 1806. Accordingly, the first sensing element 1802A has a larger sensing area than the second sensing element 1802B, the third sensing element 1802C, and the fourth sensing element 1802D, but a smaller sensing area than the fifth sensing element 1802E.

While sensor 1700 has three sensor element sizes, the sensor 1800 has four sensor element sizes. This enables the sensor 1800 to be used in applications where four different sensing techniques or applications are being used. A first size of sensor element may be optimized for a first technique or application, a second size of sensor element may be optimized for a second technique or application, a third size of sensor element may be optimized for a third technique or application, and a fourth size of sensor element may be optimized for a fourth technique or application. Thus, when the sensor 1800 is coupled to various systems (via connector 1810), the sensor 1800 may provide more flexibility than other sensors that have fewer than four different sensor element sizes. The sensor 1800 with its multiple sensor element sizes is more efficient, both in terms of computational efficiency and cost efficiency, than using multiple separate sensors that are different sizes.

Figure 19:
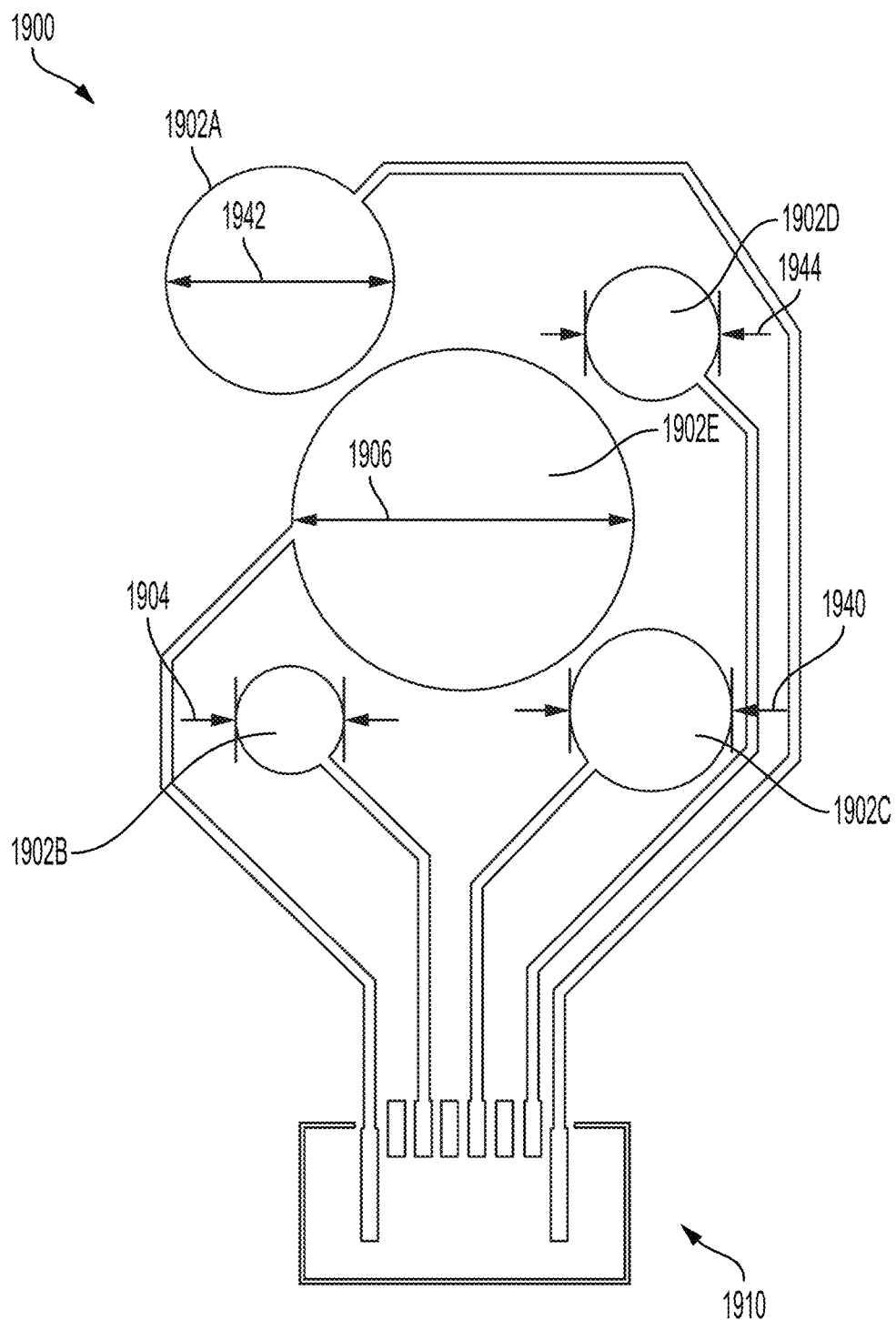
FIG. 19 illustrates a top view of a sensor having five different sizes of sensor elements, according to various embodiments of the invention.

FIG. 19 illustrates a sensor 1900 similar to sensor 1600, sensor 1700, sensor 1800, and sensor 202, with the difference being sensor 1900 having five different sensor element sizes. The sensor 1900 is numbered similarly with sensor 1600, 1700, and 1800, and includes similar features as sensor 1600, 1700, and 1800 unless noted otherwise. In particular, the cross-sectional structure shown in FIG. 16B is used by the sensor 1900.

Sensor 1900 has a plurality of sensing elements 1902. That is, the sensor 1900 has a first sensing element 1902A, a second sensing element 1902B, a third sensing element 1902C, a fourth sensing element 1902D, and a fifth sensing element 1902E. The second sensing element 1902B has a diameter 1904 corresponding to a sensing area (or aperture or size).

Unlike sensor 1600, 1700, and 1800, the fourth sensing element 1902D is larger than the second sensing element 1902B. The fourth sensing element 1902D has a diameter 1944 that is larger than the diameter 1904. Accordingly, the fourth sensing element 1902D has a larger sensing area than the second sensing element 1902B.

Unlike sensor 1600 (but similar to sensor 1700 and 1800), the third sensing element 1902C is larger than the second sensing element 1902B and the fourth sensing element 1902D, but smaller than the fifth sensing element 1902E. The third sensing element 1902D has a diameter 1940 that is larger than the diameter 1904 and diameter 1944, but smaller than the diameter 1906. Accordingly, the third sensing element 1902D has a larger sensing area than the second sensing element 1902B and the fourth sensing element 1902D, but a smaller sensing area than the fifth sensing element 1902E.

Unlike sensor 1600 and 1700 (but similar to sensor 1800), the first sensing element 1902A is larger than the second sensing element 1902B, the third sensing element 1902C, and the fourth sensing element 1902D, but smaller than the fifth sensing element 1902E. The first sensing element 1902A has a diameter 1942 that is larger than the diameters 1904, 1940, and 1944 but smaller than the diameter 1906. Accordingly, the first sensing element 1902A has a larger sensing area than the second sensing element 1902B, the third sensing element 1902C, and the fourth sensing element 1902D, but a smaller sensing area than the fifth sensing element 1902E.

Similar to sensor 1600, 1700, and 1800, the fifth sensing element 1902E is larger than all other sensor elements. The fifth sensing element 1902E has a diameter 1906 that is larger than the diameters 1904, 1940, 1942, and 1944, and accordingly, the fifth sensing element 1902E has a larger sensing area than the other sensing elements.

While sensor 1800 has four sensor element sizes, the sensor 1900 has five sensor element sizes. This enables the sensor 1900 to be used in applications where five different sensing techniques or applications are being used. A first size of sensor element may be optimized for a first technique or application, a second size of sensor element may be optimized for a second technique or application, a third size of sensor element may be optimized for a third technique or application, a fourth size of sensor element may be optimized for a fourth technique or application, and a fifth size of sensor element may be optimized for a fifth technique or application. Thus, when the sensor 1900 is coupled to various systems (via connector 1910), the sensor 1900 may provide more flexibility than other sensors that have fewer than five different sensor element sizes. The sensor 1900 with its multiple sensor element sizes is more efficient, both in terms of computational efficiency and cost efficiency, than using multiple separate sensors that are different sizes.

While FIGS. 16A, 17, 18, and 19 show sensors having sensor elements with various numbers of different sizes, any number of sensor elements may be included in the sensors described herein, and any number of different sizes may be used in those sensors. Using two, three, four, or five different sensor elements and/or sensor element sizes is illustrative and non-limiting.

As described herein, the sensor (e.g., sensor 1600, 1700, 1800, 1900) may be considered passive sensors in that one or more of the sensors do not actively emit a wave to be detected by one or more other sensors. Instead, the sensors are used to determine when, where on the composite structure, and to what severity an impact event occurred, as well as passively monitoring the composite structure as the composite structure is stressed from an external source.

To demonstrate the performance of the various aspects of the sensors described herein, which may be referred to as an omni-purpose multi element grated array (OMEGA) sensor, data collected from exemplary OMEGA sensors similar to sensor 1600 are presented, and the features of the respective embodiments described.

Figure 20:
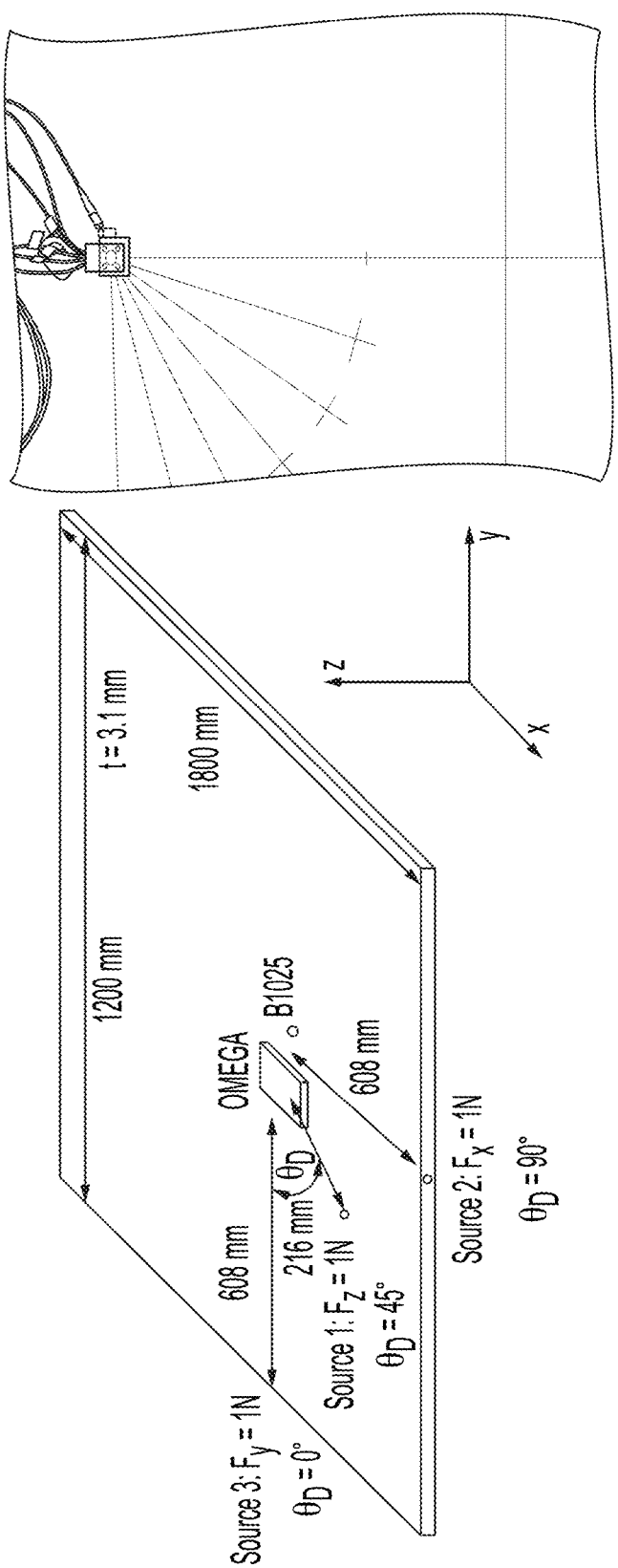
FIG. 20 illustrates a schematic of an experimental set-up used with the sensor, according to various embodiments of the invention.

To quantify the sensitivity of the OMEGA sensors relative to traditional broadband piezoelectric sensors, both an OMEGA sensor as shown in FIGS. 16A and 16B and a traditional, single-element B1025 sensor were bonded to a 3.1 mm thick 7075 Aluminum plate having lateral dimensions of 1200 mm×1800 mm. FIG. 20 (left) provides a schematic of the experimental set-up used with pertinent dimensions, while FIG. 20 (right) provides a view of the actual experimental set-up.

Figure 21A:
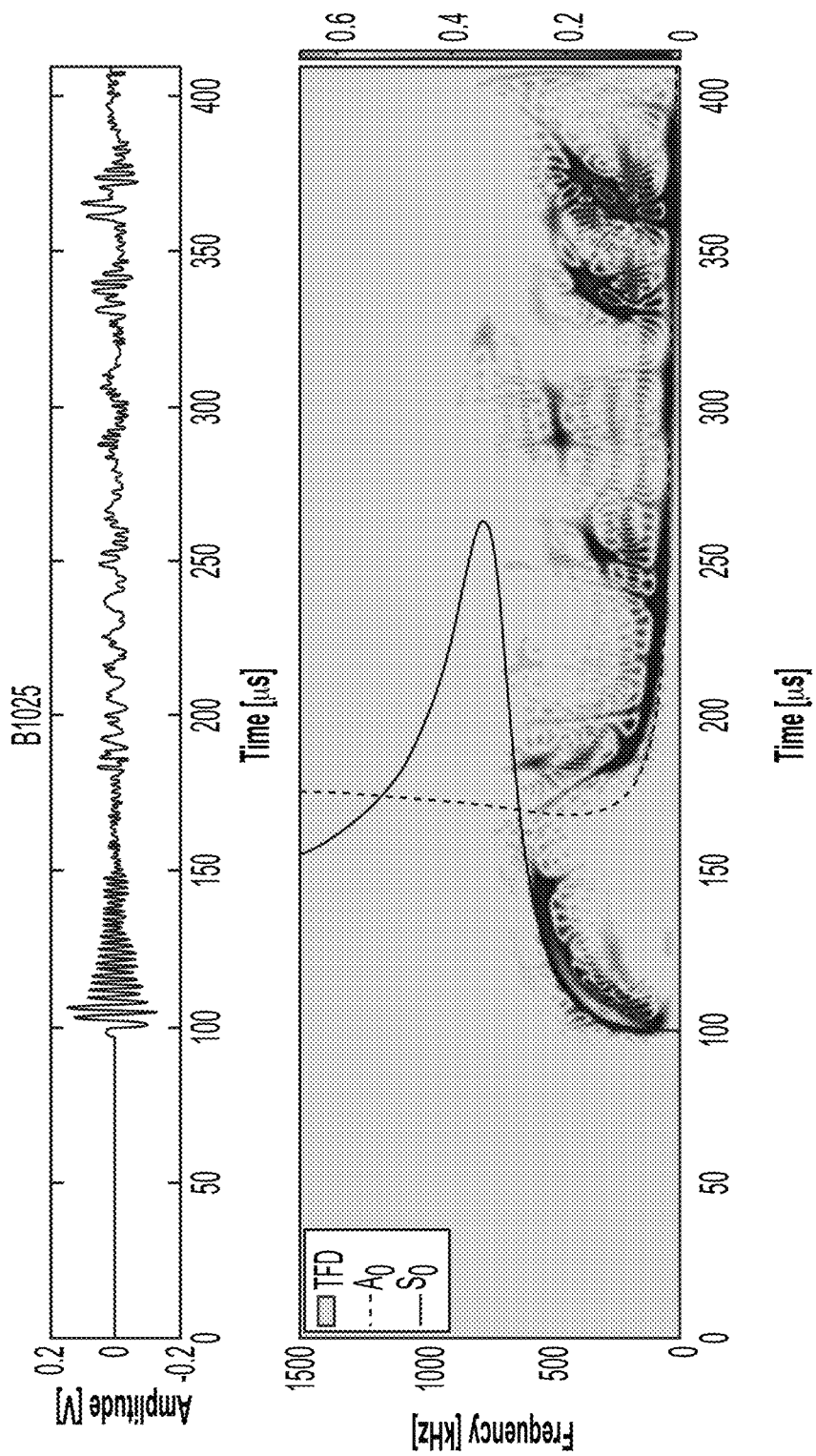
FIGS. 21A-21B illustrate detected experimental data, according to various embodiments of the invention.
Figure 21B:
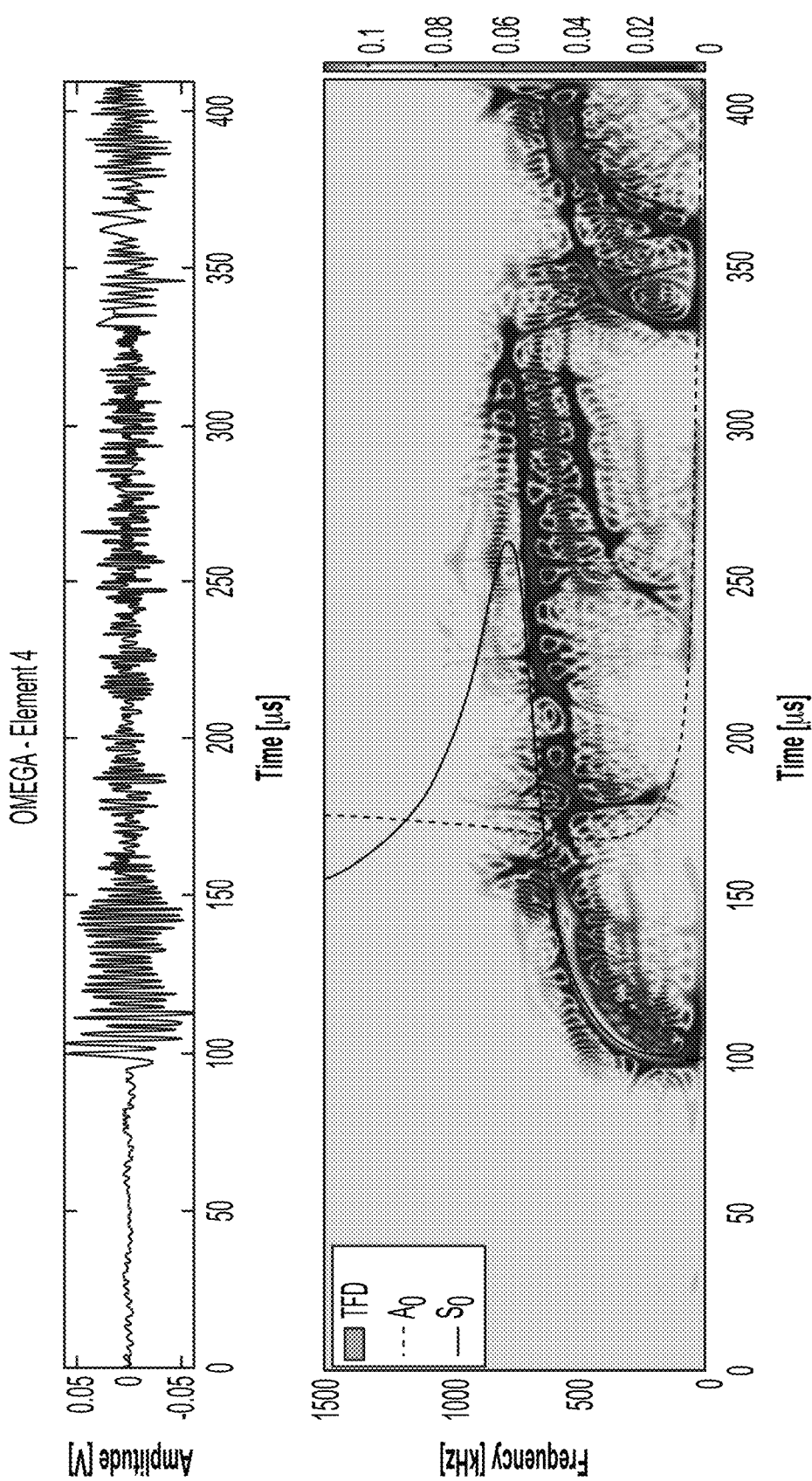

Temporal waveforms and time-frequency distributions from a 0.5 mm 6H pencil lead break fracture source at Source 2 are presented in FIG. 21A for the B1025 transducer and FIG. 21B for element 1 (e.g., first element 1602A) of the OMEGA sensor. Several key takeaways may be observed from FIGS. 21A and 21B. First, the OMEGA sensor exhibited more dominant in-plane deformation ($S_0$ mode) sensitivity than the B1025 sensor, while not exhibiting as much out-of-plane ($A_0$ mode) sensitivity. Second, the peak response of element 1 (e.g., first element 1602A) of the OMEGA sensor was within 10 dB of the B1025 sensor.

Figure 22:
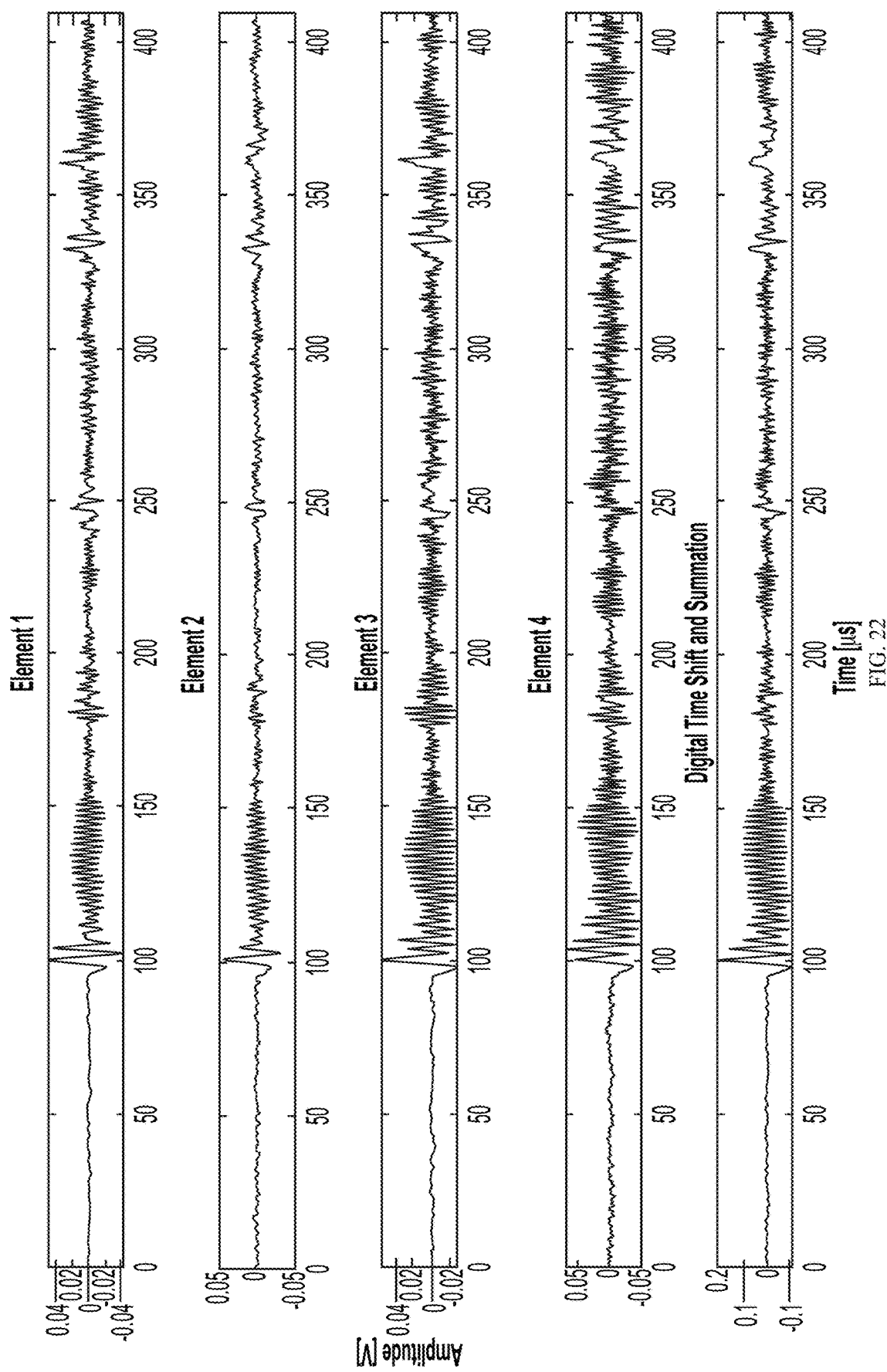
FIG. 22 illustrates detected data time-shifted into coherence and summation of the time-coherent signals, according to various embodiments of the invention.

If sensitivity response that is improved over a traditional single element piezoceramic transducer is desired, signal time coherence shifting and combination methods may be leveraged for the OMEGA sensor. As an example, the data from all 5 mm diameter elements of FIGS. 21A and 21B were time-shifted into coherence with the time basis of element 1 and the resulting time coherent signals were summed, as shown in FIG. 22.

Figure 23A:
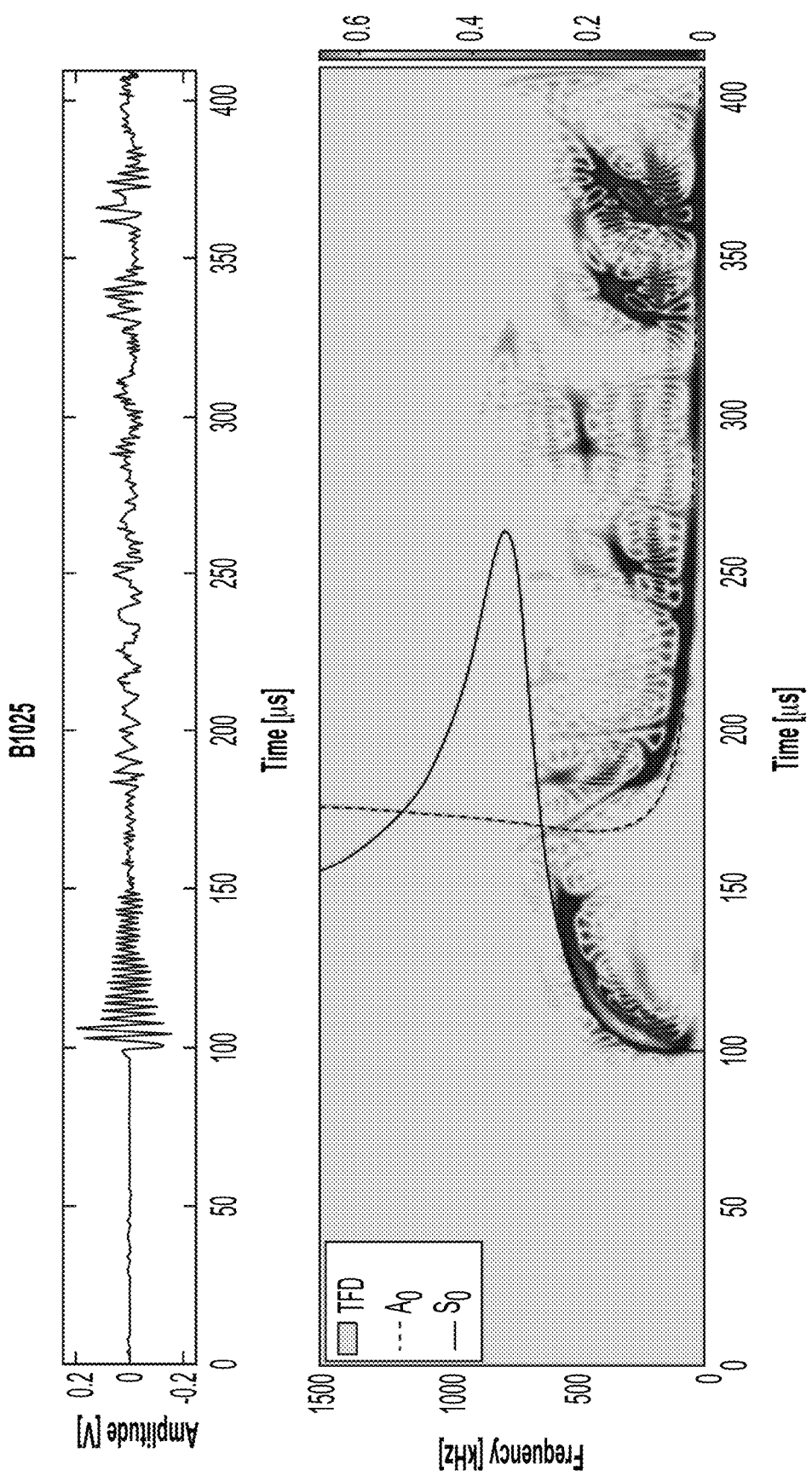
FIGS. 23A and 23B illustrate detected experimental data, according to various embodiments of the invention.
Figure 23B:
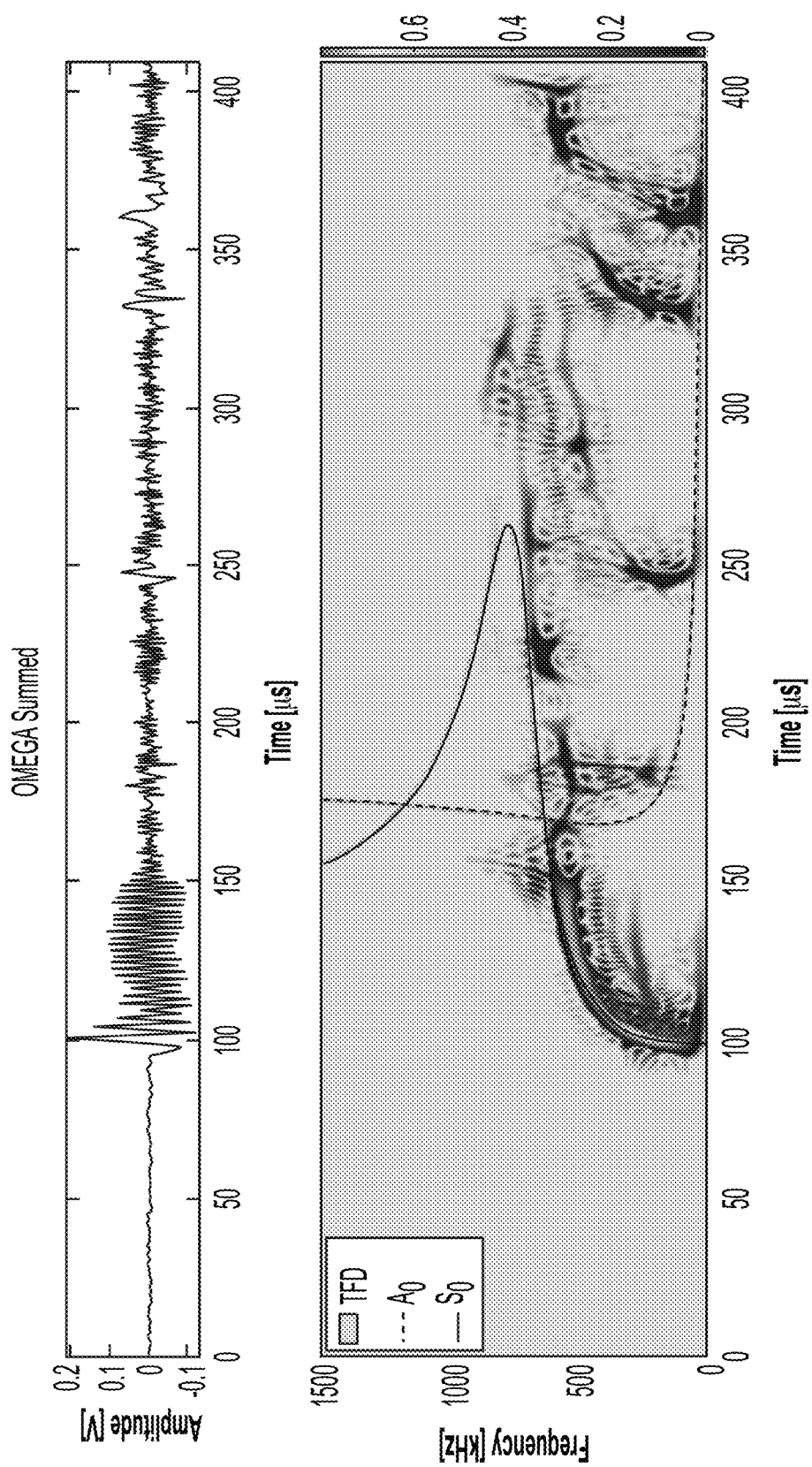

Temporal waveforms and time-frequency distributions from a 0.5 mm 6H pencil lead break fracture source at Source 2 are presented in FIG. 23A for the B1025 transducer and FIG. 23B for the time shifted into coherence, summed signals of the OMEGA sensor.

Figure 24:
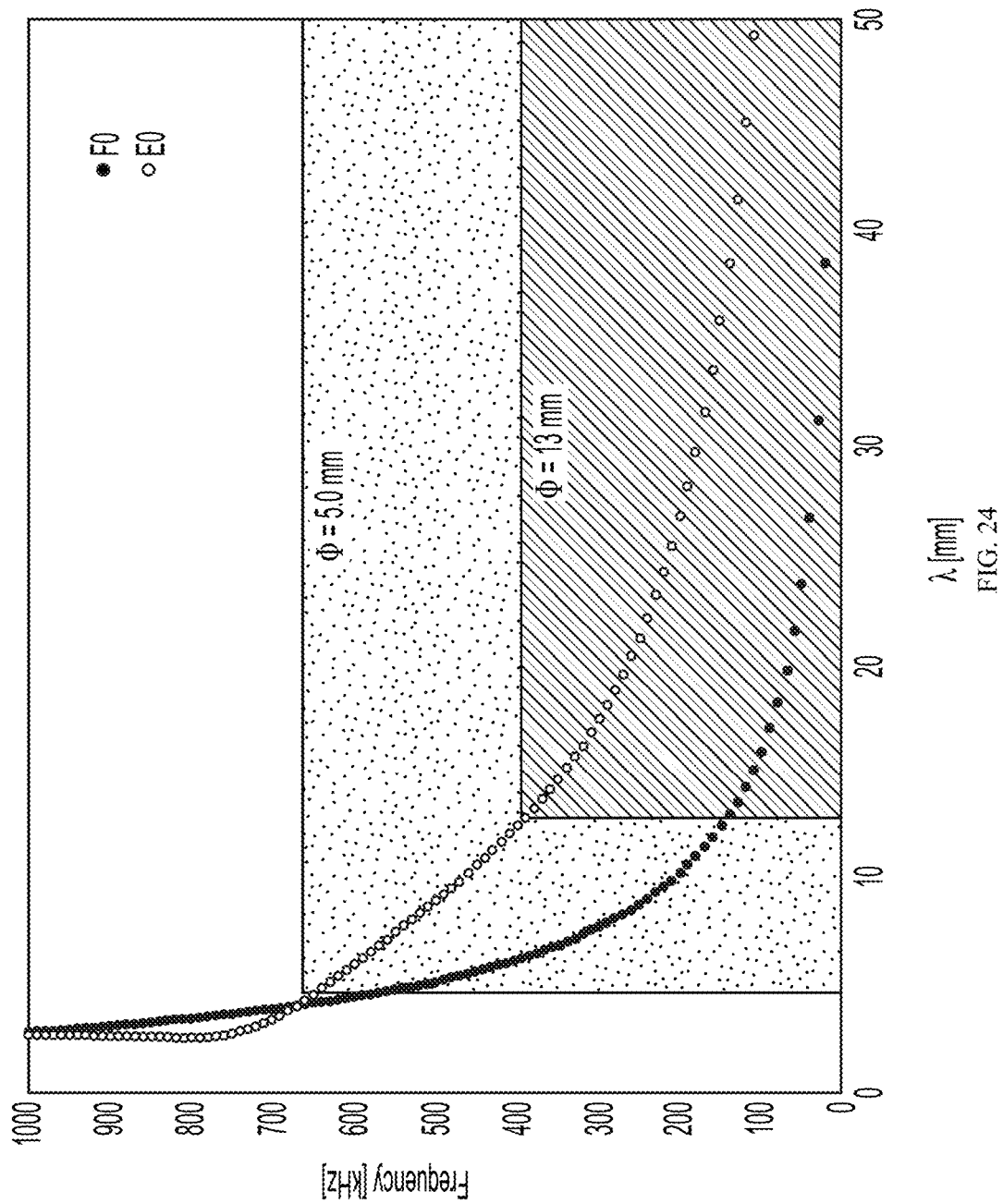
FIG. 24 provides frequency-wavelength dispersion relations, according to various embodiments of the invention.

The diameter of the sensing element of a sensor is known to have great influence over the sensitivity of said sensor due to the so-called aperture effect. Effectively, when the wavelength of the propagating waves is equal to the diameter of the active sensing element (or integer multiples thereof) half of the piezoelectric element is put in tension while the other half of the element is put in compression, resulting in a net zero response of the sensor for that wavelength (frequency). As the thickness of the part in many engineering structures is much thinner than the wavelengths which propagate, guided waves (which are governed by dispersion relations) are the types of waves which propagate. FIG. 24 provides the frequency-wavelength ($\lambda$) dispersion relations for a 3.1 mm thick 7075 Al plate, with shaded regions for different aperture diameters ($\varphi$) corresponding to frequencies (wavelengths) not subject to aperture distortion. From FIG. 24, it is seen that the frequencies at which aperture effects occur are mode dependent. It is observed that larger diameter apertures will exhibit reduced sensitivity at higher frequencies for all modes considered.

Figure 25:
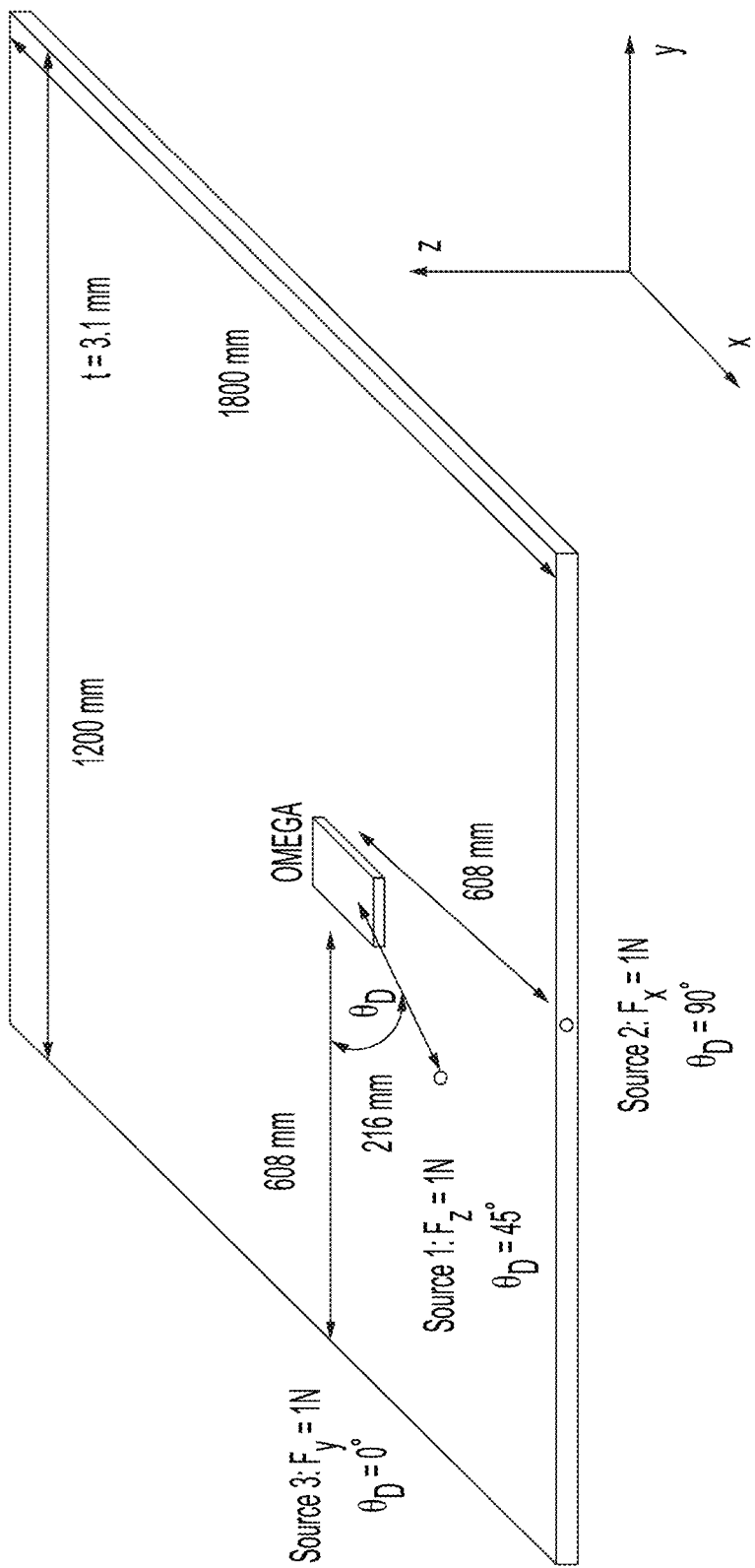
FIG. 25 illustrates a schematic of an experimental set-up used with the sensor, according to various embodiments of the invention.
Figure 26:
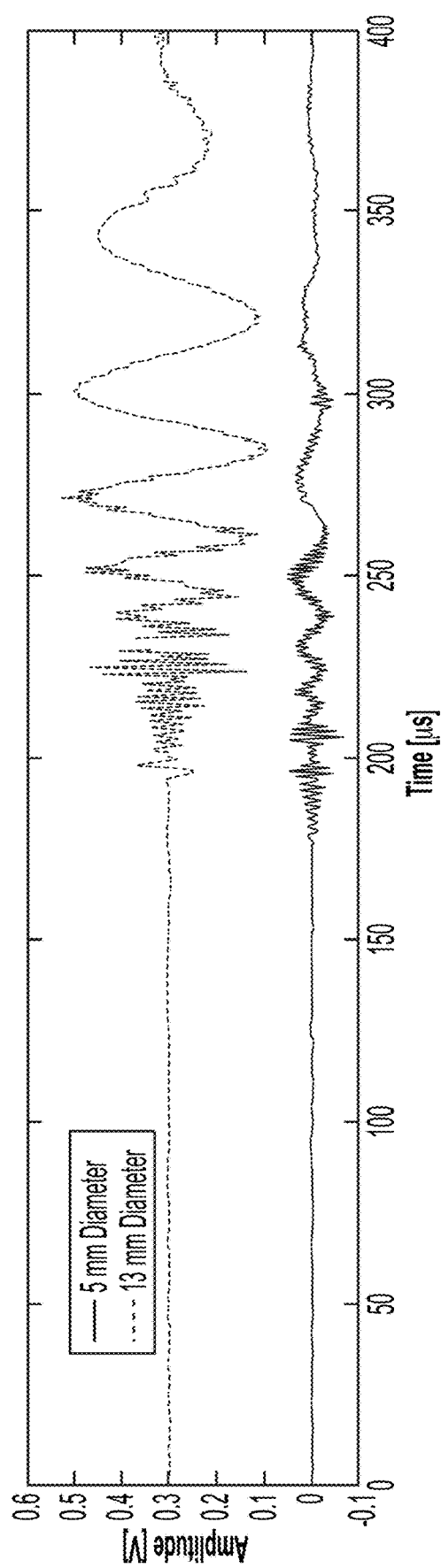
FIG. 26 illustrates a comparison of sensing elements having different diameters, according to various embodiments of the invention.
Figure 26:
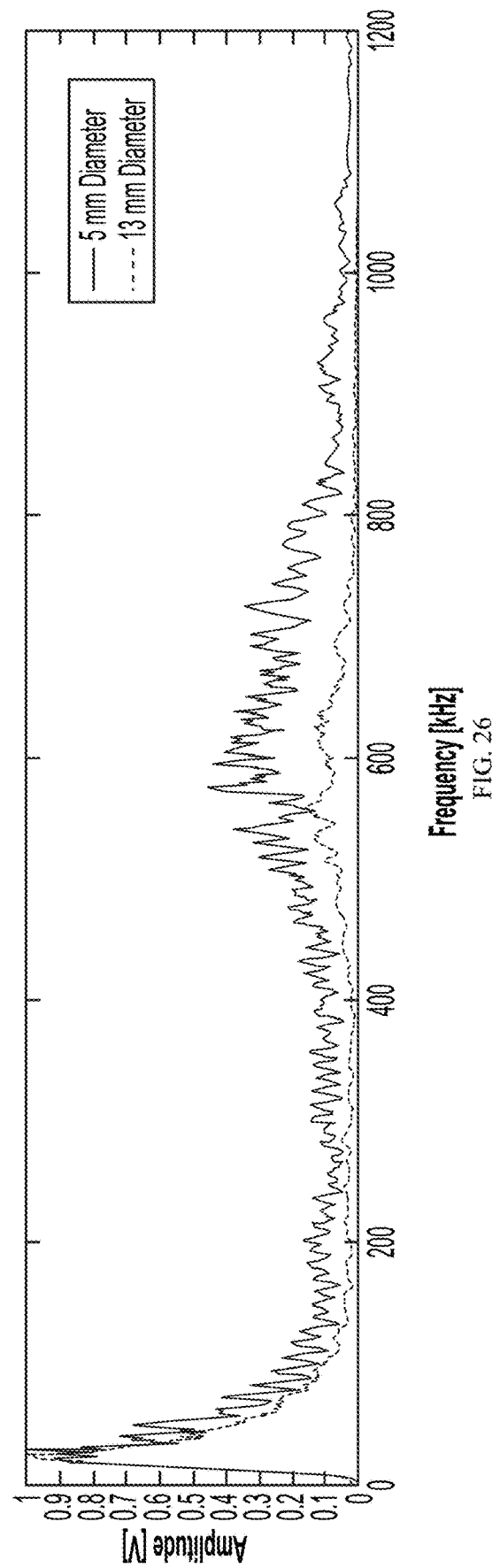

To illustrate the effects of aperture size on the acquired signals, a representative OMEGA sensor was bonded to a 3.1 mm thick 7075 T6 Al plate with lateral dimensions of 1200 mm×1800 mm. The OMEGA sensor was designed as shown in FIG. 16A, where the diameter of elements 1-4 (e.g., sensor elements 1602A-1602D) was 5 mm and the diameter of element 5 (e.g., sensor element 1602E) was 13 mm. A schematic of the experimental set-up is shown in FIG. 25. As an example, a 0.5 mm 6H pencil lead break (PLB) fracture at Source 1 in FIG. 25 was utilized. FIG. 26 provides the temporal (top) and normalized frequency (bottom) response of element 1 (e.g., sensor element 1602A) (5 mm diameter) and element 5 (e.g., sensor element 1602E) (13 mm diameter). From FIG. 26, it is observed that the 13 mm diameter has much larger amplitude response due to the greater element surface area, but that the 5 mm diameter active element has superior relative frequency response above 150 kHz.

The orientation of the fracture source was out-of-plane relative to the plate for the data in FIG. 26, which leads to preferential excitation of the fundamental flexure mode ($F_0$); as is observed from FIG. 26, the first aperture effect for the 13 mm diameter element for the $F_0$ mode occurs at 150 kHz, whereas the first occurrence of the aperture effect does not onset for the 5 mm diameter element until 550 kHz for the $F_0$ mode, lending to the superior high frequency response of the smaller diameter element.

In various measurement scenarios, sensitivity response or high frequency response may be more desirable. For example, if a passive sensor is monitoring for an impact event where the duration of the event will be on the order of milliseconds and will not excite frequencies above ~100 kHz, a larger diameter, higher sensitivity element is an advantageous selection. Conversely, if one is using a passive sensor to monitor for material fracture (occurring on the order of nanoseconds to microseconds) frequency content up to 1 MHz and above is supported, a smaller diameter element without aperture effect distortion is an advantageous solution.

For composite pressure cylinder inspection, the ability to differentiate between various damage mechanisms and quantify deleterious damage mechanisms is a benefit from the perspective of providing a more quantitative assessment and reducing false indications. For example, in the Modal Acoustic Emission (MAE) inspection of composite pressure vessels, frequency content up to 600 kHz (or greater) is utilized to differentiate between fiber fracture and other various damage mechanisms (e.g., matrix cracking, fiber/matrix debonding, delamination, etc.). To detect frequency content without aperture effect distortion, a smaller diameter active sensing element is necessary.

Figure 27:
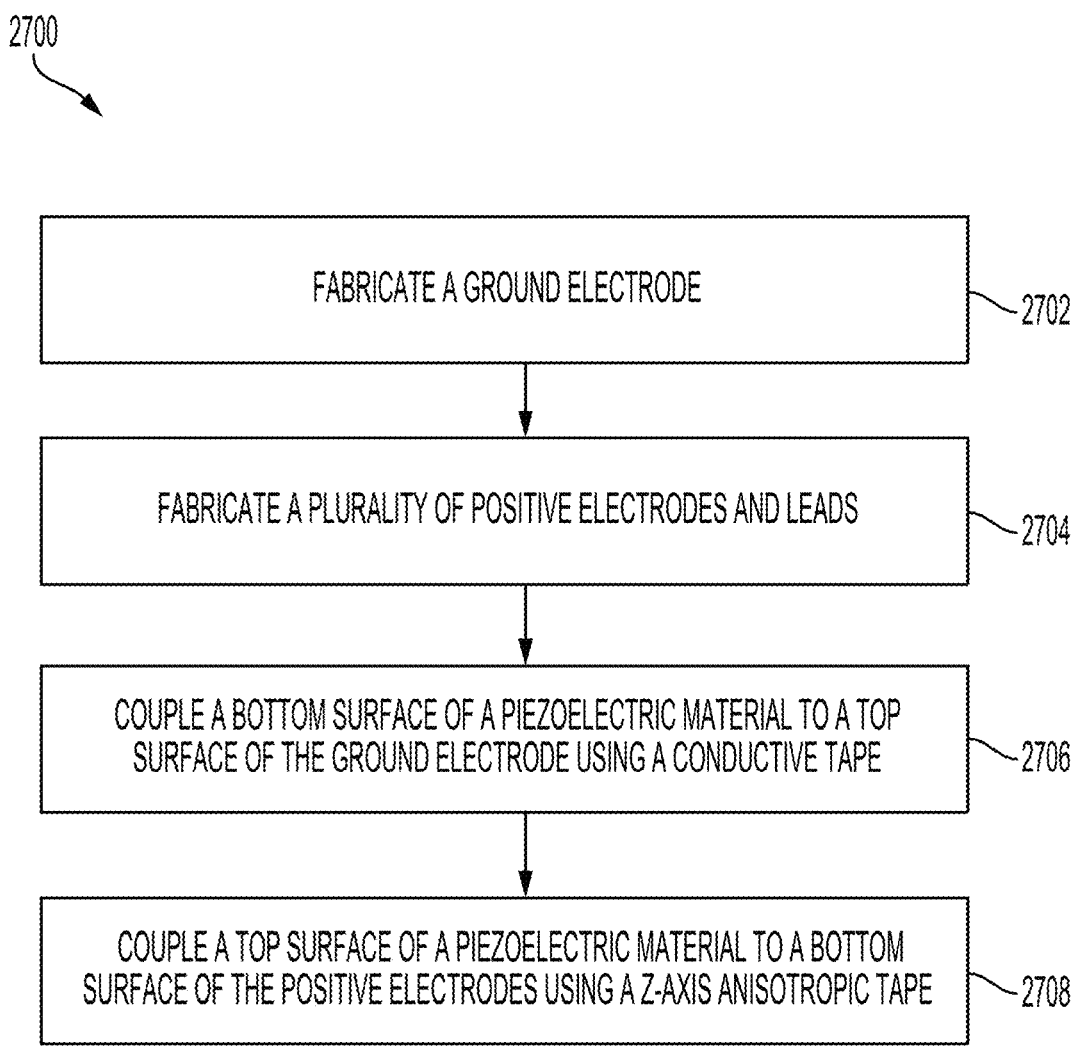
FIG. 27 illustrates a flowchart of a process for fabricating a sensor, according to various embodiments of the invention.

FIG. 27 illustrates a flowchart of a process 2700 for fabricating the sensors (e.g., sensor 1600, 1700, 1800, 1900) described herein.

A ground electrode (e.g., ground electrode 1634) is fabricated (step 2702). The ground electrode may be made of a conductive material, such as copper, and may be fabricated using a flexible substrate such that the ground electrode is flexible, as described herein.

A plurality of positive electrodes (e.g., positive electrodes 1626) and respective leads (e.g., leads 1616) are fabricated (step 2704). The positive electrodes and the leads may be made of a conductive material, such as copper, and may be fabricated using a flexible substrate such that the positive electrodes and the leads are flexible, as described herein.

A bottom surface of a piezoelectric material (e.g., sensing element 1630) is coupled to a top surface of the ground electrode using a conductive tape (e.g., second tape layer 1632) (step 2706).

A top surface of the piezoelectric material is coupled to a bottom surface of the positive electrodes using a z-axis anisotropic tape (e.g., first tape layer 1628) (step 2708). As described herein, the piezoelectric material, the conductive tape coupling the piezoelectric material to the ground electrode, and the z-axis anisotropic tape may be shaped and sized independently of the shape and size of the positive electrodes. This contributes to the improvement in manufacturing efficiency and lowering of manufacturing cost compared to sensors with layers having shapes and sizes matching or corresponding to the positive electrodes.

In some embodiments, the positive electrodes are covered with a polyimide film layer (e.g., first polyimide film layer 1624) and the ground electrodes are also coupled to a polyimide film layer (e.g., second polyimide film layer 1636). In some embodiments, the sensor is covered with a copper layer (e.g., copper layer 1638) configured to provide EMI shielding to the sensor.

Figure 28:
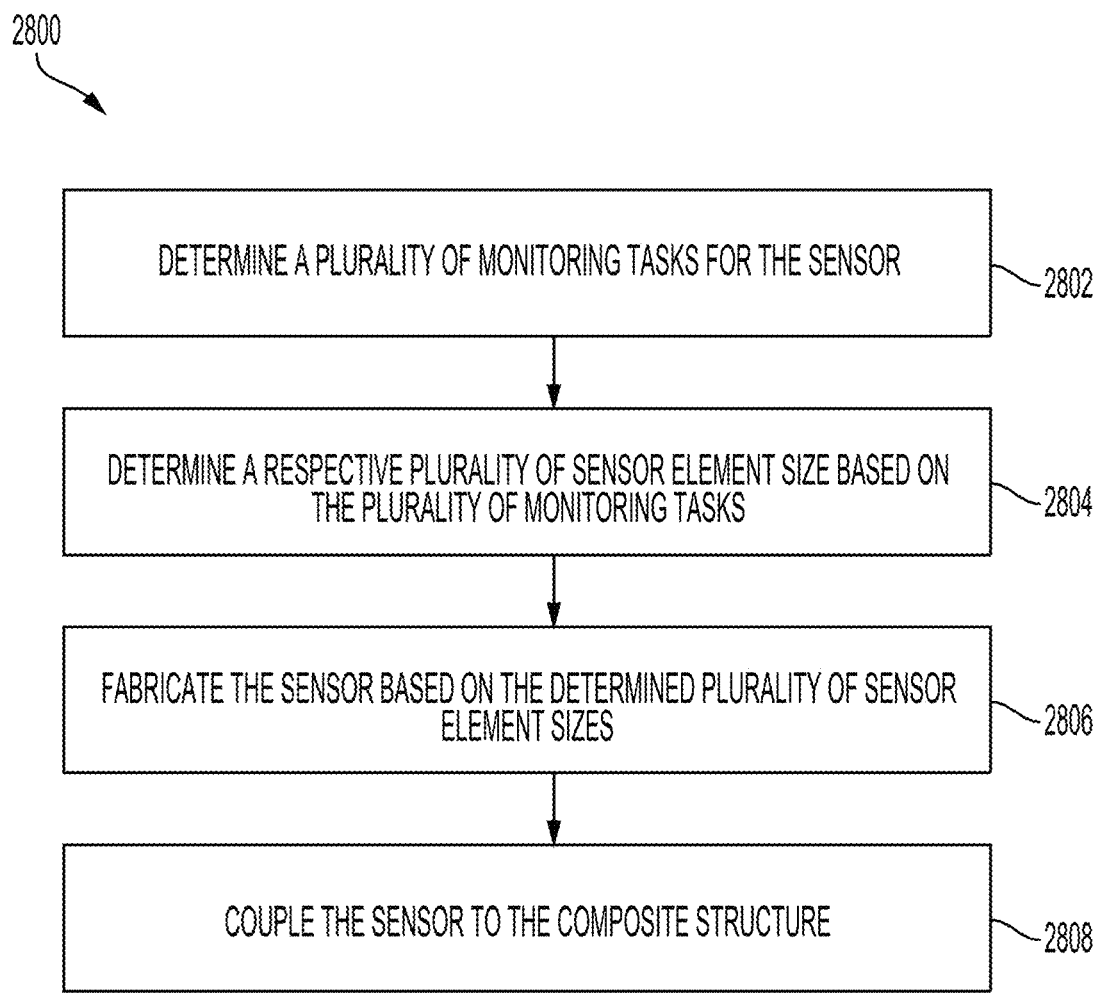
FIG. 28 illustrates a flowchart of a process for manufacturing and using a sensor, according to various embodiments of the invention.

FIG. 28 illustrates a flowchart of a process 2800 for manufacturing and using the sensors (e.g., sensor 1600, 1700, 1800, 1900) described herein.

A plurality of monitoring tasks for the sensor is determined (step 2802). The plurality of monitoring tasks may be determined based on the structure to be monitored and/or the environment in which the structure to be monitored is located or will be located. For example, for a composite cylinder configured to store fuel for a vehicle, the monitoring tasks may include monitoring for impact events that affect the integrity of the composite cylinder, as well as monitoring for loss of structural integrity of the composite cylinder during refilling of the composite cylinder, as described herein.

A respective plurality of sensor element sizes is determined based on the plurality of monitoring tasks (step 2804). In some embodiments, a processor of a computing device may automatically determine the sensor element sizes as well as the arrangement and layout of the different-sized sensor elements within the sensor based on the monitoring tasks. The computing device has a non-transitory computer-readable memory configured to store instructions to be executed by the processor. The computing device may automatically determine the sensor element sizes and/or the arrangement and layout of the different-sized sensor elements within the sensor based on the materials used to make the composite structure and/or the location of the sensor elements on the composite structure, in addition to the plurality of monitoring tasks. A size of sensor element is determined for each of the plurality of monitoring tasks. For example, if the sensor is configured to provide monitoring for three different monitoring tasks, three sensor element sizes are determined.

The computing device may quickly adjust for any changes in number of monitoring tasks, type of monitoring tasks, sensor location, and/or composite structure material and re-design the layout of the sensing elements of the sensor. The layout of the sensing elements may refer to the layout of the positive electrodes, as the layers above and beneath the positive electrodes may remain the same across various sensor designs. Thus, a re-design of the sensor described herein is less costly and the re-design time is faster than conventional sensors where all of the layers of the sensor may be re-designed and adjusted.

The sensor having the multiple element sizes for the multiple monitoring tasks is fabricated (step 2806). The fabrication of step 2806 may be similar to process 2700 described herein. The fabrication steps may be automated using one or more machines configured to automatically fabricate the layers of the sensor (e.g., ground electrode and positive electrode and lead layers) and/or grasp and place the various layers of the sensor to perform the fabrication steps described herein. The design of the sensor elements may be performed using computer-interpretable computer-aided design data corresponding to special-purpose computer-aided design software. A machine for printing a printed circuit board may use the computer-interpretable computer-aided design data to automatically fabricate the various layers of the sensor.

The fabricated sensor is coupled to the composite structure (step 2808). As described herein, the outer surface of the composite structure may be smoothed to facilitate adhesion of the sensor to the composite structure, improving acoustic coupling and bondline mechanical reliability. The fabricated sensor may be automatically coupled to the composite structure using any method or technique, including applying an adhesive.

The piezoelectric element used in the sensors described herein may be advantageously made using a dice and fill composite (DFC) process. Piezoelectric elements fabricated using the DFC process described herein may be referred to as DFC piezoelectric elements.

Figure 29C:
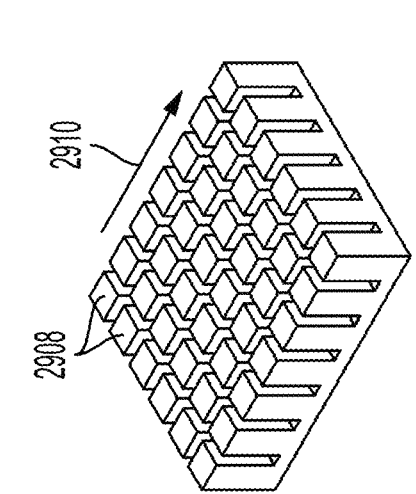
FIGS. 29A-F illustrate a process of fabricating a piezoelectric element for use in the sensor, according to various embodiments of the invention.
Figure 29B:
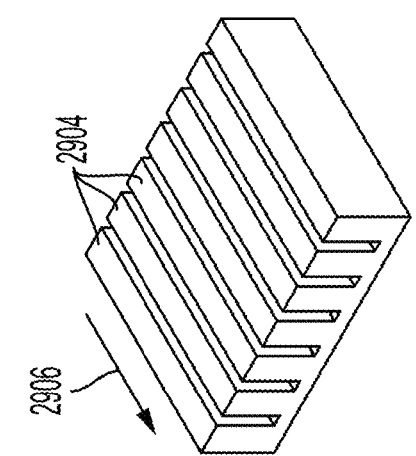
Figure 29A:
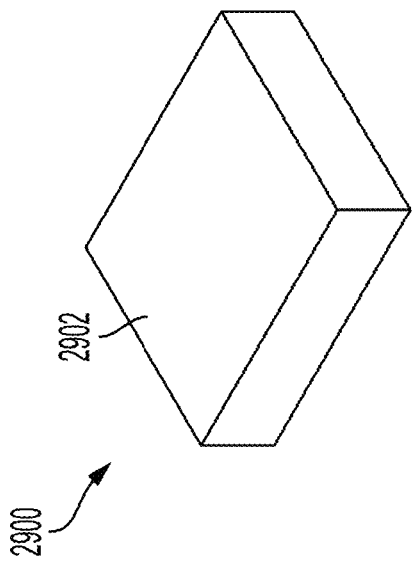

FIGS. 29A-29F illustrate a process for fabricating a DFC piezoelectric element 2900. In FIG. 29A, a piezoelectric material 2902 is provided. In FIG. 29B, the piezoelectric material 2902 is diced (or cut) in a first direction 2906 (e.g., along an x-axis), resulting in rows 2904 of the piezoelectric material 2902. In FIG. 29C, the piezoelectric material 2902 is diced (or cut) in a second direction 2910 (e.g., along a y-axis), resulting in pillars 2908 of the piezoelectric material 2902.

Figure 29F:
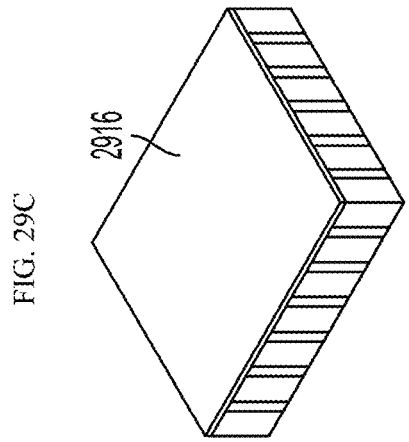
Figure 29E:
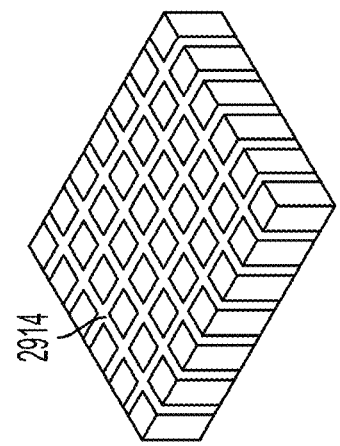
Figure 29D:
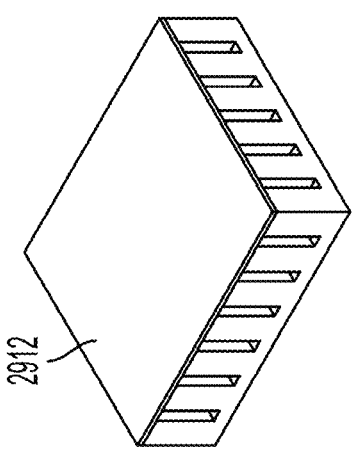

In. FIG. 29D, an epoxy 2912 is disposed above the diced piezoelectric material 2902. In FIG. 29E, the epoxy 2912 and the diced piezoelectric material 2902 may be heated and/or subjected to vacuum so that the epoxy 2912 flows into the channels 2914 between the pillars 2908 of the diced piezoelectric material 2902. The epoxy 2912 may be liquid in the initial phase and the heat reduces viscosity and promotes flow. The vacuum assists with outgassing and reduces voids. In FIG. 29F, the piezoelectric material 2902 is coated with a conductive element 2916. For example, a gold sputter coating is applied to the piezoelectric material 2902.

The epoxy-filled channels of the DFC piezoelectric element 2900 allow the DFC piezoelectric element 2900 to conform to attached surfaces more easily than piezoelectric elements that are continuously solid along a length and/or width of the piezoelectric element. The DFC piezoelectric element 2900 may be heated to a temperature sufficient to soften the epoxy 2912 and bend the completed DFC sensor 2900 to achieve a particular profile corresponding to the surface of the composite structure to be monitored.

While the first direction 2906 is shown as being perpendicular to the second direction 2910, in some embodiments, the first direction 2906 and the second direction 2910 may not be perpendicular. For example, where the surface of the composite structure has multiple contours of different directions, the DFC piezoelectric element 2900 may be diced in a pattern particular to the surface of the composite structure. The closer the shape of the DFC piezoelectric element 2900 is to the surface of the composite structure, the more contact area that can be achieved between the sensor using the DFC piezoelectric element 2900 and the composite structure. Improved contact area between the sensor and the composite structure improves acoustic coupling (i.e., sensor response), and bondline integrity. As shown in FIGS. 29A-29F, the resulting piezoelectric element 2900 is a 1-3 piezoelectric composite, indicating that it is only conductive in one direction.

Figure 30A:
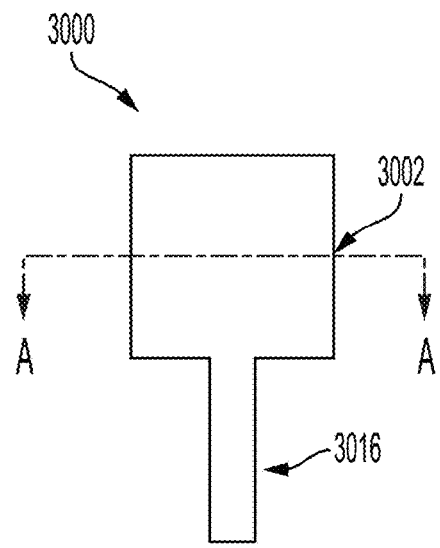
FIG. 30A-30D illustrate a sensor with the piezoelectric element of FIGS. 29A-F, according to various embodiments of the invention.

FIG. 30A illustrates a top view of a sensor 3000 fabricated using a DFC piezoelectric element (e.g., DFC piezoelectric element 2900). The sensor 3000 includes a sensing element 3002 and a lead 3016. In many embodiments, the sensing element 3002 is coupled to a pre-amplifier circuit configured to amplify the signals detected by the sensing element 3002, and the pre-amplifier circuit is coupled to the controller (e.g., controller 302, controller 352, filling controller 1002).

Figure 30B:
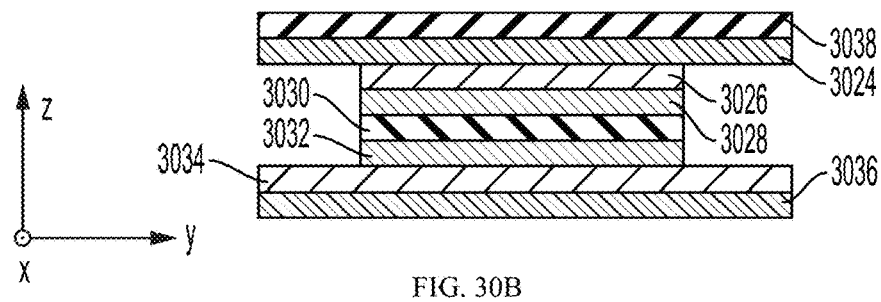

FIG. 30B illustrates a side cross-sectional view along line A-A of FIG. 30A. While the sensor 3000 is a single-element sensor, the layered structure of the sensor 3000 may otherwise be similar to the sensor 1600 and like features/layers are numbered similarly.

The sensor 3000 may include a first polyimide film layer 3024 (e.g., Kapton® from DuPont™). The first polyimide film layer 3024 is configured to provide a dielectric layer between the ground electrode and the structure, if the sensor is integrated into the laminate.

The sensor 3000 may also include a positive electrode 3026. The positive electrode 3026 may be made of a conductive material, such as copper. The top surface of the positive electrode 3026 contacts a bottom surface of the polyimide film layer 3024.

The positive electrode 3026 is located above a first conducting layer 3028 which conductively couples the positive electrode 3026 with an active sensing element 3030 located below the first conducting layer 3028. The first conducting layer 3028 may be made of any conductive material configured to couple adjacent elements, such as a conductive tape, a z-axis conductive tape, or solder, for example. A top surface of the first conducting layer 3028 contacts a bottom surface of the positive electrode 3026 and a bottom surface of the first conducting layer 3028 contacts a top surface of the active sensing element 3030.

The active sensing element 3030 may be a piezoelectric element, such as piezoelectric element 2900. The active sensing element 3030 is configured to produce an electric current when placed under mechanical stress. That is, mechanical stress experienced by the active sensing element 3030 (such as when transient stress waves propagate due to a structure being impacted or material from the structure fracturing) results in a voltage across the positive electrode 3026 and the ground electrode 3034, which is detected by the system (via controllers coupled to lead 3016) and used to determine deformation of the structure, as described herein.

The active sensing element 3030 is located above a second conducting layer 3032. That is a bottom surface of the active sensing element 3030 contacts atop surface of the second conducting layer 3032. The second conducting layer 3032 may be made of any conductive material configured to couple adjacent elements, such as a conductive tape, a z-axis conductive tape, or solder, for example. The second conducting layer 3032 is located above a ground electrode 3034. The ground electrode 3034 may be made of a conductive material, such as copper. The top surface of the ground electrode 3034 may contact a bottom surface of the second conducting layer 3032.

In embodiments where the first conducting layer 3028 and the second conducting layer 3032 are solder, the fabrication may be automated by disposing solid solder between the respective adjacent layers and placing the sensor in a reflow oven. When in the reflow oven, the solder will melt and conductively couple the respective adjacent layers.

The ground electrode 3034 is located above a second polyimide film layer 3036 (e.g., Kapton® from DuPont™). The second polyimide film layer 3036 serves the dual purpose of providing a dielectric layer between the ground electrode and the structure (if integrated into the laminate), as well as a compliant substrate that is well-suited for bonding to a structure subject to a complex stress state (e.g., bi-axial tension).

In some embodiments, a copper layer 3038 may be placed over the top of the sensor 3000 to provide for electromagnetic interference (EMI) shielding to protect the sensor 3000 from electromagnetic interference from one or more other devices.

Leads 3016 may be made of a conductive material, such as copper. In some embodiments, the first polyimide layer 3024 and the copper layer 3038 cover the leads 3016, and in other embodiments, the first polyimide layer 3024 and the copper layer 3038 do not extend laterally to cover the leads 3016. In some embodiments, the area beneath the leads only includes a dielectric material to insulate the leads 3016 from the objects below. In some embodiments, some of the components, including the active sensing element 3030, extend laterally to be located underneath the leads 3016, but in these embodiments, a non-conductive layer is located between the active sensing element 3030 and the leads 3016 to isolate the leads from the active sensing element 3030.

The ground electrode layer 3034, the positive electrodes 3026, and the leads 3016 may be fabricated on durable, flexible printed circuit boards using flexible substrates so that the ground electrode layer 3034, the positive electrodes 3026, and the leads 3016 are all flexible. In addition, the active sensing element 3030 may also be flexible. The first conducting layer 3028, the second conducting layer 3032, the first polyimide film layer 3024, and the second polyimide film layer 3036 may also be flexible. The flexibility of the components of the sensor 3000 allow the sensor 3000 to be flexible and conformable to the surface on which it is placed, providing improved adhesion and acoustic coupling to curved and or rough surfaces, compared to rigid sensors.

The ground electrode layer 3034, the positive electrodes 3026, and the leads 3016 may be fabricated onto the flexible substrate in any manner, including a thermal transfer-resist-develop method, or using CNC electrode deposition, for example. These techniques may promote efficient manufacturing costs and high-volume production.

Figure 30C:
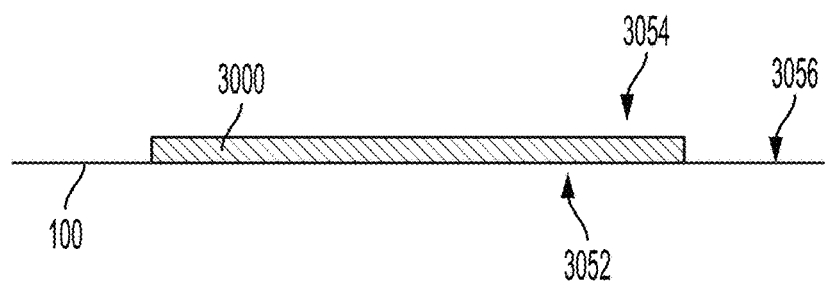

FIG. 30C shows a side-cross sectional view of the sensor 3000 disposed on the outer surface 3056 of cylinder 100. The sensor 3000 has an outer surface 3054 and an inner surface 3052. The inner surface 3052 of the sensor 3000 contacts the outer surface 3056 of the cylinder 100. The sensor 3000 may be attached to the outer surface of the cylinder 100 using any methods, such as using an adhesive.

Figure 30D:
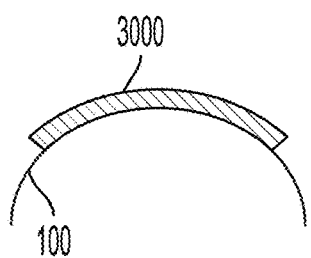

FIG. 30D shows a side-cross sectional view of the sensor 3000 conforming to a curved surface of the cylinder 100. The sensor 3000 may be attached to the cylinder 100 using an adhesive or any other method. In some embodiments, the sensor 3000 may be integrally manufactured into the cylinder 100. For example, the sensor 3000 may be fabricated directly onto the cylinder 100 or may be located between layers of the cylinder 100, where the cylinder 100 is comprised of multiple layers.

In some embodiments, during manufacturing of the cylinder 100, the outer surface 3056 (or a portion of the outer surface 3056 where the sensor 3000 will be attached) may be smoothed to facilitate adhesion of the sensor 3000 to the cylinder 100. For example, during the fabrication of the cylinder, caul plates having curvature corresponding to the outer diameter of the cylinder 100 may be used. A mold release agent may be applied to the caul plates, and the mold-released caul plates are placed on the uncured cylinder 100 in the sensor attachment locations of the cylinder 100. The cylinder 100 is cured and the caul plates are removed post cure, leaving a smooth surface for sensor adhesion that will improve bond line performance (i.e., bond line cycle life) and acoustic coupling (better response) of the sensor 3000.

In some embodiments, the sensor 3000 is heated to a temperature meeting or exceeding a transition temperature where the resin 2912 of the DFC piezoelectric element 2900 transitions from a solid to a more malleable state (e.g., a glass transition temperature $T_g$). When the sensor 3000 is heated to exceed the transition temperature, the DFC piezoelectric element 2900 becomes easier to bend and curve to conform to the surface of the composite structure to be monitored. The choice of resin (or mix of resins) may depend on many factors, including the desired transition temperature. That is, one or more resins may be used to achieve a desired transition temperature.

As compared to the sensor 1600, which is a multi-element sensor, the sensor 3000 is a single-element sensor. Accordingly, many sensors 3000 will be used with the composite structure monitoring system described herein. Despite the use of many sensors 3000, the DFC piezoelectric element 2900 may result in significantly lower system costs than other comparable sensors, including multi-element sensor 1600 due to a reduction in electronic component costs. In addition, the DFC piezoelectric element 2900 may allow the sensor 3000 to conform to the surface of the composite structure better than other comparable sensors.

While FIGS. 30C and 30D show the sensor 3000 as being attached to a cylinder 100, the sensor 3000 may be coupled to any structure for monitoring, such as wind turbines, fuselage, a leading edge of a wing, or any composite structure where impact damage is deleterious or the structure is highly stressed.

To demonstrate the performance of the various aspects of the DFC sensor described herein, data collected from exemplary sensor similar to sensor 3000 is presented, and the features of the respective embodiments described.

Figure 31:
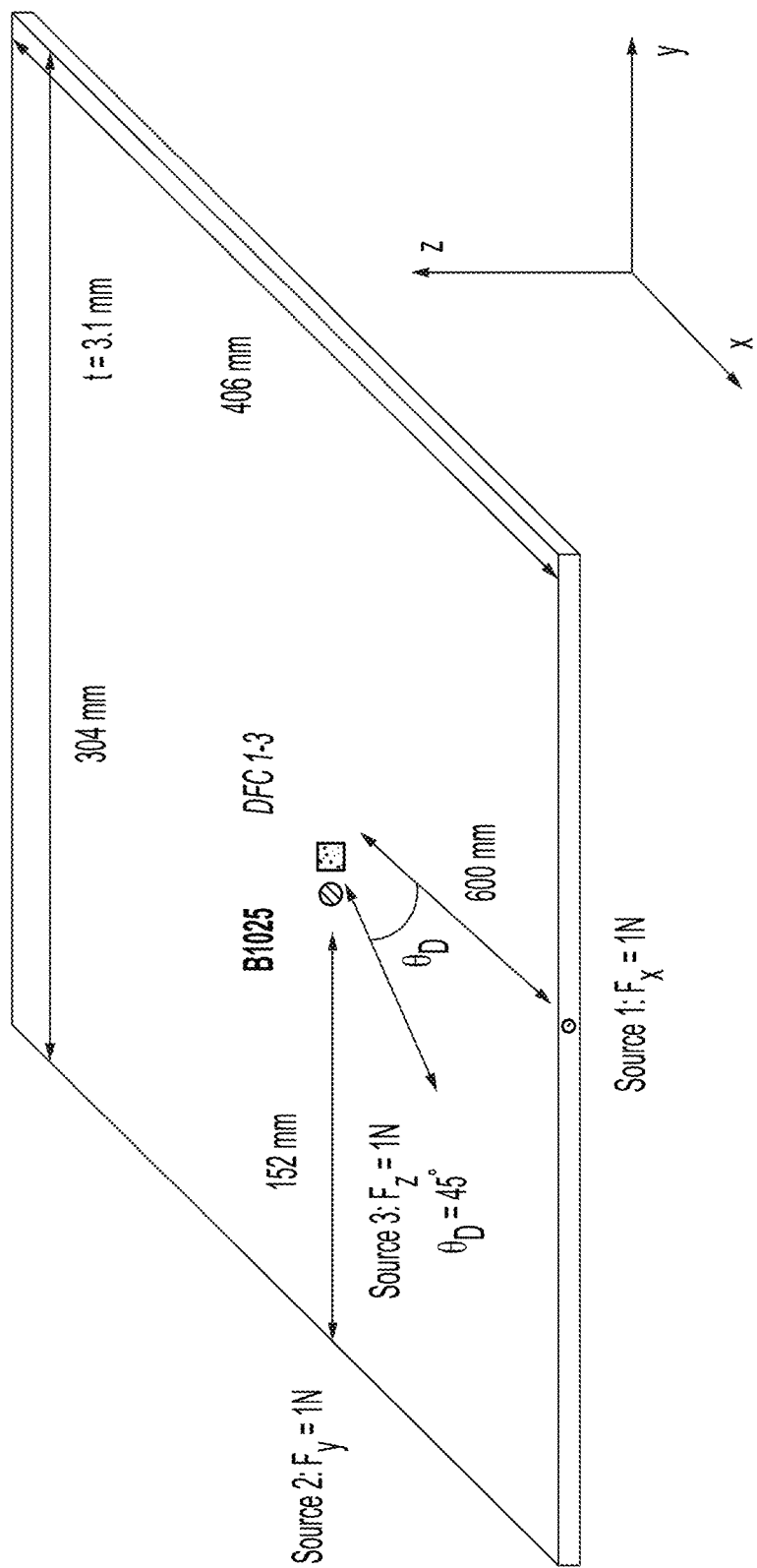
FIG. 31 illustrates a schematic of an experimental set-up used with the sensor, according to various embodiments of the invention.

To quantify the sensitivity of the DFC sensors relative to traditional broadband piezoelectric sensors, both a DFC sensor and a traditional, single-element B1025 sensor were bonded to a 3.1 mm thick 7075 Aluminum plate having lateral dimensions of 1200 mm×1800 mm. FIG. 31 provides a schematic of the experimental set-up used with pertinent dimensions.

Figure 32:
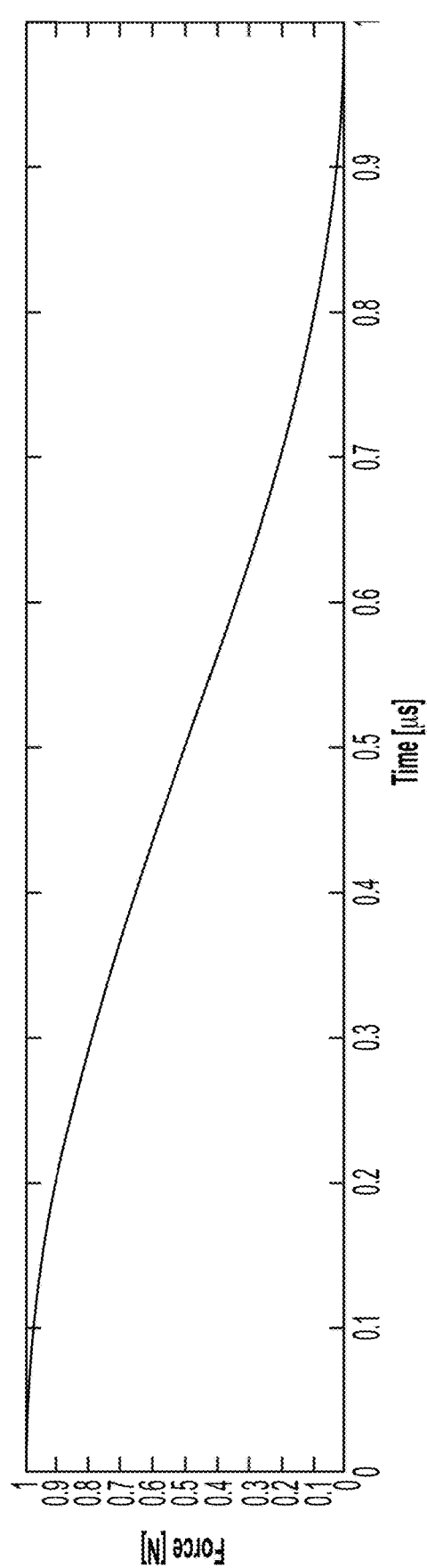
FIG. 32 illustrates graphs of a source used in the experimental set-up used with the sensor, according to various embodiments of the invention
Figure 32:
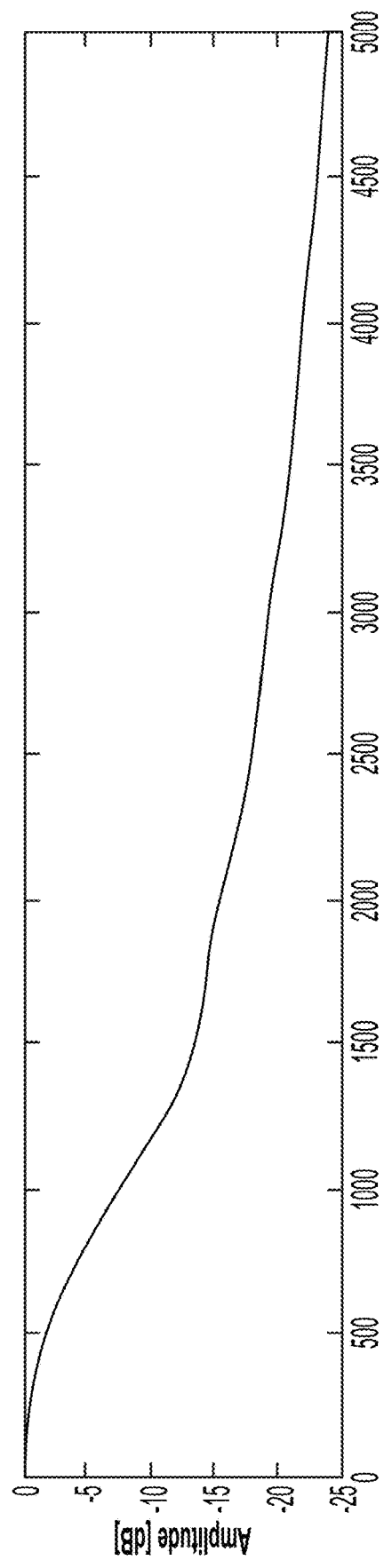

FIG. 32 illustrates the source, which was a 0.5 mm 6H pencil lead break fracture. The source model is shown in FIG. 32, having a cosine bell forcing function of 1N magnitude and 1 µs rise time.

Figure 33:
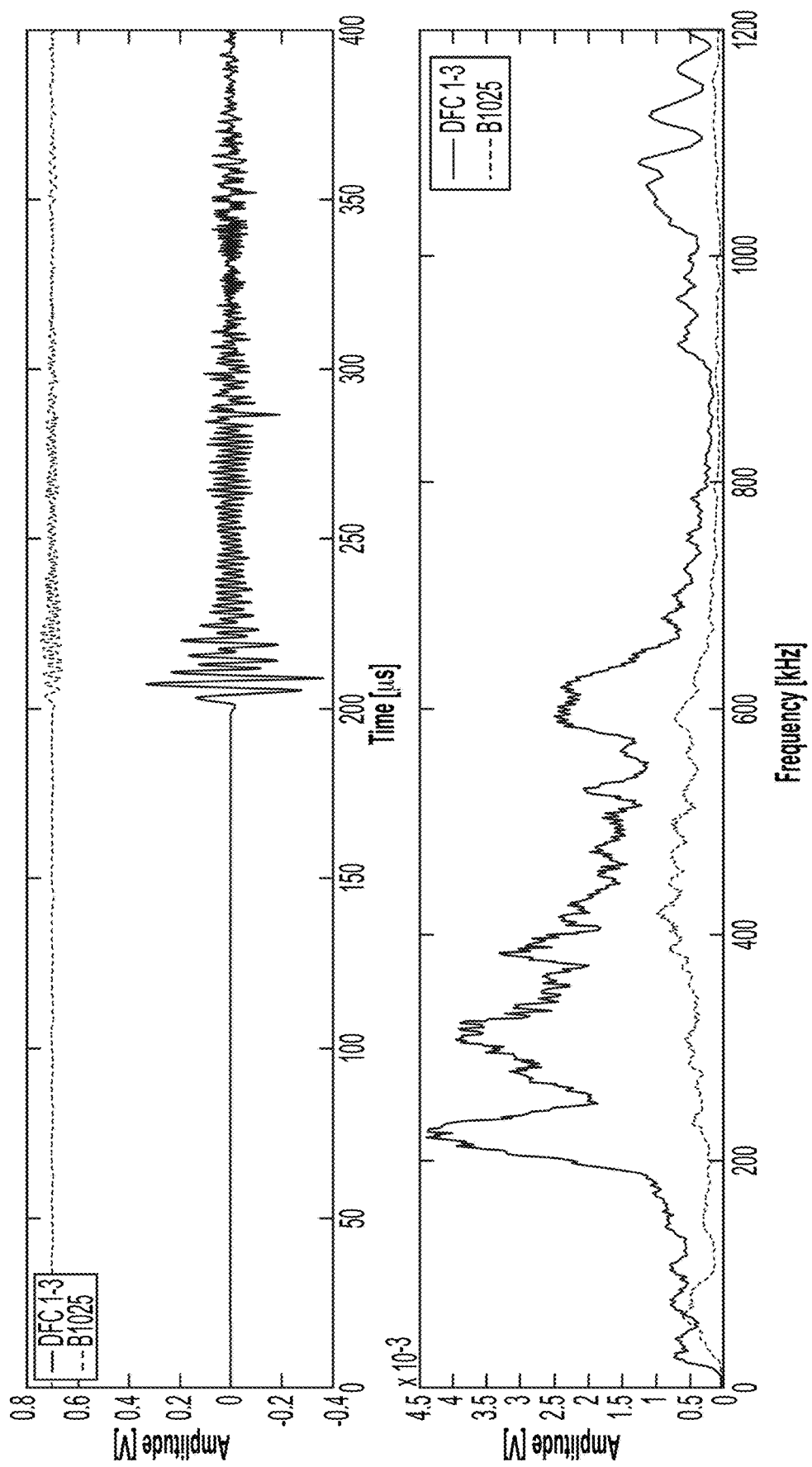
FIGS. 33-39 illustrate detected experimental data, according to various embodiments of the invention.

Temporal waveforms and frequency waveforms from the 0.5 mm 6H pencil lead break fracture source at Source 1 are presented in FIG. 33 for the B1025 transducer and the DFC sensor.

Figure 34A:
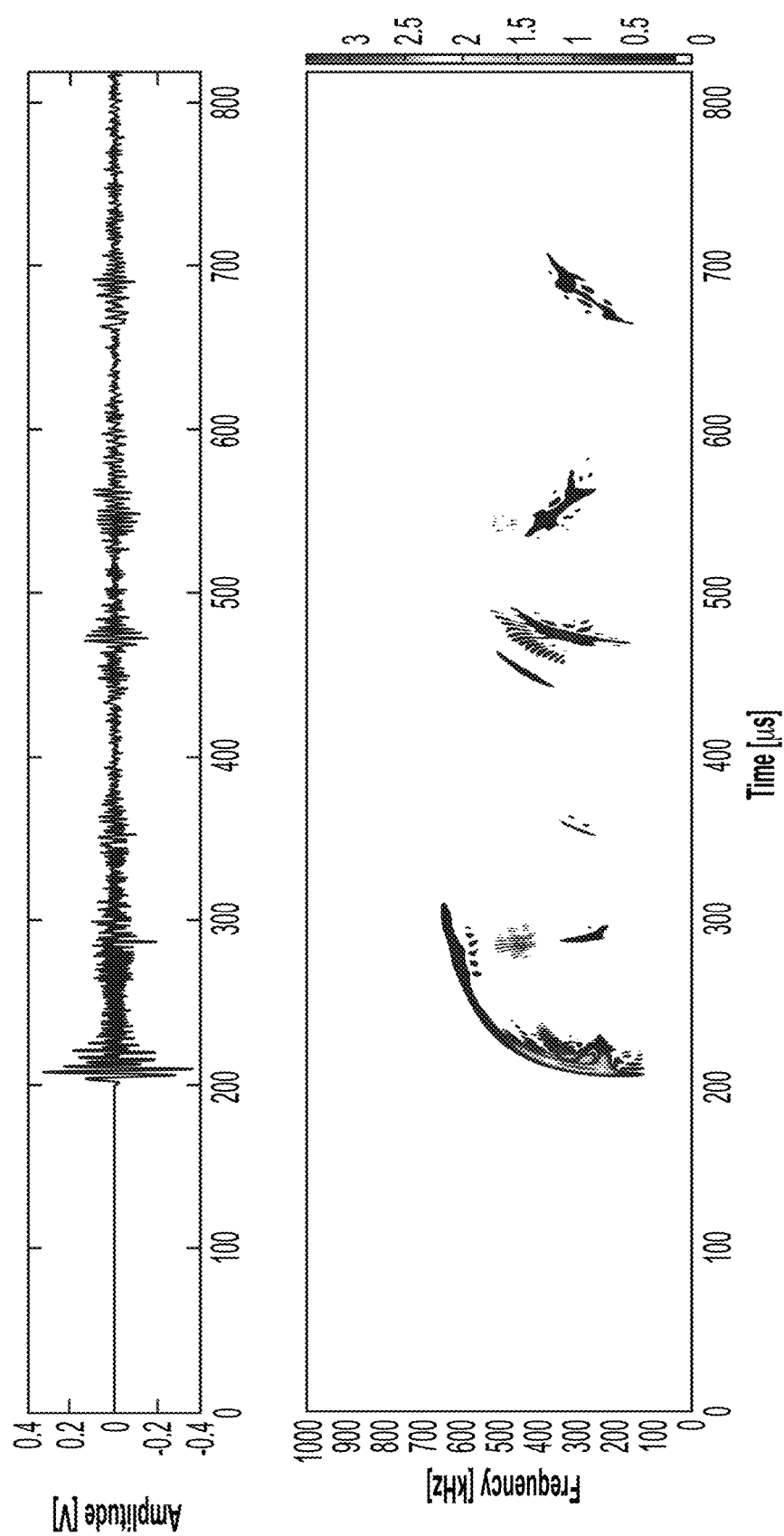
Figure 34B:
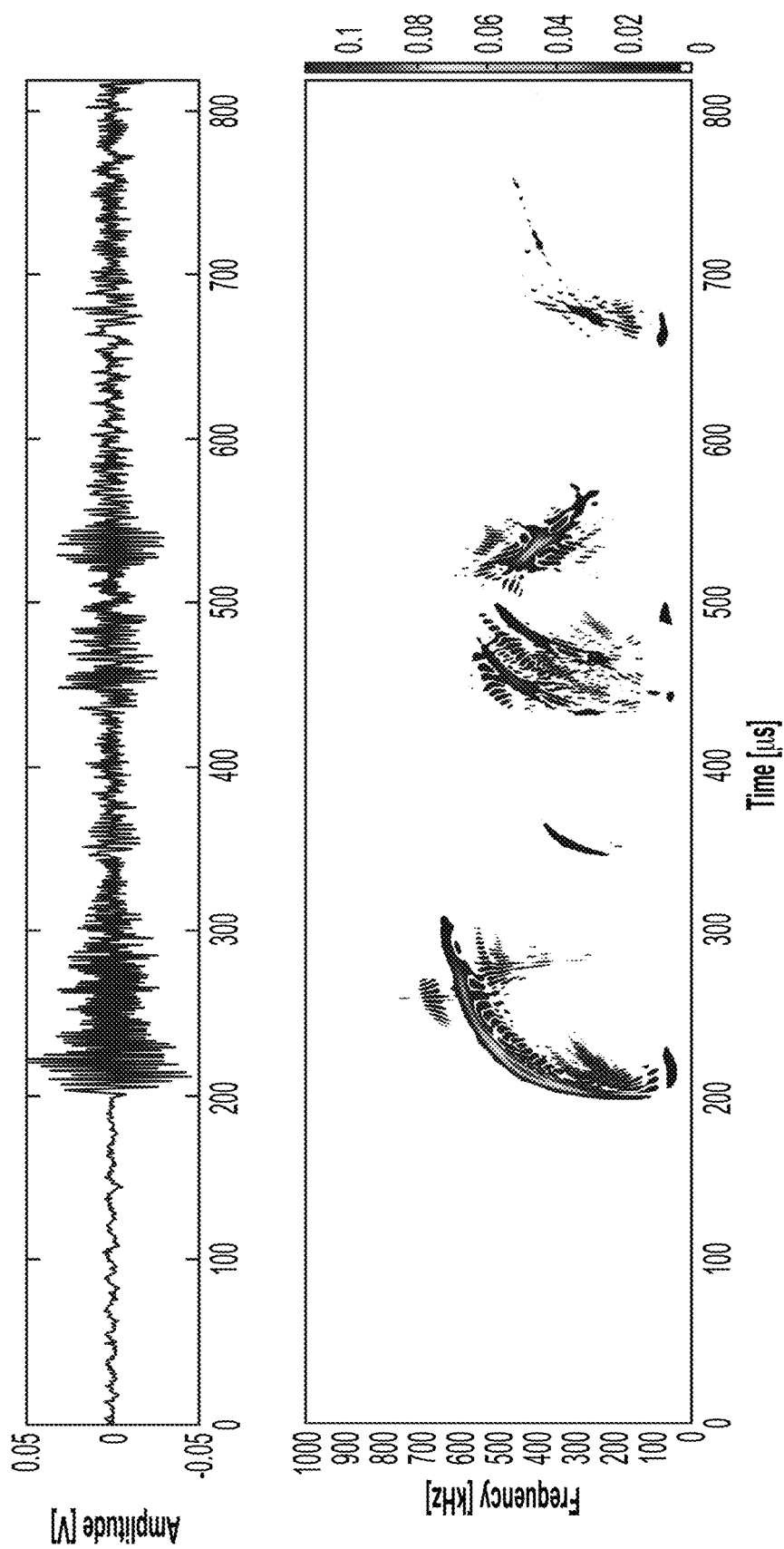

Time-frequency distributions from the 0.5 mm 6H pencil lead break fracture source at Source 1 for the DFC sensor are presented in FIG. 34A, and for the B1025 transducer in FIG. 34B. As can be seen in the comparison of FIGS. 34A and 34B, there is an order of magnitude increase in sensitivity from the DFC sensor to the B1025 transducer.

Figure 35:
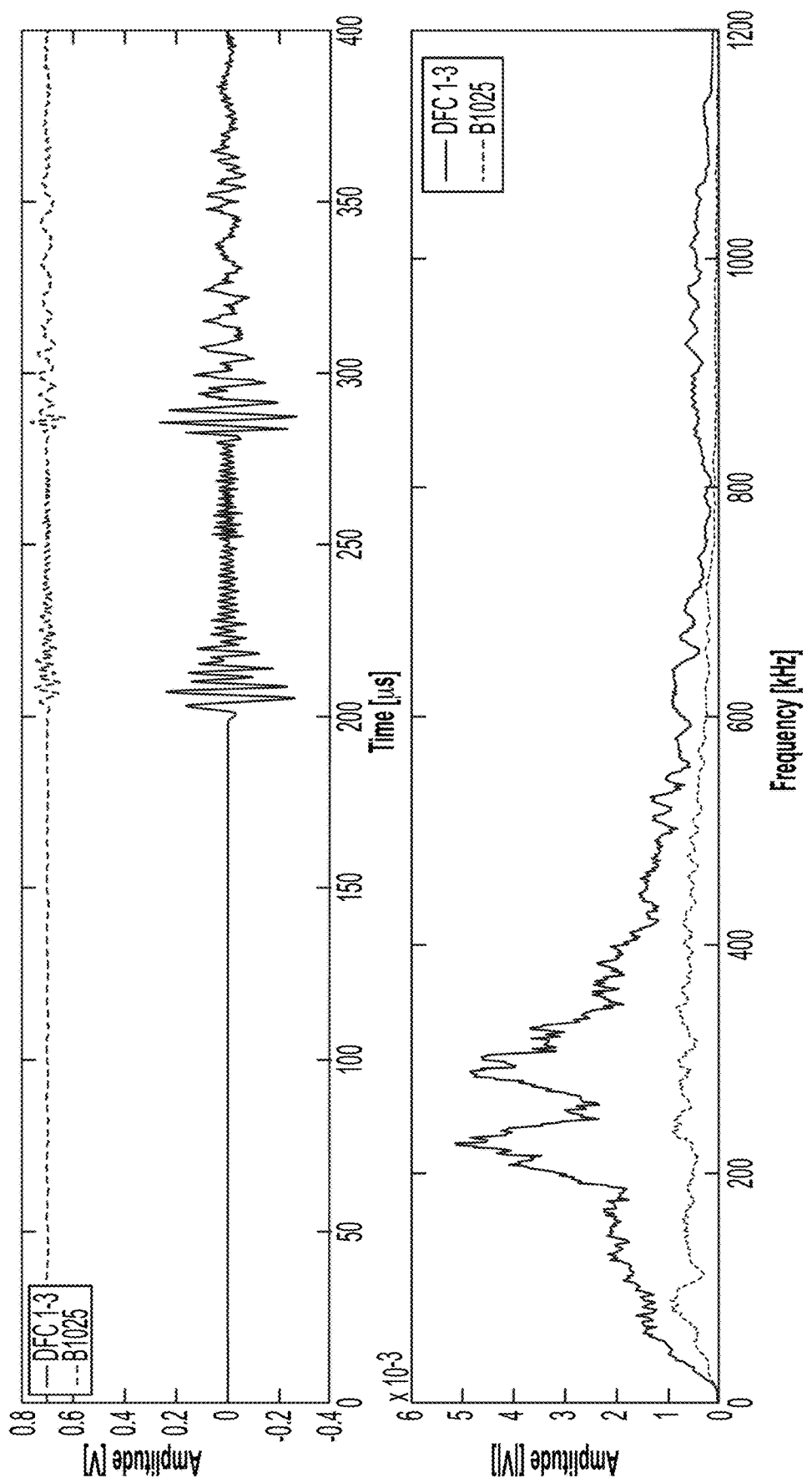

Temporal waveforms and frequency waveforms from Source 2 are presented in FIG. 35 for the B1025 transducer and the DFC sensor.

Figure 36A:
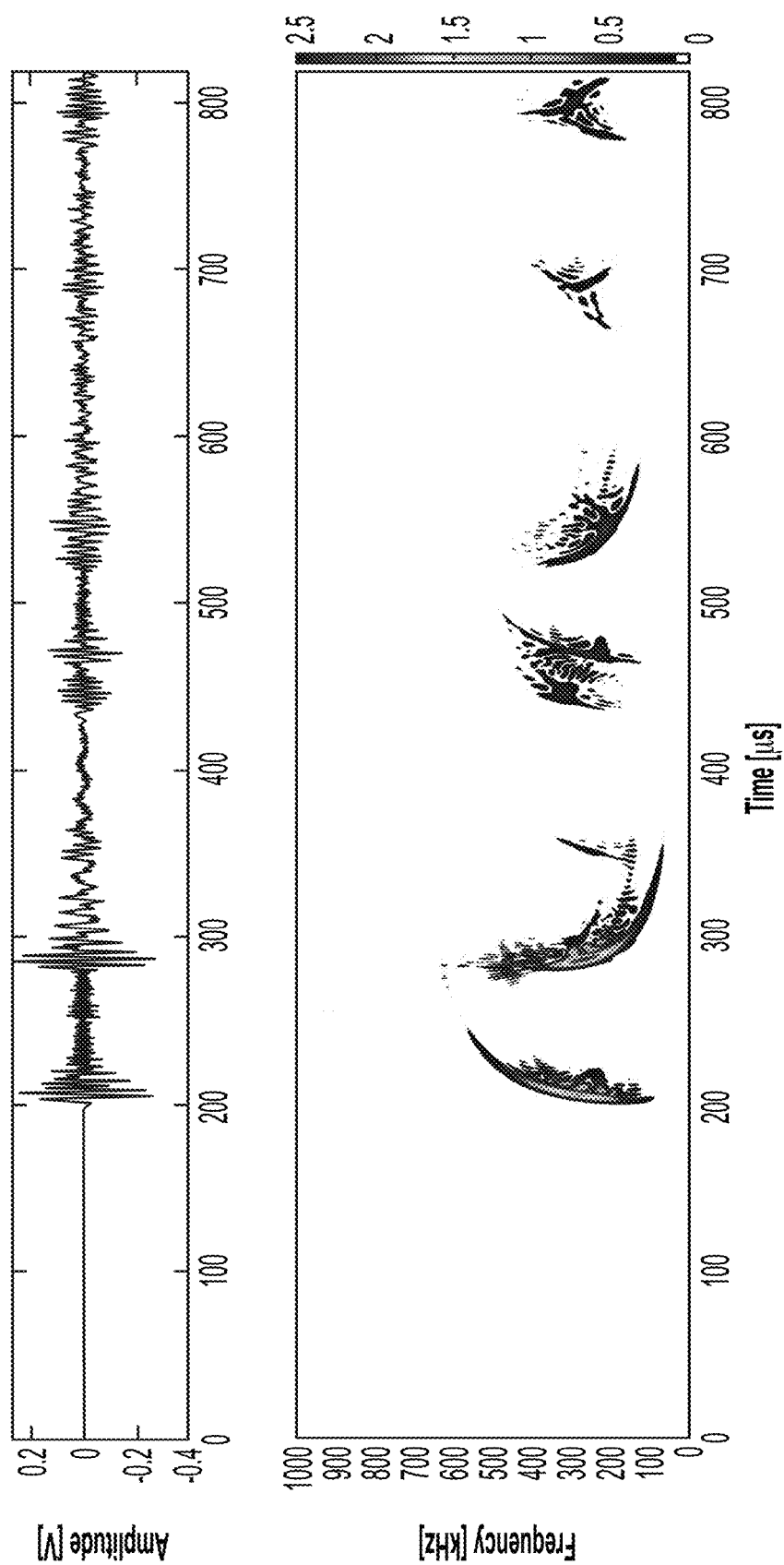
Figure 36B:
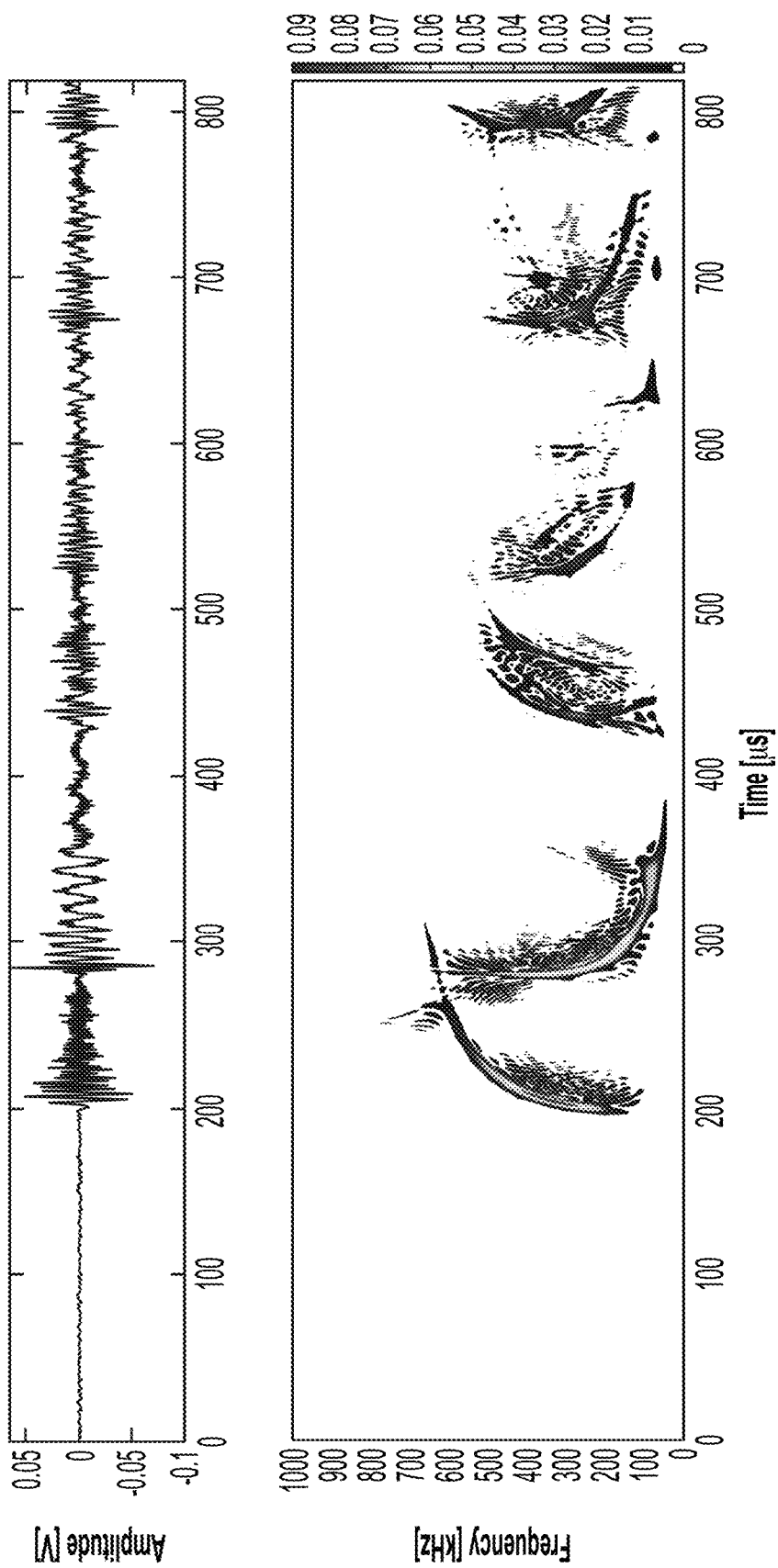

Time-frequency distributions at Source 2 for the DFC sensor are presented in FIG. 36A, and for the B1025 transducer in FIG. 36B. As can be seen in the comparison of FIGS. 36A and 36B, there is an order of magnitude increase in sensitivity from the DFC sensor to the B1025 transducer.

Figure 37:
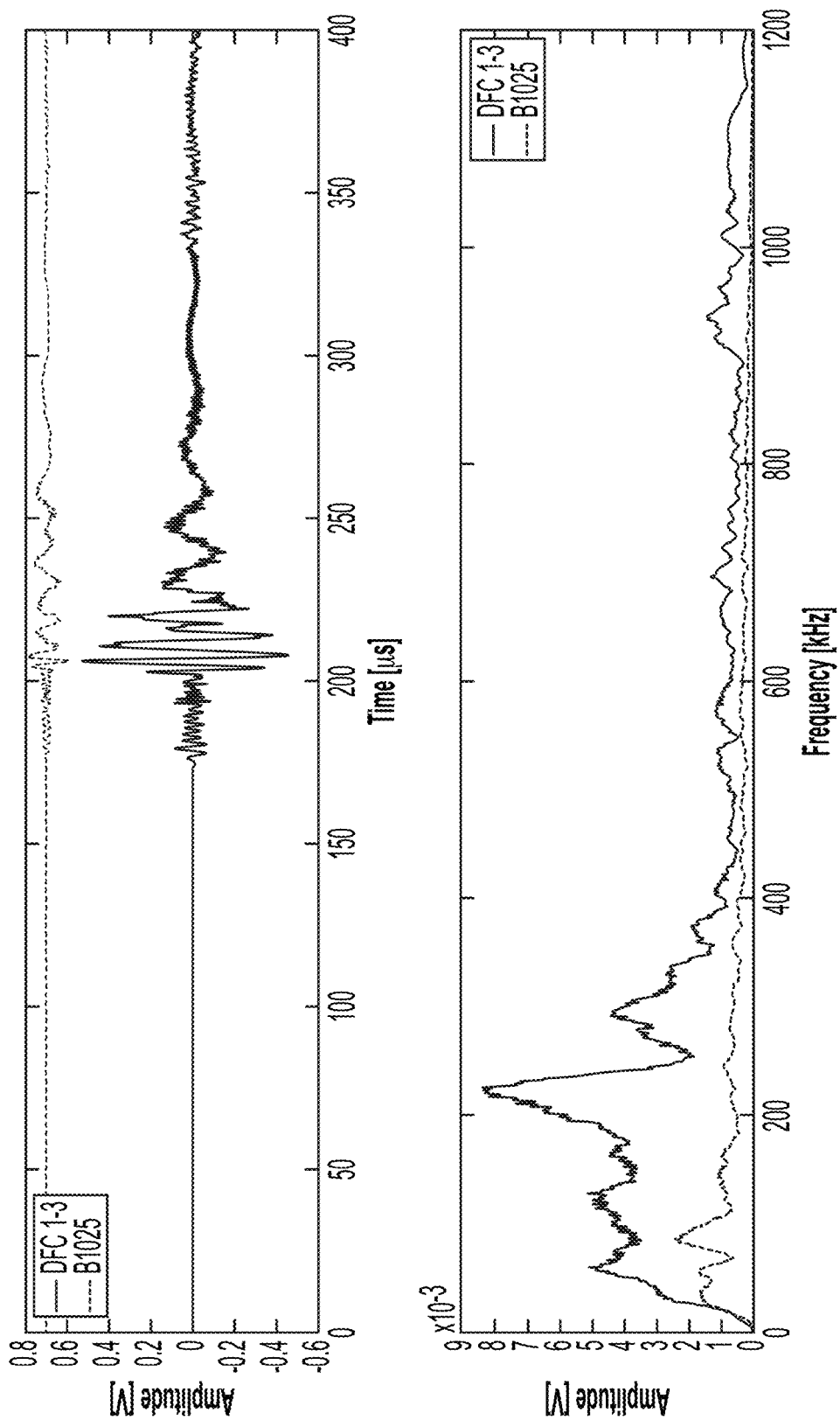

Temporal waveforms and frequency waveforms from Source 3 are presented in FIG. 37 for the B1025 transducer and the DFC sensor.

Figure 38A:
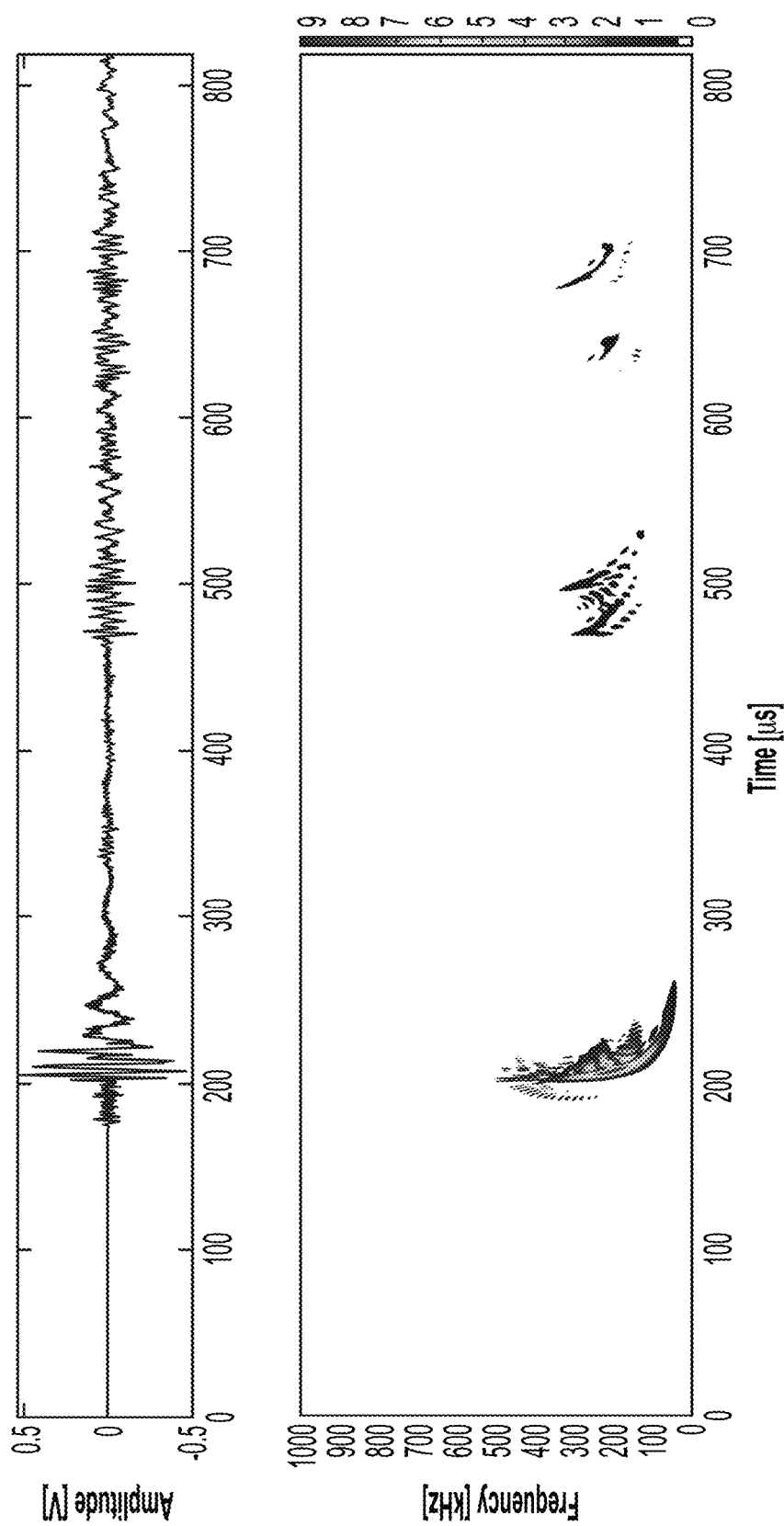
Figure 38B:
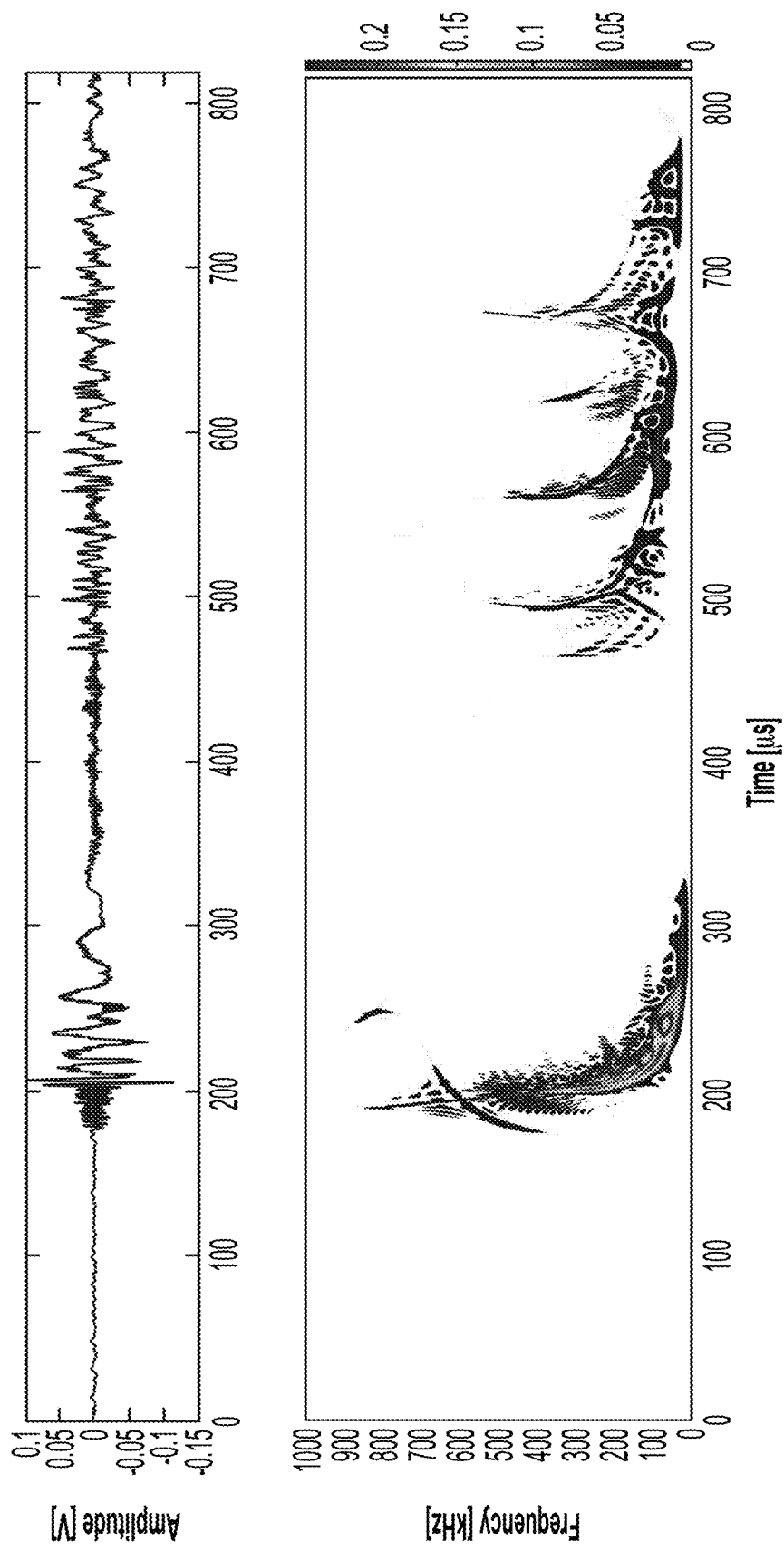

Time-frequency distributions at Source 3 for the DFC sensor are presented in FIG. 38A, and for the B1025 transducer in FIG. 38B. As can be seen in the comparison of FIGS. 38A and 38B, there is an order of magnitude increase in sensitivity from the DFC sensor to the B1025 transducer.

In another experiment, a DFC sensor and a B1025 transducer were bonded in close proximity to one another on a Type 3 self-contained breathing apparatus (SCBA) cylinder. Source 1 was an out-of-plane fracture and Source 2 was an in-plane fracture. The source and sensor locations are shown in the table below:

| | Z (mm) | Θ (degrees) |
|---|---|---|
| Sensors | 0 | 270 |
| Source 1 [Out-of-plane fracture] | 0 | 170 |
| Source 2 [In-plane fracture] | 125 | 353 |

Figure 39:
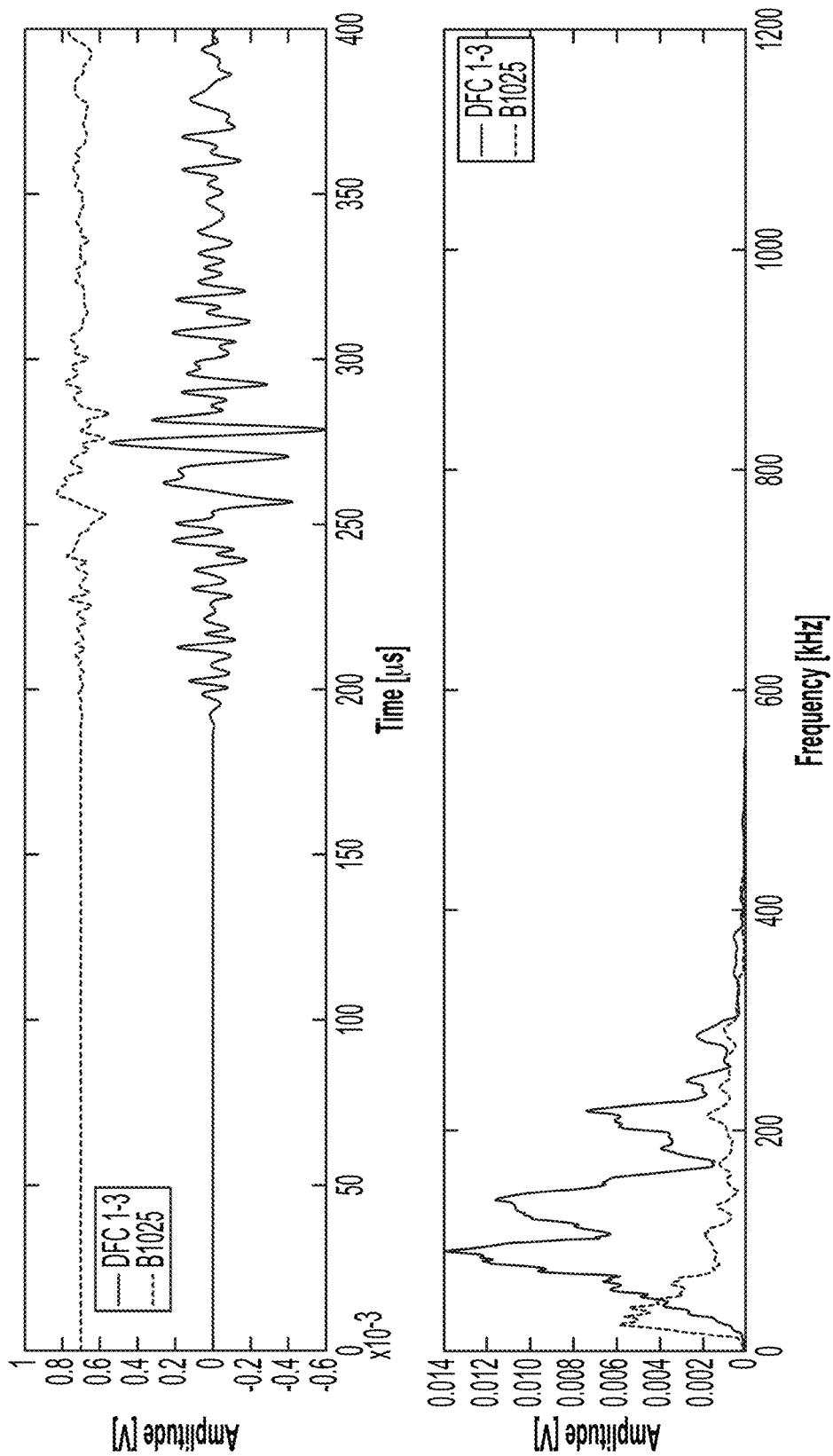

Temporal waveforms and frequency waveforms from the out-of-plane fracture at Source 1 are presented in FIG. 39 for the B1025 transducer and the DFC sensor.

Figure 40A:
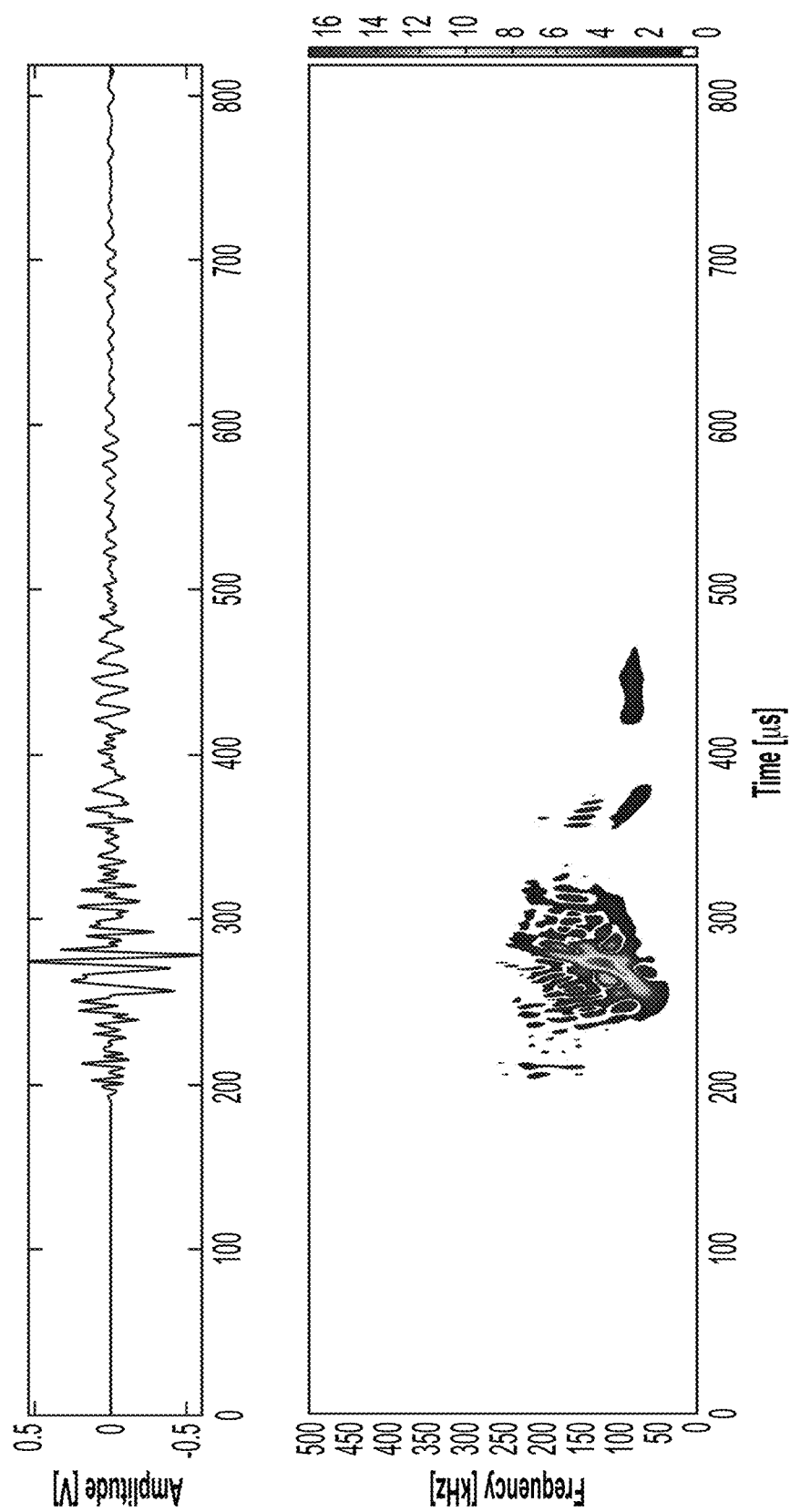
FIGS. 40A-40B illustrate detected experimental data, according to various embodiments of the invention.
Figure 40B:
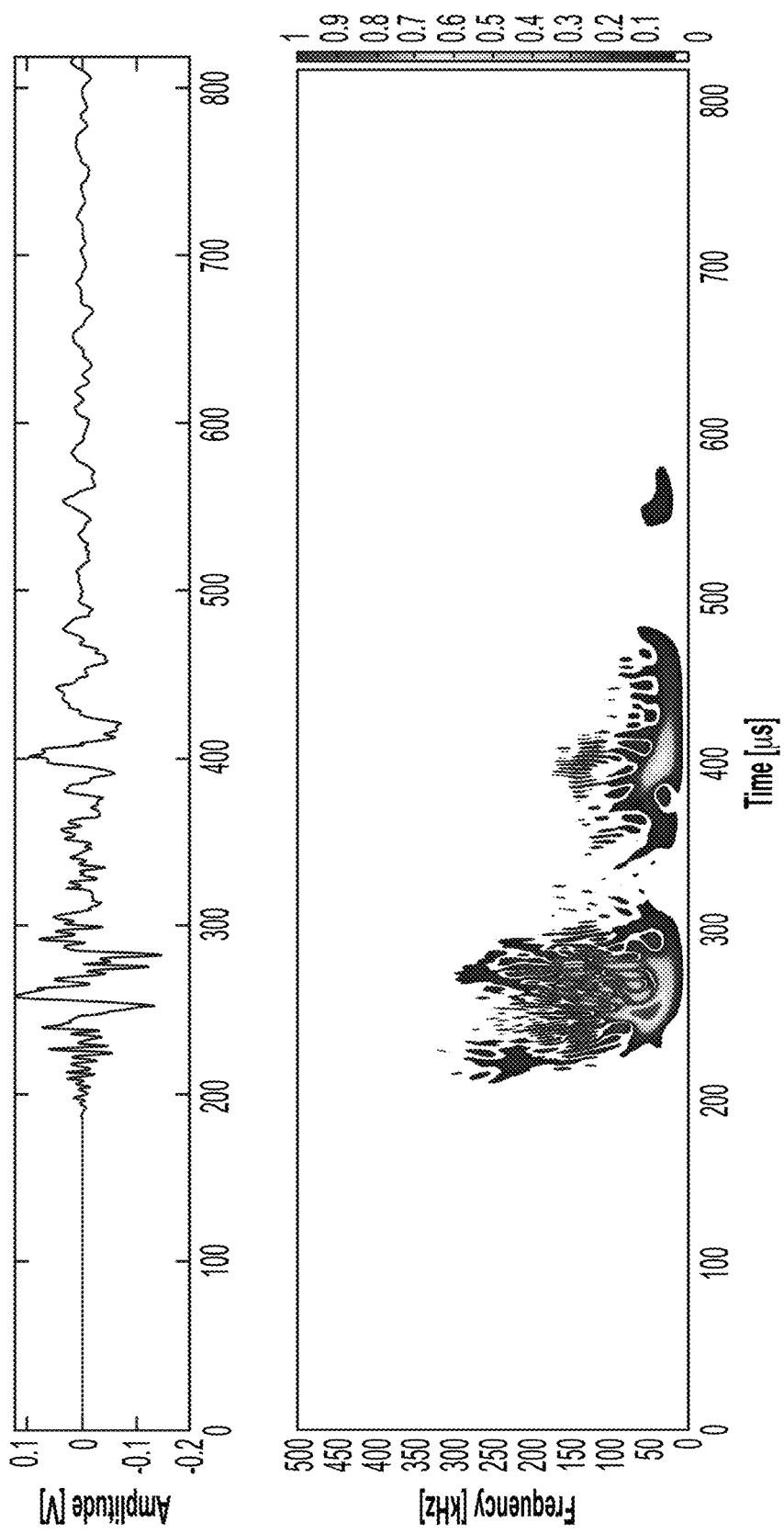

Time-frequency distributions from the out-of-plane fracture at Source 1 for the DFC sensor are presented in FIG. 40A, and for the B1025 transducer in FIG. 40B. As can be seen in the comparison of FIGS. 40A and 40B, there is an order of magnitude increase in sensitivity from the DFC sensor to the B1025 transducer.

Figure 41:
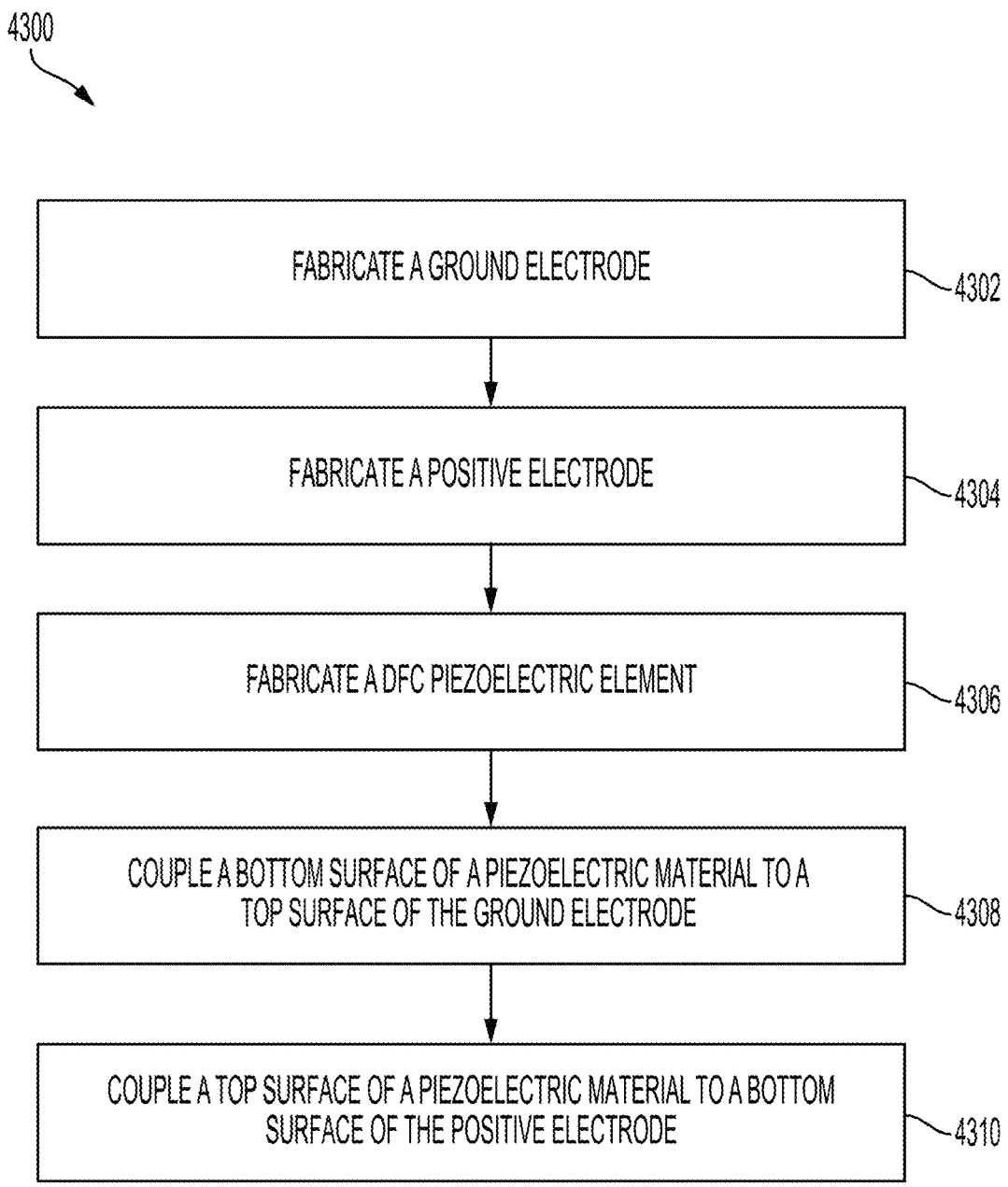
FIG. 41 illustrates a flowchart of a process for fabricating a sensor, according to various embodiments of the invention.

FIG. 41 illustrates a flowchart of a process 4300 for fabricating and using the sensor (e.g., sensor 3000) described herein.

A ground electrode (e.g., ground electrode 3034) is fabricated (step 4302). The ground electrode may be made of a conductive material, such as copper, and may be fabricated using a flexible substrate such that the ground electrode is flexible, as described herein.

A positive electrode (e.g., positive electrode 3026) and a respective lead (e.g., lead 3016) is fabricated (step 4304). The positive electrode and the lead may be made of a conductive material, such as copper, and may be fabricated using a flexible substrate such that the positive electrodes and the leads are flexible, as described herein.

A DFC piezoelectric element (e.g., DFC piezoelectric element 2900) is fabricated (step 4306). As described herein, the DFC piezoelectric element may be fabricated by dicing a piezoelectric material in a plurality of directions and filling the channels formed from the dicing with a resin, as shown in FIGS. 29A-29F.

A bottom surface of the DFC piezoelectric element (e.g., sensing element 3030) is coupled to a top surface of the ground electrode (e.g., using second conducting layer 3032) (step 4308).

A top surface of the DFC piezoelectric element is coupled to a bottom surface of the positive electrodes (e.g., using first conducting layer 3028) (step 4310).

In some embodiments, the positive electrode is covered with a polyimide film layer (e.g., first polyimide film layer 3024) and the ground electrode is also coupled to a polyimide film layer (e.g., second polyimide film layer 3036). In some embodiments, the sensor is covered with a copper layer (e.g., copper layer 3038) configured to provide EMI shielding to the sensor.

The fabricated sensor is coupled to the composite structure (step 4312). As described herein, the outer surface of the composite structure may be smoothed to facilitate adhesion of the sensor to the composite structure, improving acoustic coupling and bondline mechanical reliability. Also as described herein, the sensor may be heated to a temperature meeting or exceeding a transition temperature where the resin (e.g., resin 2912) of the DFC piezoelectric element transitions from a solid to a more malleable state (e.g., a glass transition temperature $T_g$). When the sensor is heated to exceed the transition temperature, the DFC piezoelectric element becomes easier to bend and curve to conform to the surface of the composite structure to be monitored. The fabricated sensor may be automatically coupled to the composite structure using any method or technique, including applying an adhesive.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents. Each and every feature described herein, and each and every combination of two or more of such features, is included within the scope of the present invention provided that the features included in such a combination are not mutually inconsistent.

What is claimed is:

1. A sensor for monitoring a composite structure, the sensor comprising:
a first sensor element configured to detect data associated with a first monitoring task, the first sensor element including a first positive electrode having a first size; and
a second sensor element configured to detect data associated with a second monitoring task, the second sensor element including a second positive electrode having a second size,
wherein the first positive electrode and the second positive electrode are coupled to an active sensing element at respective bottom surfaces via a first conductive layer configured to conduct electricity in only a vertical axis, the active sensing element configured to produce an electric current when placed under mechanical stress and having a size larger than a combination of the first size and the second size.

2. The sensor of claim 1, wherein the first positive electrode is coplanar with the second positive electrode when the sensor is flat.

3. The sensor of claim 1, wherein the first conductive layer is a first conductive tape layer.

4. The sensor of claim 1, wherein the first conductive layer has a size larger than a combination of the first size and the second size.

5. The sensor of claim 1, wherein a bottom surface of the active sensing element is coupled to a top surface of a ground electrode via a second conductive layer, the ground electrode having a size larger than a combination of the first size and the second size.

6. The sensor of claim 5, wherein the second conductive layer is a second conductive tape layer.

7. The sensor of claim 5, wherein the second conductive layer has a size larger than a combination of the first size and the second size.

8. The sensor of claim 5, further comprising a first polyimide film layer located above the first positive electrode and the second positive electrode.

9. The sensor of claim 8, further comprising a second polyimide film layer located below the ground electrode.

10. The sensor of claim 9, further comprising a copper layer located above the first polyimide film layer and configured to shield the sensor from electromagnetic interference.

11. The sensor of claim 9, wherein the first polyimide film layer, the first positive electrode, the second positive electrode, the first conductive layer, the active sensing element, the second conductive layer, the ground electrode, the second polyimide film layer are each flexible and configured to conform to a surface that the sensor is coupled to.

12. The sensor of claim 1, wherein the first monitoring task is detecting a direct wave energy from an object when the composite structure endures impact damage from the object, and wherein the second monitoring task is detecting damage to the composite structure as the composite structure is filled with a fluid.

13. A sensor for monitoring a composite cylinder configured to store a fluid, the sensor comprising:

a first sensor element having a first size and configured to detect data associated with a first monitoring task; and a second sensor element having a second size and configured to detect data associated with a second monitoring task, wherein the first monitoring task is detecting a direct wave energy from an object when the composite cylinder endures impact damage from the object, and wherein the second monitoring task is detecting damage to the composite cylinder as the composite cylinder is filled with the fluid.

14. The sensor of claim 13, wherein the first sensor element is electrically coupled to a controller configured to determine a damage value based on the detected direct wave energy.

15. The sensor of claim 13, wherein the second sensor element is electrically coupled to a controller configured to perform a modal acoustic emission inspection to detect the damage to the composite cylinder as the composite cylinder is filled with the fluid.

16. The sensor of claim 13, wherein the first sensor element includes a first positive electrode and the second sensor element includes a second positive electrode, the first positive electrode being coplanar with the second positive electrode when the sensor is flat.

* * * * *